(12) United States Patent
Kaneko et al.

(10) Patent No.: US 7,771,913 B2
(45) Date of Patent: *Aug. 10, 2010

(54) RESIST COMPOSITION AND PATTERNING PROCESS USING THE SAME

(75) Inventors: Tatsushi Kaneko, Niigata (JP); Jun Hatakeyama, Niigata (JP); Yuji Harada, Niigata (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 12 days.

This patent is subject to a terminal disclaimer.

(21) Appl. No.: 11/730,289

(22) Filed: Mar. 30, 2007

(65) Prior Publication Data

US 2007/0231738 A1   Oct. 4, 2007

(30) Foreign Application Priority Data

Apr. 4, 2006   (JP)   ............................. 2006-103016

(51) Int. Cl.
*G03F 7/039* (2006.01)
*G03F 7/038* (2006.01)
*G03F 7/20* (2006.01)
*G03F 7/30* (2006.01)

(52) U.S. Cl. .................. 430/270.1; 430/326; 430/330; 430/907; 430/910

(58) Field of Classification Search .................. None
See application file for complete search history.

(56) References Cited

U.S. PATENT DOCUMENTS

| | | |
|---|---|---|
| 3,726,710 A | 4/1973 | Berger et al. |
| 4,491,628 A | 1/1985 | Ito et al. |
| 5,278,022 A | 1/1994 | Wade et al. |
| 5,310,619 A | 5/1994 | Crivello et al. |
| 5,530,036 A | 6/1996 | Sano et al. |
| 5,541,037 A | 7/1996 | Hatakeyama et al. |
| 5,714,625 A | 2/1998 | Hada et al. |
| 6,004,724 A | 12/1999 | Yamato et al. |
| 6,063,953 A | 5/2000 | Hada et al. |
| 6,136,502 A | 10/2000 | Satoshi |
| 6,200,725 B1 | 3/2001 | Takechi et al. |
| 6,261,738 B1 | 7/2001 | Asakura et al. |
| 6,280,898 B1 | 8/2001 | Hasegawa et al. |
| 6,312,867 B1 | 11/2001 | Kinsho et al. |
| 6,414,101 B1 | 7/2002 | Watanabe et al. |
| 6,448,420 B1 | 9/2002 | Kinsho et al. |
| 6,512,020 B1 | 1/2003 | Asakura et al. |
| 6,767,688 B2 | 7/2004 | Teng et al. |
| 6,869,744 B2 | 3/2005 | Hatakeyama |
| 6,916,591 B2 | 7/2005 | Ohsawa et al. |
| 6,977,131 B2 | 12/2005 | Tao |
| 7,122,005 B2 | 10/2006 | Shusterman |
| 7,125,641 B2 | 10/2006 | Harada et al. |
| 7,291,441 B2 | 11/2007 | Sato |
| 7,312,016 B2 | 12/2007 | Koitabashi et al. |
| 7,371,510 B2 * | 5/2008 | Hirayama et al. ........... 430/326 |
| 2001/0026901 A1 | 10/2001 | Maeda et al. |
| 2001/0033989 A1 | 10/2001 | Harada et al. |
| 2001/0055726 A1 | 12/2001 | Kanna et al. |
| 2002/0031718 A1 | 3/2002 | Hashimoto et al. |
| 2002/0161148 A1 | 10/2002 | Harada et al. |
| 2003/0078352 A1 * | 4/2003 | Miyazawa et al. .......... 526/245 |
| 2003/0180444 A1 | 9/2003 | Takekuma et al. |

(Continued)

FOREIGN PATENT DOCUMENTS

EP   1 184 485   6/2002

(Continued)

OTHER PUBLICATIONS

Arimitsu, Koji et al. "Sensitivity Enhancement of Chemical-Amplification-Type Photoimaging Materials by Acetoacetic Acid Derivatives," Journal of Photopolymer Science and Technology, vol. 8, No. 1, 43-44 pp (1995).

(Continued)

*Primary Examiner*—Sin J. Lee
(74) *Attorney, Agent, or Firm*—Oliff & Berridge, PLC

(57) ABSTRACT

There is disclosed a resist composition comprising, at least, a polymer including repeating units represented by the following general formula (1). There can be provided a resist composition that has a good barrier property against water, prevents resist components from leaching to water, has high receding contact angle against water, does not require a protective film, has an excellent process applicability, suitable for the liquid immersion lithography and makes it possible to form micropatterns with high precision.

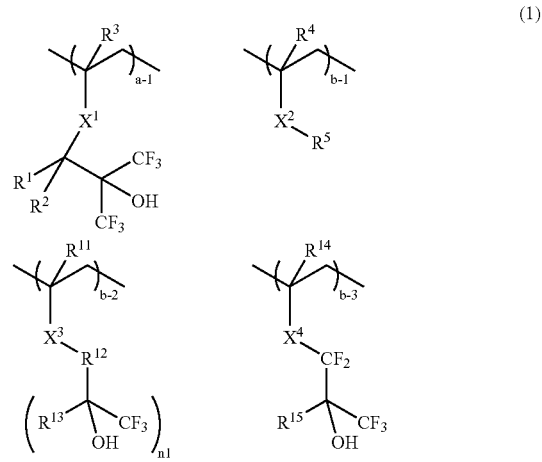

(1)

27 Claims, 1 Drawing Sheet

U.S. PATENT DOCUMENTS

| | | | |
|---|---|---|---|
| 2003/0224283 A1 | 12/2003 | Allen et al. | |
| 2004/0224525 A1 | 11/2004 | Endo et al. | |
| 2004/0236046 A1 | 11/2004 | Miyazawa et al. | |
| 2005/0019696 A1 | 1/2005 | Allen et al. | |
| 2005/0058938 A1 | 3/2005 | Tachibana et al. | |
| 2005/0079440 A1 | 4/2005 | Hatakeyama et al. | |
| 2005/0089796 A1 | 4/2005 | Funatsu et al. | |
| 2005/0147920 A1 | 7/2005 | Lin et al. | |
| 2005/0221221 A1 | 10/2005 | Hatakeyama et al. | |
| 2005/0227174 A1 | 10/2005 | Hatakeyama et al. | |
| 2005/0233254 A1 | 10/2005 | Hatakeyama et al. | |
| 2005/0239296 A1 | 10/2005 | Jung | |
| 2005/0250898 A1* | 11/2005 | Maeda et al. | 524/544 |
| 2006/0008736 A1 | 1/2006 | Kanda et al. | |
| 2006/0029884 A1 | 2/2006 | Hatakeyama et al. | |
| 2006/0057489 A1* | 3/2006 | Sumida et al. | 430/270.1 |
| 2006/0088774 A1 | 4/2006 | Yoshikawa et al. | |
| 2006/0105266 A1 | 5/2006 | Khojasteh et al. | |
| 2006/0194143 A1* | 8/2006 | Sumida et al. | 430/270.1 |
| 2006/0246373 A1 | 11/2006 | Wang | |
| 2006/0246377 A1 | 11/2006 | Yamato et al. | |
| 2006/0251991 A1 | 11/2006 | Araki et al. | |
| 2007/0003867 A1* | 1/2007 | Hatakeyama et al. | 430/270.1 |
| 2007/0026341 A1 | 2/2007 | Hatakeyama et al. | |
| 2007/0087125 A1 | 4/2007 | Maeda et al. | |
| 2007/0087285 A1 | 4/2007 | Huang et al. | |
| 2007/0099114 A1* | 5/2007 | Watanabe et al. | 430/270.1 |
| 2007/0105038 A1 | 5/2007 | Takeshita et al. | |
| 2007/0122736 A1 | 5/2007 | Hatakeyama et al. | |
| 2007/0122741 A1 | 5/2007 | Hatakeyama et al. | |
| 2007/0178407 A1 | 8/2007 | Hatakeyama et al. | |
| 2007/0179309 A1* | 8/2007 | Hasegawa et al. | 560/227 |
| 2007/0231738 A1 | 10/2007 | Kaneko et al. | |
| 2007/0249858 A1 | 10/2007 | Kinsho et al. | |
| 2007/0275326 A1 | 11/2007 | Hatakeyama et al. | |
| 2007/0298355 A1 | 12/2007 | Harada et al. | |
| 2008/0008961 A1 | 1/2008 | Nishi et al. | |
| 2008/0032202 A1 | 2/2008 | Ishizuka et al. | |
| 2008/0063950 A1 | 3/2008 | Yoshikawa et al. | |
| 2008/0085466 A1 | 4/2008 | Harada et al. | |
| 2008/0090172 A1 | 4/2008 | Hatakeyama et al. | |
| 2008/0153030 A1 | 6/2008 | Kobayashi et al. | |

FOREIGN PATENT DOCUMENTS

| | | |
|---|---|---|
| EP | 1 764 652 | 3/2007 |
| EP | 1 804 120 | 7/2007 |
| EP | 1 850 372 | 10/2007 |
| JP | A-60-38821 | 2/1985 |
| JP | A-62-62520 | 3/1987 |
| JP | A-62-62521 | 3/1987 |
| JP | 63-27829 | 2/1988 |
| JP | B2-2-27660 | 6/1990 |
| JP | A-5-74700 | 3/1993 |
| JP | A-6-273926 | 9/1994 |
| JP | A-7-181685 | 7/1995 |
| JP | A 07-295222 | 11/1995 |
| JP | A-9-73173 | 3/1997 |
| JP | A-9-90637 | 4/1997 |
| JP | A 09-095479 | 4/1997 |
| JP | A 09-208554 | 8/1997 |
| JP | A 09-230588 | 9/1997 |
| JP | A-9-230595 | 9/1997 |
| JP | A-9-246173 | 9/1997 |
| JP | A 09-301948 | 11/1997 |
| JP | A-9-301948 | 11/1997 |
| JP | A-10-10739 | 1/1998 |
| JP | B2-2803549 | 9/1998 |
| JP | B2 2906999 | 4/1999 |
| JP | A-11-190904 | 7/1999 |
| JP | A-2000-26446 | 1/2000 |
| JP | A-2000-159758 | 6/2000 |
| JP | A 2000-314956 | 11/2000 |
| JP | A-2000-327633 | 11/2000 |
| JP | A 2000-336121 | 12/2000 |
| JP | A-2000-344836 | 12/2000 |
| JP | A-2003-068633 | 3/2003 |
| JP | A-2004-198812 | 7/2004 |
| JP | A-2005-47945 | 2/2005 |
| JP | A-2005-164633 | 6/2005 |
| JP | A-2005-227528 | 8/2005 |
| JP | A-2005-232095 | 9/2005 |
| JP | A 2005-264131 | 9/2005 |
| JP | A-2005-326833 | 11/2005 |
| JP | A-2006-48029 | 2/2006 |
| JP | A-2006-078807 | 3/2006 |
| JP | A-2006-91830 | 6/2006 |
| JP | A-2006-145777 | 6/2006 |
| JP | A-2006-146151 | 6/2006 |
| JP | A-2006-228816 | 8/2006 |
| JP | A-2006-309245 | 11/2006 |
| JP | A-2007-25634 | 2/2007 |
| JP | A-2007-140446 | 6/2007 |
| JP | A-2007-187887 | 7/2007 |
| WO | WO/97/33198 | 9/1997 |
| WO | WO 2004/014960 A2 | 2/2004 |
| WO | WO 2004/074242 A2 | 9/2004 |
| WO | WO 2005/073812 | 8/2005 |
| WO | WO 2007/030918 | 3/2007 |

OTHER PUBLICATIONS

Kudo, Kazuaki et al. "Enhancement of the Sensitivity of Chemical-Amplification-Type Photoimaging Materials by B-Tosyloxyketone Acetals," Journal of Photopolymer Science and Technology, vol. 8, No. 1, 45-46 pp (1995).

Arimitsu, Koji et al. "Effect of Phenolic Hydroxyl Residues on the Improvement of Acid-Proliferation-Type Photoimaging Materials," Journal of Photopolymer Science and Technology, vol. 9, No. 1, 29-30 pp (1996).

Fedynyshyn, Theodore H., et al. "Advances in Resist Technology and Processing XIX, "Proceedings of SPIE, vol. 4690 (Mar. 4-6, 2002).

Owa, Soichi et al. "Immersion Lithography; its Potential Performance and Issues," Proceedings of SPIE, vol. 5040, 724-733 pp (2003).

Hirayama, Taku "Resist and Cover Material Investigation for Immersion Lithography," $2^{nd}$ Immersion Workshop (Jul. 11, 2003).

Nakano, Katsushi et al. "Defectivity Data Taken with a Full-Field Immersion Exposure Tool, " $2^{nd}$ International Symposium on Immersion Lithography, (Sep. 13, 2005).

Allen et al.; "Design of Protective Topcoats for Immersion Lithography," Journal of Photopolymer Science and Technology, vol. 18, No. 5, (2005), pp. 615-619.

Ito et al., "Dissolution/swelling behavior of cycloolefin polymers in aqueous base," In Advances in Resist Technology and Processing XVII, Proceedings of SPIE vol. 3999 (2000).

Murase et al. "Characterization of molecular interfaces in hydrophobic systems," Progress in Organic Coating (1997), vol. 31, pp. 97-104.

Ito et al., "Fluoropolymer Resists: Progress and Properties," Journal of Photopolymer Science and Technology, vol. 16, No. 4, pp. 523-536 (2003).

* cited by examiner

RESIST COMPOSITION AND PATTERNING PROCESS USING THE SAME

BACKGROUND OF THE INVENTION

1. Field of the Invention

The present invention relates to a resist composition that is used for micropatterning processes in manufacturing processes of semiconductor devices, for example, the liquid immersion lithography in which 193 nm ArF excimer laser is used as a light source and water is inserted in a gap between a projection lens and a wafer; and to a patterning process using the resist composition.

2. Description of the Related Art

There has been a demand to achieve a finer pattern rule along with a tendency in which integration and speed of LSIs have become higher in recent years. And in the optical exposure, which is used as a general technique at present, resolution has almost reached its inherent limit derived from a wavelength of a light source.

The optical exposure has been widely used so far using g line (436 nm) or i line (365 nm) of a mercury-vapor lamp as a light source when a resist pattern is formed. Then it has been recognized that a method of using an exposure light with a shorter wavelength is effective as a means for achieving a further finer pattern. For this reason, KrF excimer laser with a shorter wavelength of 248 nm has been used as an exposure light source instead of i line (365 nm) for mass-production process of a 64 M bit (a processing dimension of 0.25 μm or less) DRAM (dynamic random access memory) and beyond.

However, in order to manufacture DRAM with an integration of 256M, 1 G or more which requires a still finer processing techniques (a processing dimension of 0.2 μm or less), it is recognized that a light source with far shorter wavelength is needed. Therefore, the photolithography using ArF excimer laser (193 nm) has been eranestly examined since about 10 years ago.

At first, it was planned to apply ArF lithography to fabrication of 180 nm node devices and beyond. However, application of KrF excimer laser lithography has been extended up to mass-production of 130 nm node devices, and ArF lithography is applied on a full-scale basis to fabrication of 90 nm node devices and beyond. Furthermore, fabrication of 65 nm node devices has been examined with combination of ArF lithography and a lens having an enhanced NA of 0.9.

As for fabrication of the next 45 nm node devices, shorter exposure wavelength has been achieved, and $F_2$ lithography at a wavelength of 157 nm was suggested to be a possible choice. However, it was suggested to postpone introduction of $F_2$ lithography and early introduction of ArF liquid immersion lithography due to various problems such as increase in cost by using large amounts of expensive $CaF_2$ single crystals for a projection lens; necessary change of optical system associated with introduction of a hard pellicle because a soft pellicle has extremely low durability; and decrease of etching resistance of a resist (See Proc. SPIE Vol. 4690 xxix).

In the ArF liquid immersion lithography, it has been suggested to fill a gap between a projection lens and a wafer with water. Water has an index of refraction of 1.44 with 193 nm light, and a pattern can be formed even with using a lens having an NA of 1.0 or more. In theory, NA can be increased up to 1.35. Resolution is enhanced by increment of NA. It is shown that combination of a lens having an NA of 1.2 or more and ultra resolution techniques can realize fabrication of 45 nm node devices (See Proc. SPIE Vol. 5040 p 724).

As for the ArF liquid immersion lithography, various problems were pointed out due to the presence of water on a resist film. That is, the problems include pattern deformation due to leaching of a photo acid generator, which is a resist component, acid generated upon exposure to radiation, and an amine compound added to the resist film as a quencher, to water which is in contact with the resist film; pattern collapse due to water swelling of a photoresist film; and the like.

In particular, investigations of leaching of a resist component to water have been initiated initially for the purpose of preventing contamination of a projection lens of exposure system. And Manufacturers of exposure systems suggested standards of leaching amount.

As an effective method for solving the problem, it has been suggested that a protective film consisting of perfluoroalkyl compounds is placed between the resist film and water (See 2nd Immersion Work Shop, Jul. 11, 2003, Resist and Cover Material Investigation for Immersion Lithography).

Forming such a protective film prevents direct contact between the photoresist film and water, and thus it becomes possible to inhibit leaching of a photoresist component to water.

However, as to the protective film consisting of perfluoroalkyl compounds, flons and the like are used as a diluent for controlling applied film thickness. It is a known fact that use of flons is now perceived as a problem in view of environmental protection. Furthermore, the protective film causes serious practical problems of involving additional installation of applying unit and stripping unit that are intended for the protective film only to conventional equipment, mounting costs of flon solvents, and the like because the protective film has to be stripped with flons prior to developing a photoresist film.

As a means to reduce the drawbacks in practically using the solvent-stripping type protective film, an alkaline-developer-soluble type protective film is suggested (See Japanese Publication of Unexamined Application No. 2005-264131).

Such an alkaline-developer-soluble type protective film is novel in that the film is dissolved and removed concurrently with a step of developing a photoresist film, whereby no additional step of stripping a protective film or no stripping unit that are intended for the protective film only is required. However, use of such an alkaline-developer-soluble type protective film still requires a step of applying the protective film. Furthermore, a diluting solvent that constitutes an application solution of the protective film composition needs to be selected from what do not dissolve a photoresist film easily due to constraints that the diluting solvent must not erode the photoresist film to be an underlying layer of the protective film. In order to avoid troubles such as precipitation of resin due to mixing of chemical solutions of the protective film composition and the photoresist film composition.

As mentioned above, in the liquid immersion lithography, drawbacks such as cost increase involving use of the protective film have been perceived as problems. Against these problems, development of a resist composition for the liquid immersion lithography is underway. The resist composition does not require the protective film by providing barrier property against water with the resist composition. The development is intended to reduce the cost.

By the way, in ArF liquid immersion exposure systems that have been provided so far, exposure is conducted not by immersing into water the whole substrate on which a resist film is applied but by partially retaining water between a projection lens and wafer and exposing the wafer with scanning the stage on which the wafer is placed at a speed of 300 to 550 mm per second. Such high-speed scanning causes a problem of leaving droplets on the surface of a photoresist or a protective film after scanning because water cannot be retained between a projection lens and a wafer. It is recognized that such left droplets cause patterning defects.

In order to solve leaving of droplets on the surface of a photoresist film or a protective film after scanning, it is necessary to improve mobility of water on these applied films. It is disclosed that in order to reduce defects in liquid immersion exposure, increasing the receding contact angle of the photoresist film or the protective film against water is effective (See 2nd International Symposium on Immersion Lithography, 12-15 Sep. 2005, Defectivity data taken with a full-field immersion exposure tool, Nakano et., al.).

However, there is no resist composition realizing both barrier property and high receding contact angle, and such a resist composition has been demanded.

SUMMARY OF THE INVENTION

The present invention has been accomplished to solve the above-mentioned problems, and an object of the present invention is to provide a resist composition that has a good barrier property against water, prevents resist components from leaching to water, has high receding contact angle against water, solves leaving of droplets, does not require a protective film, has an excellent process applicability, and suitable for the liquid immersion lithography; and a patterning process using the resist composition.

To achieve the object, the present invention provides a resist composition comprising, at least, a polymer including repeating units represented by the following general formula (1),

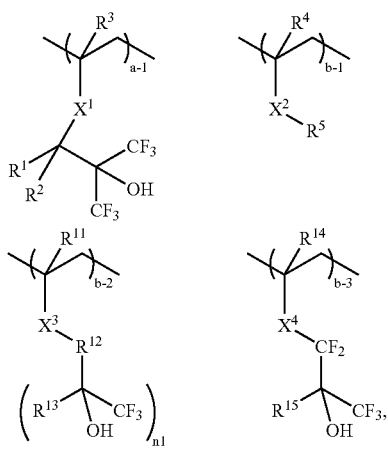

wherein $R^1$ and $R^2$ independently represent a hydrogen atom, or a linear, branched or cyclic alkyl group having 1 to 20 carbon atoms; $R^1$ and $R^2$ may bond together to form a ring, and in the case of $R^1$ and $R^2$ forming a ring, $R^1$ and $R^2$ together represent a divalent organic group having 2 to 20 carbon atoms;

$R^3$, $R^4$, $R^{11}$, and $R^{14}$ independently represent a hydrogen atom or a methyl group;

$R^5$ represents a linear, branched or cyclic alkyl group having 1 to 14 carbon atoms, in which some or all hydrogen atoms may be optionally substituted with fluorine atoms, and the alkyl group may include an iminosulfonyl group;

$X^1$, $X^2$, $X^3$, and $X^4$ independently represent any one of —C(=O)—, —C(=O)—O—, —C(=O)—O—$R^6$—, —O—, —C(=O)—$R^6$—C(=O)—, and —C(=O)—O—$R^6$—C(=O)—O—; $R^6$ represents a linear, branched or cyclic alkylene group having 1 to 10 carbon atoms;

$R^{12}$ represents an alkylene group or an alkanetriyl group that includes a cyclic structure having 4 to 12 carbon atoms, and the group may be optionally substituted with a fluorine atom; $R^{13}$ represents a hydrogen atom, or a linear or branched alkyl group having 1 to 10 carbon atoms in which the group may optionally be substituted with a fluorine atom; $R^{12}$ and $R^{13}$ may bond together to form a ring having 3 to 12 carbon atoms;

$R^{15}$ represents a hydrogen atom, or a linear or branched alkyl group having 1 to 10 carbon atoms in which the group may optionally be substituted with a fluorine atom;

n1 represents 1 or 2; and a-1, b-1, b-2, and b-3 satisfy the range of 0<(a-1)≦1, 0≦(b-1)<1, 0≦(b-2)<1, 0≦(b-3)<1, 0<(a-1)+(b-1)+(b-2)+(b-3)≦1.

The present invention also provides a resist composition comprising, at least, a polymer including repeating units represented by the following general formula (2),

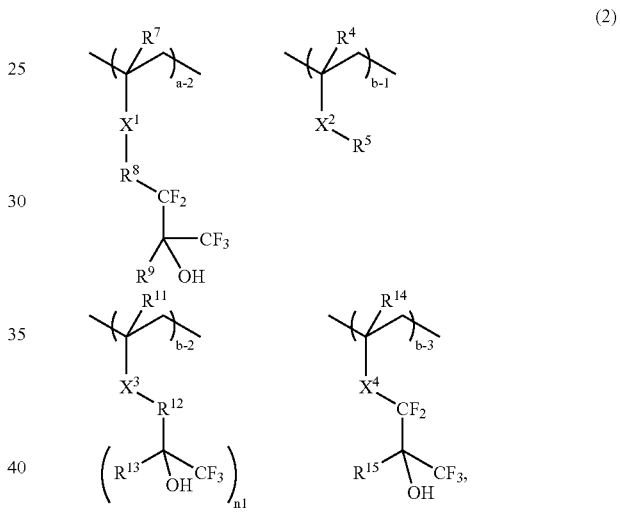

wherein $R^4$, $R^7$, $R^{11}$, and $R^{14}$ independently represent a hydrogen atom or a methyl group;

$R^8$ represents a linear, branched or cyclic alkylene group having 1 to 6 carbon atoms, in which one or more hydrogen atoms may optionally be substituted with a fluorine atom;

$R^5$ represents a linear, branched or cyclic alkyl group having 1 to 14 carbon atoms, in which some or all hydrogen atoms may be substituted with fluorine atoms, and the alkyl group may include an iminosulfonyl group;

$R^9$ represents a linear or branched alkyl group having 1 to 10 carbon atoms in which one or more hydrogen atoms are substituted with a fluorine atom; $R^8$ and $R^9$ may bond together to form a ring, and in the case of $R^8$ and $R^9$ forming a ring, $R^8$ and $R^9$ together represent a tervalent organic group having 2 to 12 carbon atoms;

$X^1$, $X^2$, $X^3$, and $X^4$ independently represent any one of —C(=O)—, —C(=O)—O—, —C(=O)—O—$R^6$—, —O—, —C(=O)—$R^6$—C(=O)—, and —C(=O)—O—$R^6$—C(=O)—O—; $R^6$ represents a linear, branched or cyclic alkylene group having 1 to 10 carbon atoms;

$R^{12}$ represents an alkylene group or an alkanetriyl group that includes a cyclic structure having 4 to 12 carbon atoms, and the group may be optionally substituted with a fluorine atom; $R^{13}$ represents a hydrogen atom, or a linear or branched alkyl group having 1 to 10 carbon atoms in which the group may optionally be substituted with a fluorine atom; $R^{12}$ and $R^{13}$ may bond together to form a ring having 3 to 12 carbon atoms;

$R^{15}$ represents a hydrogen atom, or a linear or branched alkyl group having 1 to 10 carbon atoms in which the group may optionally be substituted with a fluorine atom;

n1 represents 1 or 2; and a-2, b-1, b-2, and b-3 satisfy the range of $0<(a\text{-}2)\leqq 1$, $0\leqq(b\text{-}1)<1$, $0\leqq(b\text{-}2)<1$, $0\leqq(b\text{-}3)<1$, $0<(a\text{-}2)+(b\text{-}1)+(b\text{-}2)+(b\text{-}3)\leqq 1$.

Photoresist films formed with the resist compositions have a good barrier property against water, and thus prevent photoresist components from leaching to water in the liquid immersion exposure, thereby reducing deformation of pattern profile due to leached components. Therefore, there is no need to use protective films, which are conventionally formed to prevent the leaching in the liquid immersion lithography. As a result, cost that is required for forming the protective films can be cut.

Furthermore, the photoresist films have high receding contact angles against water, and thus droplets are prevented from remaining on the surfaces of the photoresist films after scanning for the liquid immersion exposure, thereby reducing patterning defects that are caused by droplets remaining on the films' surfaces.

In summary, the resist composition according to the present invention has an excellent process applicability, reduces cost in the liquid immersion lithography, and makes it possible to form micropatterns having reduced defects with high precision.

In the above cases, the polymer preferably does not have an alkyl group having 5 or more carbon atoms.

The polymer that does not have an alkyl group having 5 or more carbon atoms provides less possibility to generate spot-like defects being referred to as Blob, thereby making it possible to forming patterns having less defects.

In the above cases, the resist composition is preferably a chemically amplified positive resist composition. And also, the resist composition preferably comprises a base resin including at least a repeating unit having an acid labile group, and a repeating unit having an adhesion group of a hydroxy group and/or a lactone ring.

Such a chemically amplified positive resist composition realizes high adhesion with a substrate by the base resin including a repeating unit having an adhesion group of a hydroxy group and/or a lactone ring. Furthermore, when the base resin includes a repeating unit having an acid labile group, an acid generated from an acid generator upon exposure to radiation cleaves the acid labile group to change an exposed area of the resist to be soluble in a developer. Thus, the chemically amplified positive resist composition provides a pattern with extremely high precision.

The resist composition preferably further contains any one or more of an organic solvent, a basic compound, a dissolution inhibitor and a surfactant.

In this way, by further adding an organic solvent, for example, an application property of the resist composition to a substrate etc. can be improved. By adding a basic compound, a diffusion rate of acid in a resist film can be suppressed and thus resolution can be further improved. By adding a dissolution inhibitor, difference of a dissolution rate between an exposed area and a non-exposed area can be further increased and thus resolution can be further improved. By adding a surfactant, an application property of the resist composition can be further improved or controlled.

The present invention provides a patterning process comprising: at least, a step of applying the resist composition on a substrate; a step of conducting heat-treatment and then exposing the substrate to a high energy beam; and a step of developing the substrate with a developer.

In this patterning process, it is natural that the development may be conducted after heat treatment following exposure, and other various processes, such as an etching process, a resist removing process, a washing process, etc. may be performed.

In the above case, it is preferable that the high energy beam has a wavelength in the range of 180 to 250 nm.

In this way, conducting exposure with the high energy beam having a wavelength in the range of 180 to 250 nm allows for finer patterning.

Furthermore, it is possible that the step of exposing the substrate to a high energy beam is conducted by liquid immersion exposure in which the substrate is exposed through liquid. It is also possible that in the liquid immersion exposure, an exposure wavelength in the range of 180 to 250 nm is used, a gap between the substrate to which the resist composition is applied and a projection lens is filled with liquid, and the substrate is exposed through the liquid.

In this way, conducting liquid immersion exposure enhances resolution, thereby providing finer pattern.

Furthermore, as the liquid, water may be used.

Examples of the liquid used in the liquid immersion exposure include water.

As described above, photoresist films formed with the resist compositions according to the present invention have a good barrier property against water, and thus prevent photoresist components from leaching to water, thereby reducing deformation of pattern profile due to leached components. Therefore, there is no need to use protective films, which are conventionally formed to prevent the leaching in the liquid immersion lithography. As a result, cost that is required for forming the protective films and the like can be cut.

Furthermore, the photoresist films have high receding contact angles against water, and thus droplets are prevented from remaining on the surfaces of the photoresist films after scanning for the liquid immersion exposure, thereby reducing patterning defects that are caused by droplets remaining on the films' surfaces.

In summary, use of the resist composition according to the present invention reduces cost in the liquid immersion lithography, and makes it possible to form micropatterns having reduced defects with high precision.

DESCRIPTION OF THE INVENTION AND A PREFERRED EMBODIMENT

Figure 1:
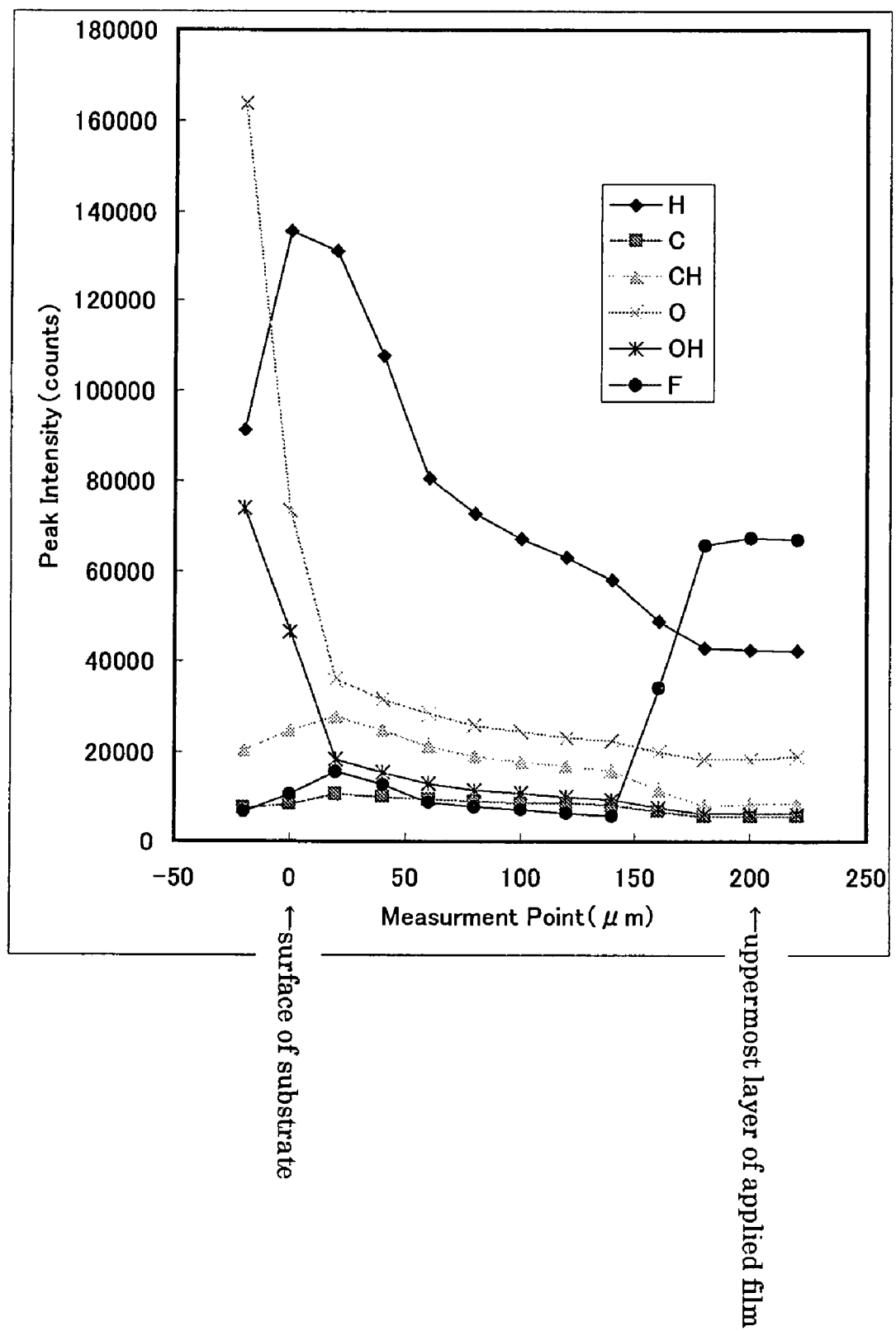
FIG. 1 illustrates profiles of anions in the direction of the depth of a film formed by applying the resist composition according to the present invention.

Hereafter, an embodiment of the present invention will be explained, but the present invention is not limited thereto.

As mentioned above, development of a resist composition realizing both barrier property and high receding contact angle for the liquid immersion exposure has been demanded.

In order to achieve the object, the present inventors have thoroughly examined and investigated. They have found that in the liquid immersion lithography processes in which protective films are not used and a photoresist film directly contacts with water, a photoresist film formed with containing a specific polymeric additive (1) prevents photoresist components from leaching to water and (2) achieves increase of receding contact angle against water. And they have examined various compositions and blendings of the polymeric additive. As a result, they have accomplished the present invention.

That is, the present invention provides a resist composition comprising, at least, a polymer including repeating units represented by the following general formula (1),

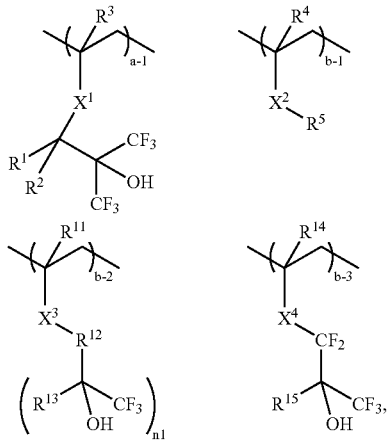

(1)

wherein $R^1$ and $R^2$ independently represent a hydrogen atom, or a linear, branched or cyclic alkyl group having 1 to 20 carbon atoms; $R^1$ and $R^2$ may bond together to form a ring, and in the case of $R^1$ and $R^2$ forming a ring, $R^1$ and $R^2$ together represent a divalent organic group having 2 to 20 carbon atoms;

$R^3$, $R^4$, $R^{11}$, and $R^{14}$ independently represent a hydrogen atom or a methyl group;

$R^5$ represents a linear, branched or cyclic alkyl group having 1 to 14 carbon atoms, in which some or all hydrogen atoms may be optionally substituted with fluorine atoms, and the alkyl group may include an iminosulfonyl group;

$X^1$, $X^2$, $X^3$, and $X^4$ independently represent any one of —C(=O)—, —C(=O)—O—, —C(=O)—O—$R^6$—, —O—, —C(=O)—$R^6$—C(=O)—, and —C(=O)—O—$R^6$—C(=O)—O—; $R^6$ represents a linear, branched or cyclic alkylene group having 1 to 10 carbon atoms;

$R^{12}$ represents an alkylene group or an alkanetriyl group that includes a cyclic structure having 4 to 12 carbon atoms, and the group may be optionally substituted with a fluorine atom; $R^{13}$ represents a hydrogen atom, or a linear or branched alkyl group having 1 to 10 carbon atoms in which the group may optionally be substituted with a fluorine atom; $R^{12}$ and $R^{13}$ may bond together to form a ring having 3 to 12 carbon atoms;

$R^{15}$ represents a hydrogen atom, or a linear or branched alkyl group having 1 to 10 carbon atoms in which the group may optionally be substituted with a fluorine atom;

n1 represents 1 or 2; and a-1, b-1, b-2, and b-3 satisfy the range of $0<(a\text{-}1)\leq 1$, $0\leq(b\text{-}1)<1$, $0\leq(b\text{-}2)<1$, $0\leq(b\text{-}3)<1$, $0<(a\text{-}1)+(b\text{-}1)+(b\text{-}2)+(b\text{-}3) \leq 1$.

And also, the present invention provides a resist composition comprising, at least, a polymer including repeating units represented by the following general formula (2),

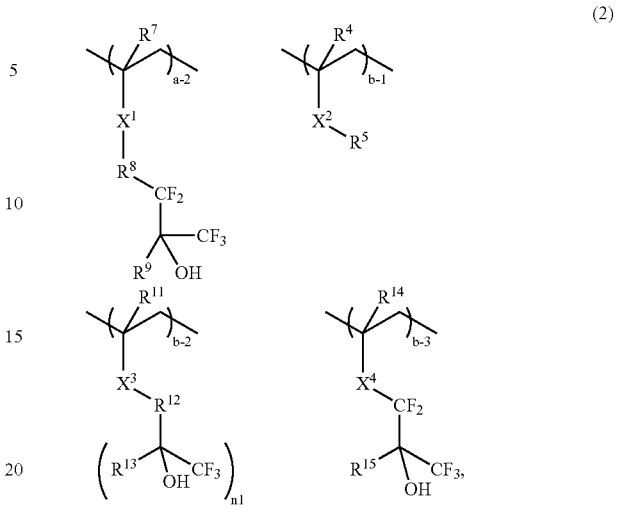

(2)

wherein $R^4$, $R^7$, $R^{11}$, and $R^{14}$ independently represent a hydrogen atom or a methyl group;

$R^8$ represents a linear, branched or cyclic alkylene group having 1 to 6 carbon atoms, in which one or more hydrogen atoms may optionally be substituted with a fluorine atom;

$R^5$ represents a linear, branched or cyclic alkyl group having 1 to 14 carbon atoms, in which some or all hydrogen atoms may be substituted with fluorine atoms, and the alkyl group may include an iminosulfonyl group;

$R^9$ represents a linear or branched alkyl group having 1 to 10 carbon atoms in which one or more hydrogen atoms are substituted with a fluorine atom; $R^8$ and $R^9$ may bond together to form a ring, and in the case of $R^8$ and $R^9$ forming a ring, $R^8$ and $R^9$ together represent a tervalent organic group having 2 to 12 carbon atoms;

$X^1$, $X^2$, $X^3$, and $X^4$ independently represent any one of —C(=O)—, —C(=O)—O—, —C(=O)—O—$R^6$—, —O—, —C(=O)—$R^6$—C(=O)—, and —C(=O)—O—$R^6$—C(=O)—O—; $R^6$ represents a linear, branched or cyclic alkylene group having 1 to 10 carbon atoms;

$R^{12}$ represents an alkylene group or an alkanetriyl group that includes a cyclic structure having 4 to 12 carbon atoms, and the group may be optionally substituted with a fluorine atom; $R^{13}$ represents a hydrogen atom, or a linear or branched alkyl group having 1 to 10 carbon atoms in which the group may optionally be substituted with a fluorine atom; $R^{12}$ and $R^{13}$ may bond together to form a ring having 3 to 12 carbon atoms;

$R^{15}$ represents a hydrogen atom, or a linear or branched alkyl group having 1 to 10 carbon atoms in which the group may optionally be substituted with a fluorine atom;

n1 represents 1 or 2; and a-2, b-1, b-2, and b-3 satisfy the range of $0<(a\text{-}2)\leq 1$, $0\leq(b\text{-}1)<1$, $0\leq(b\text{-}2)<1$, $0\leq(b\text{-}3)<1$, $0<(a\text{-}2)+(b\text{-}1)+(b\text{-}2)+(b\text{-}3) \leq 1$.

When a resist composition to which a polymer including repeating units represented by the general formula (1) or (2) is added is used to form a photoresist film by spin-coating and the like, the polymer accumulates in the surface of the photoresist film. The polymer has high hydrophobicity and an excellent water repellency, and thus the formed photoresist film has a good barrier property against water and prevents photoresist components from leaching to water at the time of the liquid immersion exposure, thereby reducing deformation of pattern profile due to leached components. Therefore, there is no need to use protective films, which are conventionally formed to prevent the leaching in the liquid immersion lithography. As a result, cost that is required for forming the protective films and the like can be cut.

Furthermore, the photoresist films have high receding contact angles against water, and thus droplets are prevented from remaining on the surfaces of the photoresist films after scanning for the liquid immersion exposure, thereby reducing patterning defects that are caused by droplets remaining on the films' surfaces.

And the polymer is soluble in aqueous alkaline solutions, thereby being less prone to generate defects such as residue after development.

Accordingly, use of the resist composition according to the present invention makes it possible to reduce cost in the liquid immersion lithography, and to make it possible to form micropatterns having reduced defects with high precision.

The repeating unit (a-1) shown in the general formula (1) is not particularly limited. But examples thereof are shown below.

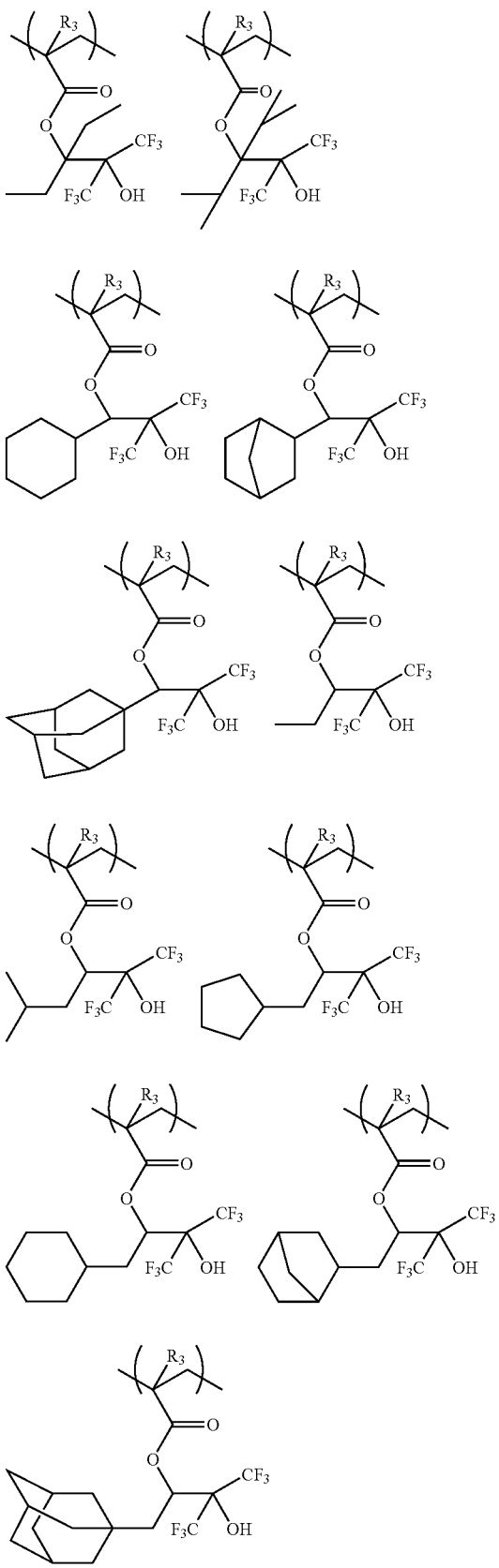

-continued
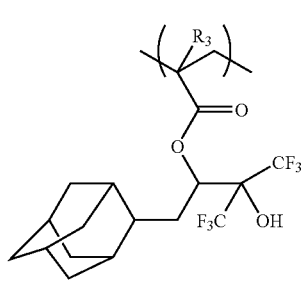
(In the formulae, R³ is the same as above.)
The repeating unit (a-2) shown in the general formula (2) is not particularly limited. But examples thereof are shown below.
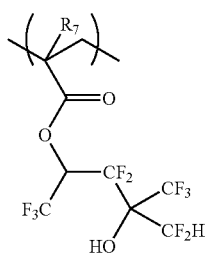 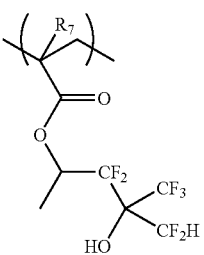
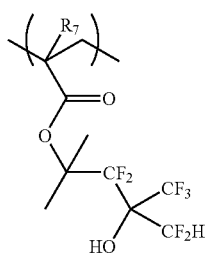 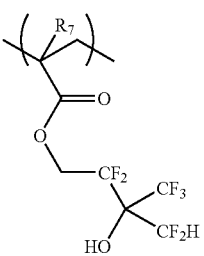
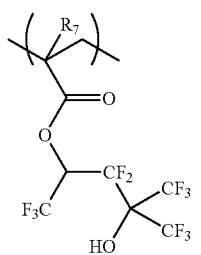 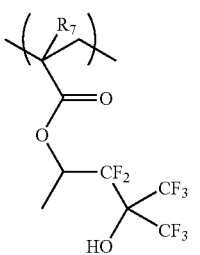
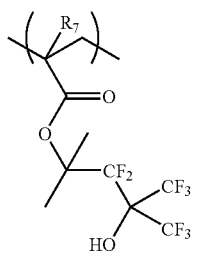 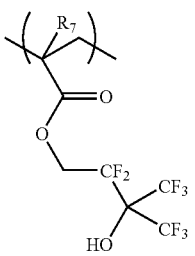
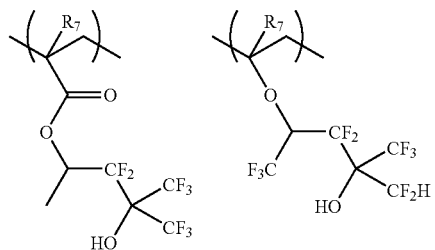
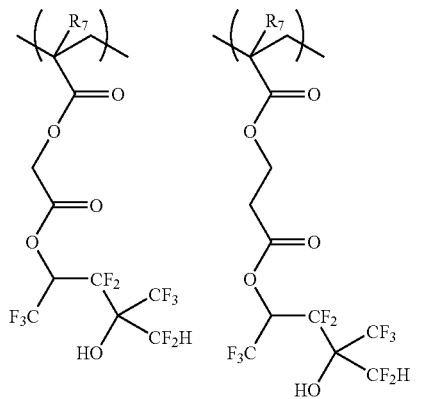
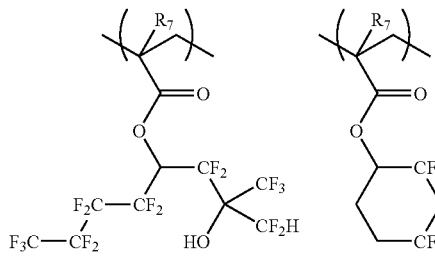
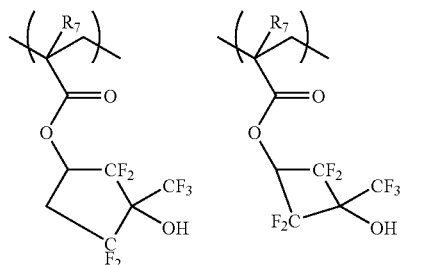
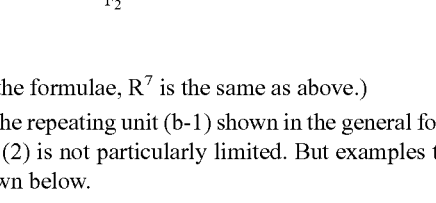
(In the formulae, R⁷ is the same as above.)
The repeating unit (b-1) shown in the general formulae (1) and (2) is not particularly limited. But examples thereof are shown below.
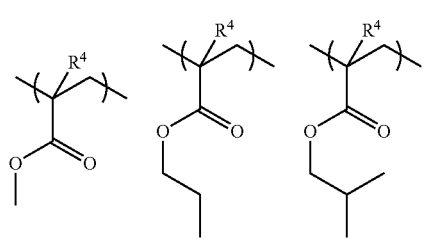

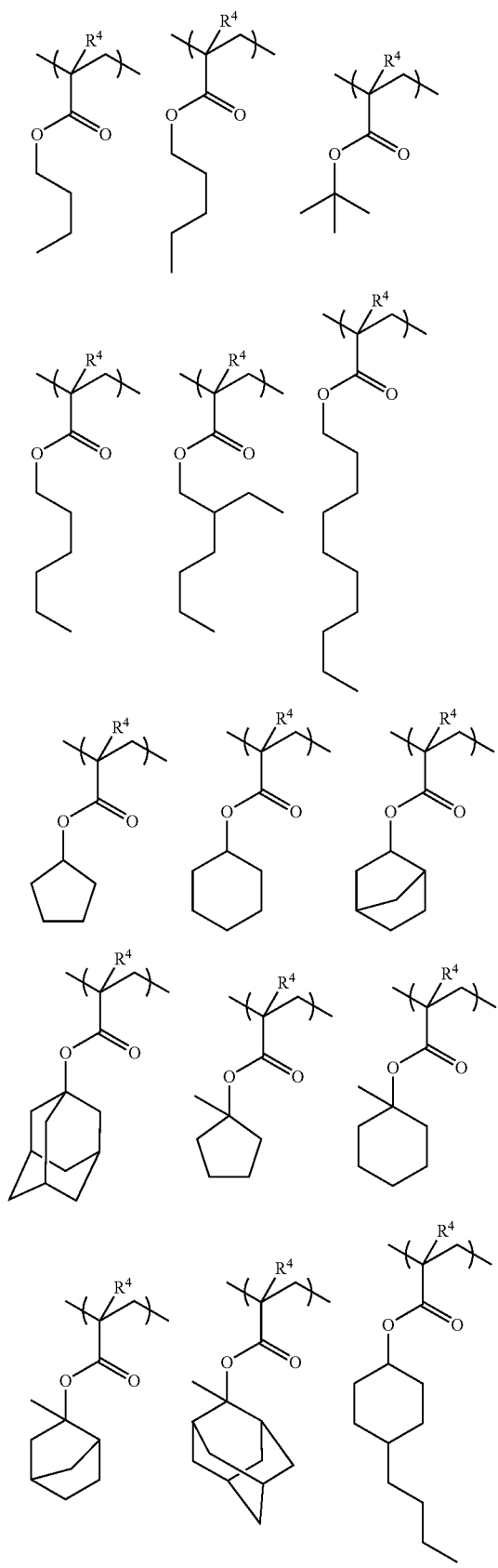
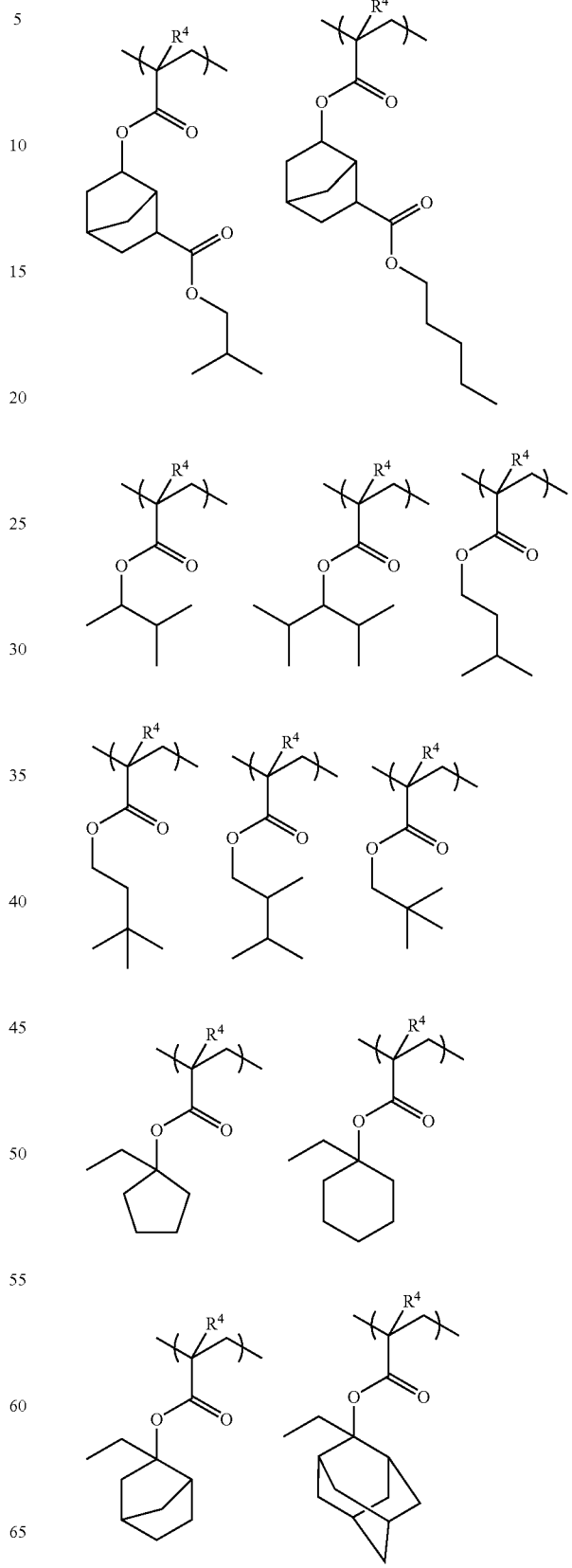

-continued
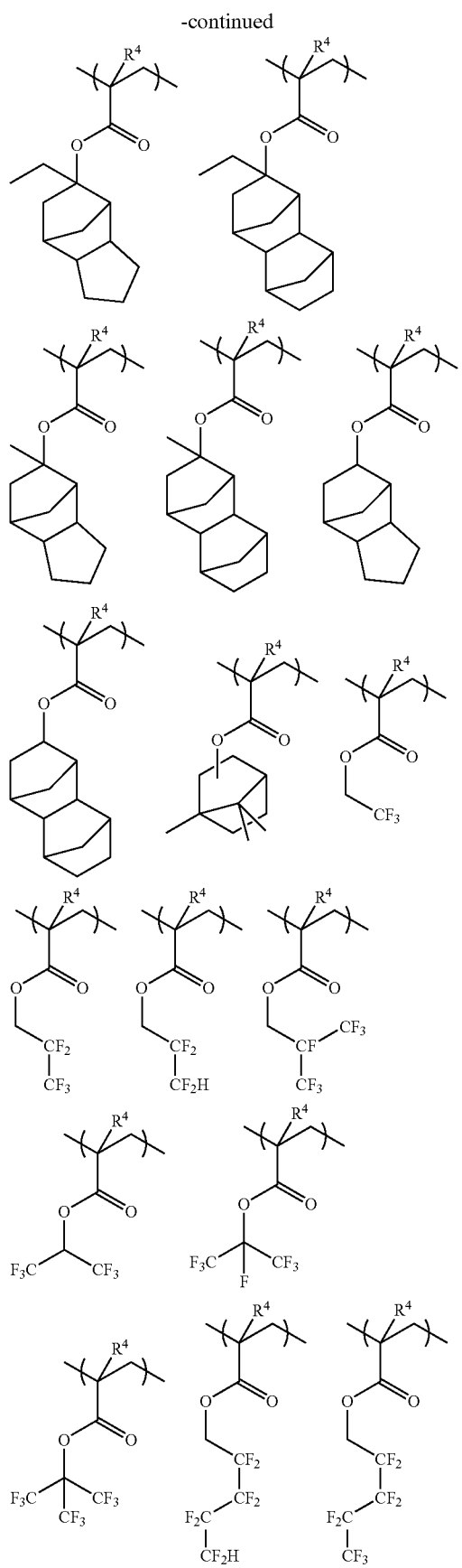
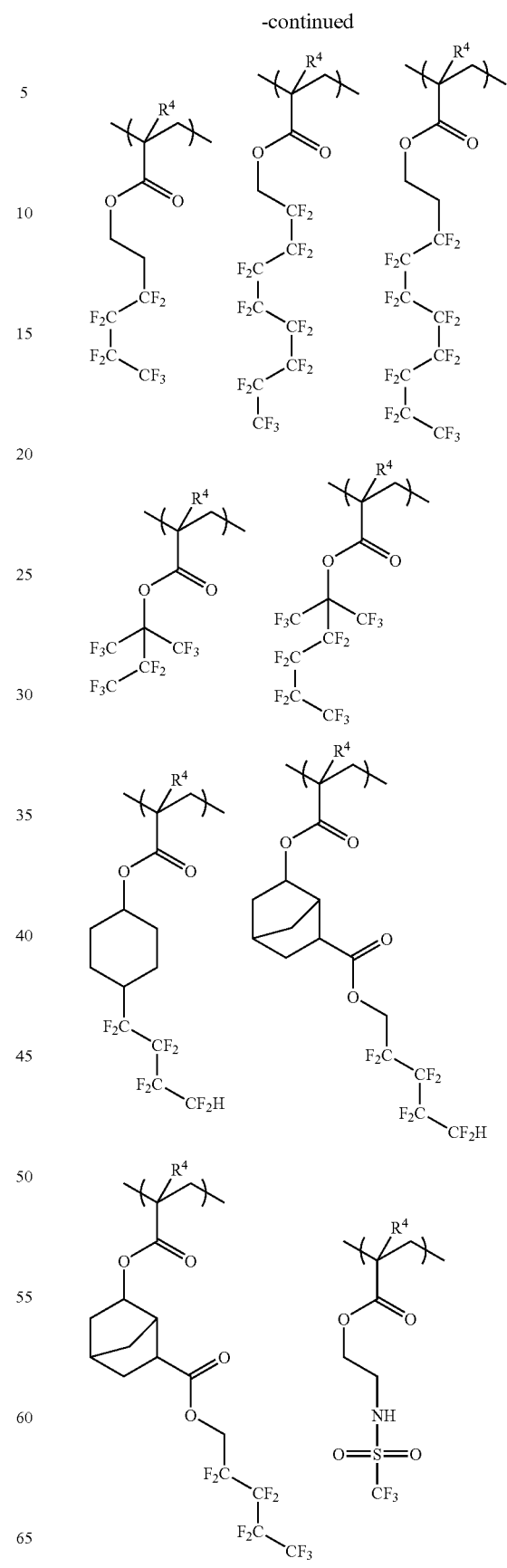

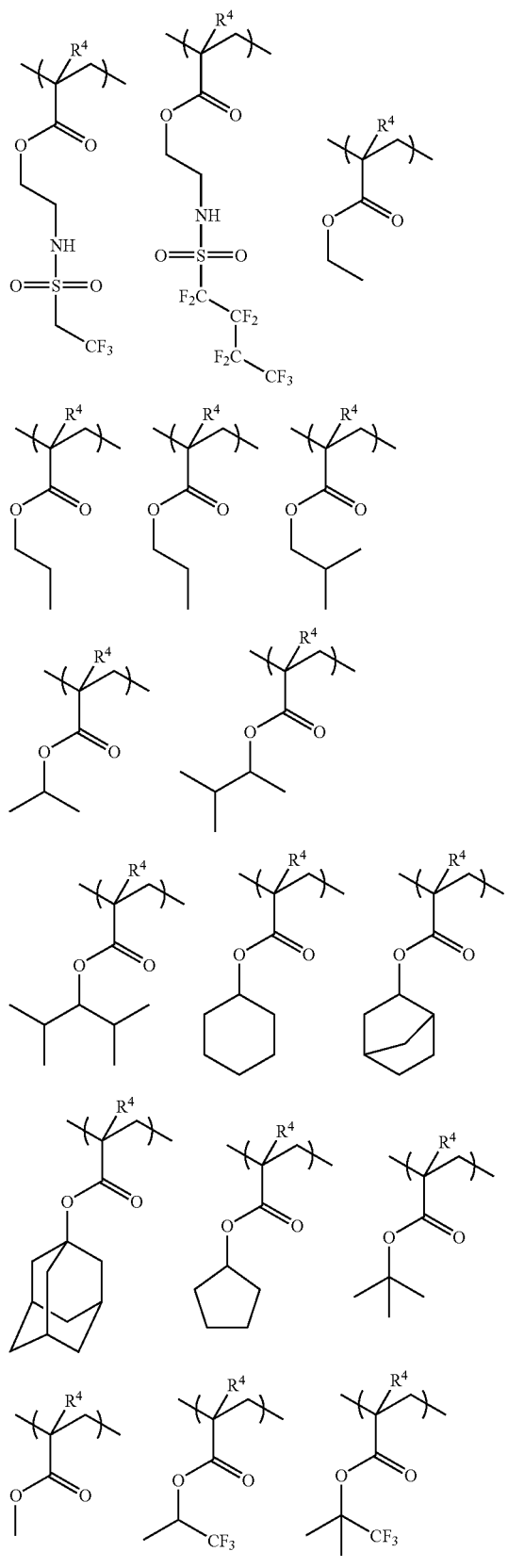
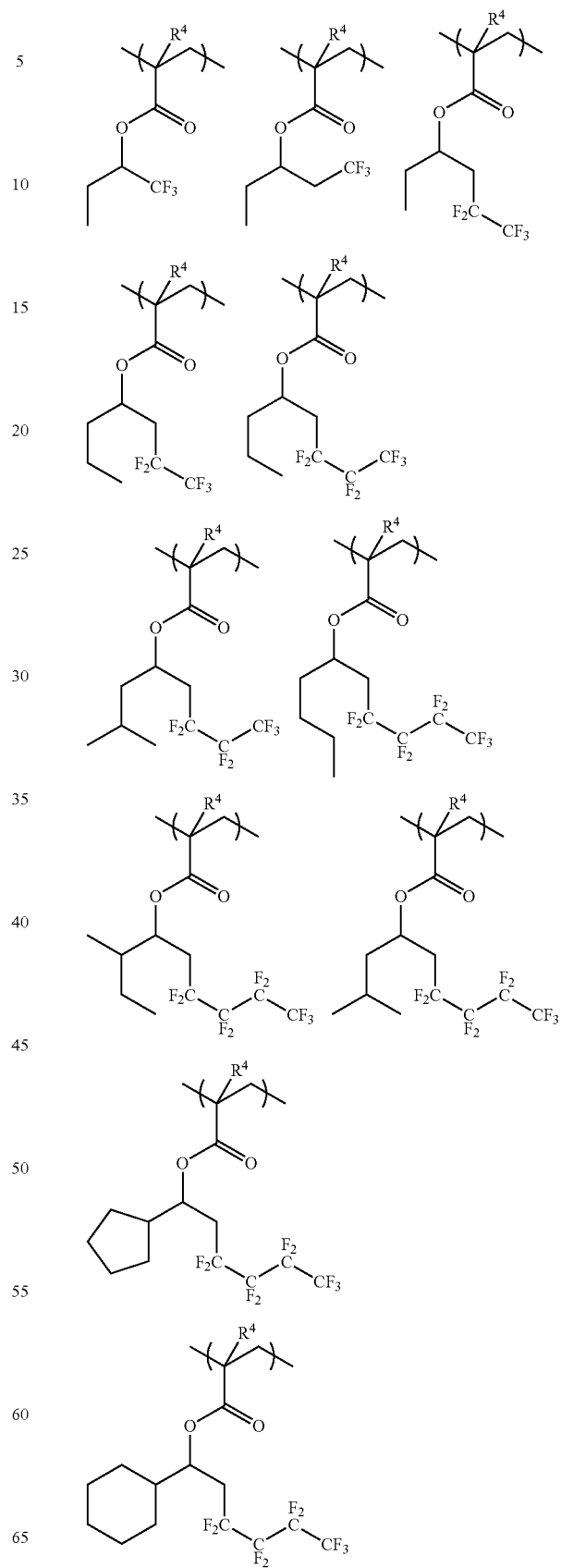

-continued
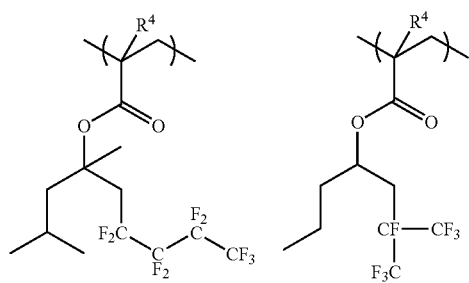
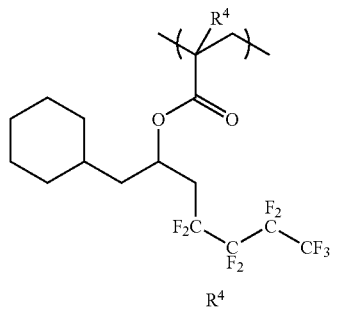
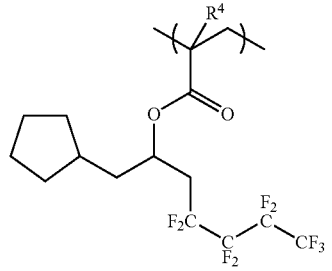
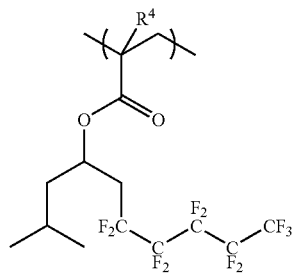
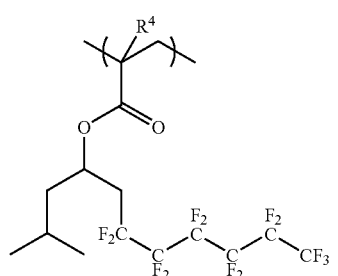
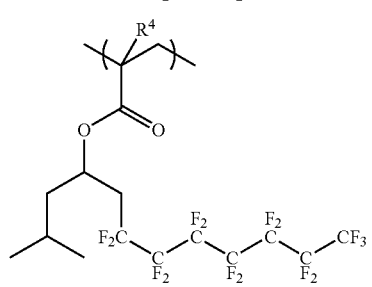
-continued
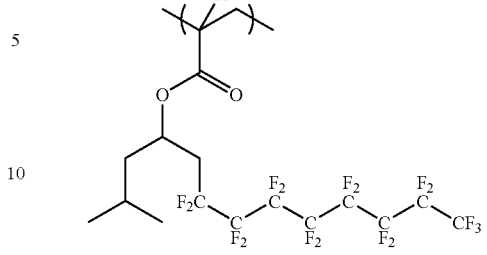
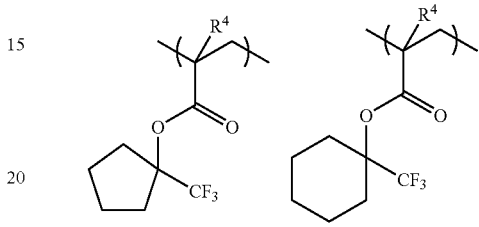
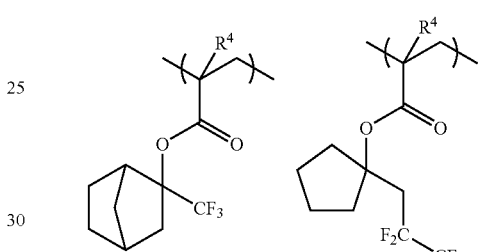
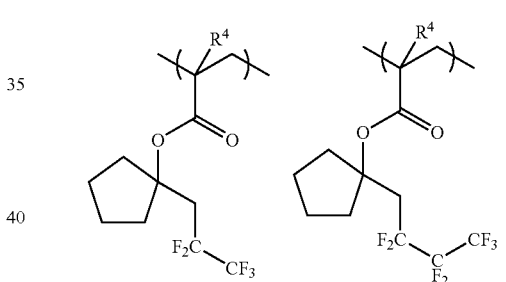
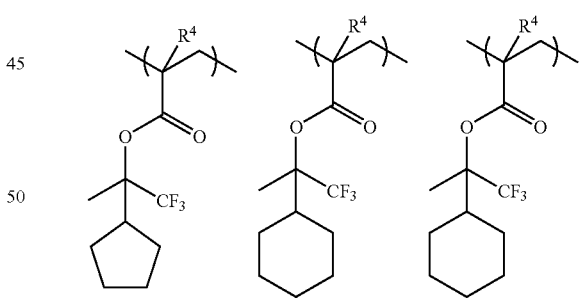
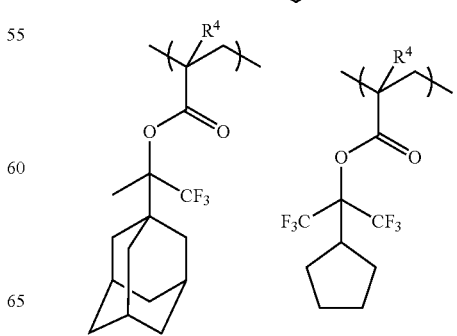

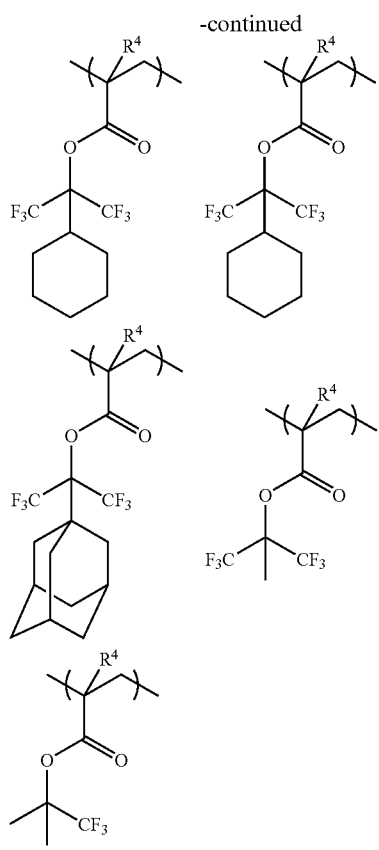
(In the formulae, R⁴ is the same as above.)
The repeating unit (b-2) shown in the general formulae (1) and (2) is not particularly limited. But examples thereof are shown below.
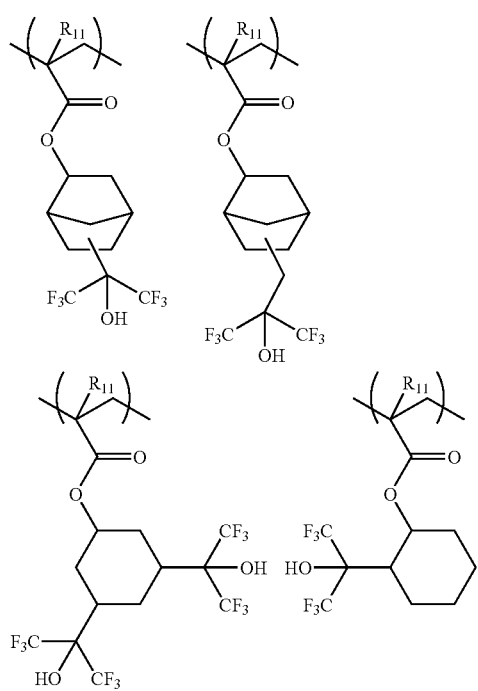
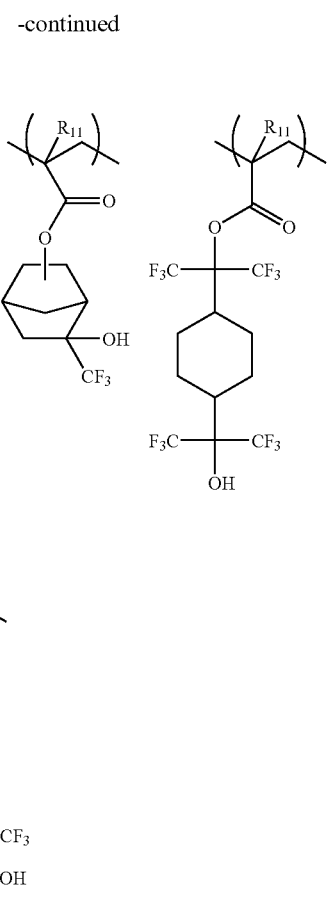
(In the formulae, R¹¹ is the same as above.)
The repeating unit (b-3) shown in the general formulae (1) and (2) is not particularly limited. But examples thereof are shown below.
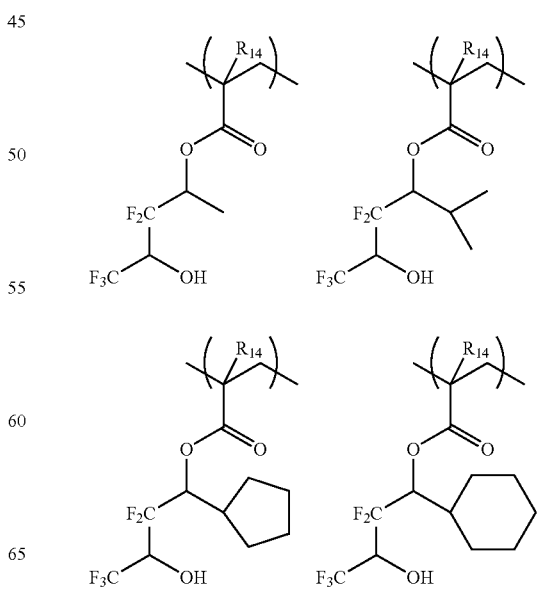

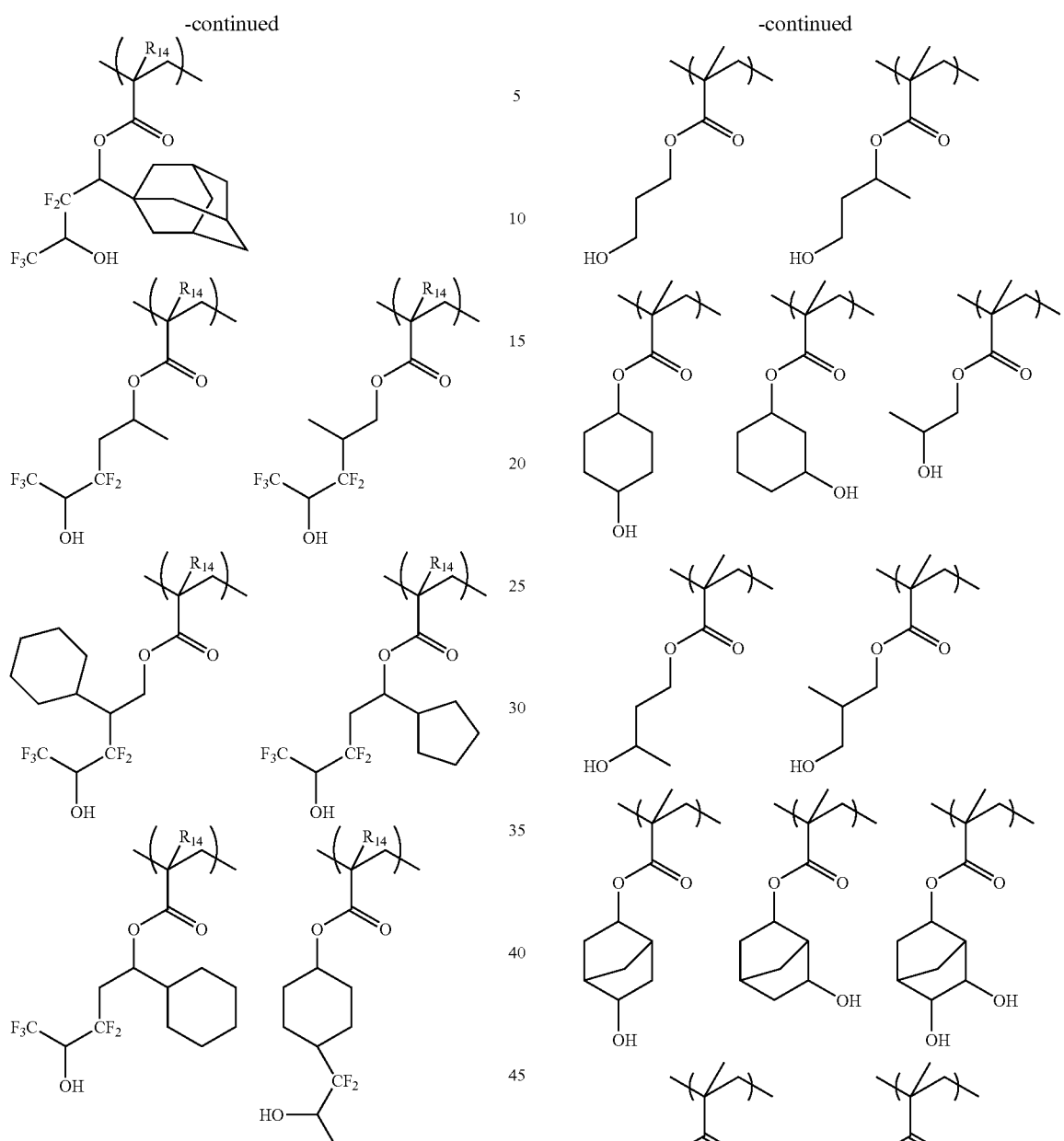
(In the formulae, $R^{14}$ is the same as above.)
The polymer according to the present invention may further include the following repeating units having a hydroxy group or hydroxy groups other than the repeating units (a-1), (a-2), (b-1), (b-2), and (b-3).
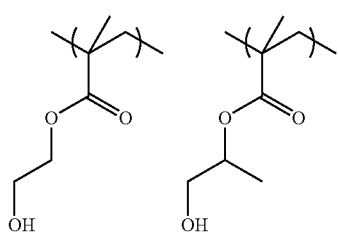

-continued

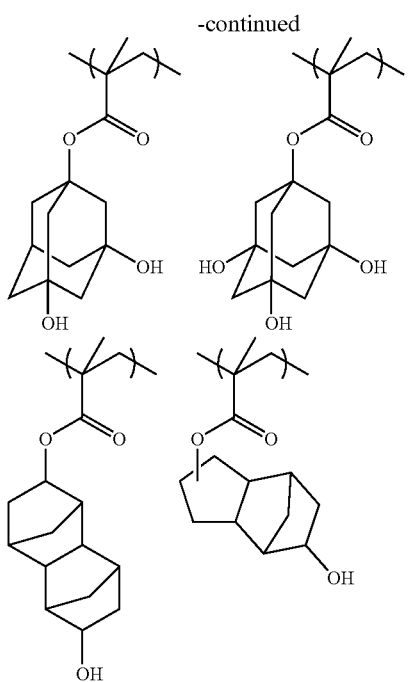

Furthermore, the polymer according to the present invention preferably does not have an alkyl group having 5 or more carbon atoms. The alkyl group having 5 or more carbon atoms has very high water repellency. The polymer that does not have an alkyl group having 5 or more carbon atoms provides less possibility to generate spot-like defects being referred to as Blob, which is generated due to excessively high water repellency of the surface of a photoresist film after development. As a result, patterns having less defects can be formed.

The polymer including repeating units represented by the general formula (1) or (2), which is added to a resist composition, preferably has a mass average molecular weight of 1,000 to 100,000, more preferably 3,000 to 30,000, but not limited thereto. The polymer having a mass average molecular weight of 1,000 or higher exhibits a sufficient barrier property against water and prevents photoresist components from leaching to water at the time of the liquid immersion exposure. And the polymer having a mass average molecular weight of 10,000 or less is dissolved in an alkaline developer at sufficiently high rate, whereby when a photoresist film containing the polymer is used to conduct patterning, there is less possibility that residue of the resin adheres to a substrate.

Furthermore, the repeating units (a-1), (b-1), (b-2), and (b-3) in the general formula (1) preferably satisfy the relationship $0.1 \leq (a-1)+(b-1)+(b-2)+(b-3) \leq 1$. And the repeating units (a-2), (b-1), (b-2), and (b-3) in the general formula (2) preferably satisfy the relationship $0.1 \leq (a-2)+(b-1)+(b-2)+(b-3) \leq 1$.

The polymer including repeating units represented by the general formula (1) or (2) may be added to a resist composition as a single polymer, or as a mixture containing two or more polymers with arbitrary proportions.

Preferred blending ratio of the polymer to a resist composition is: the total mass of the polymer to be added to 100 parts by mass of a base resin of a resist composition is 0.1 to 50 parts by mass, and more preferably 0.5 to 10 parts by mass. The blending ratio of 0.1 or more parts by mass sufficiently increases the receding contact angle between the surface of a photoresist film and water. When the blending ratio is 50 or less parts by mass, photoresist films to be formed has a small rate of dissolution in alkaline developers enough to keep sufficient height of a micropattern to be formed.

Furthermore, the resist composition is preferably a chemically amplified positive resist composition. And also, the resist composition preferably comprises a base resin including at least a repeating unit having an acid labile group, and a repeating unit having an adhesion group of a hydroxy group and/or a lactone ring.

Such a chemically amplified positive resist composition realizes high adhesion with a substrate by the base resin including a repeating unit having an adhesion group of a hydroxy group and/or a lactone ring. Furthermore, when the base resin includes a repeating unit having an acid labile group, an acid generated from an acid generator upon exposure to radiation cleaves the acid labile group to change an exposed area of the resist to be soluble in a developer. Thus, the chemically amplified positive resist composition provides a pattern with extremely high precision.

Examples of the base resin may include polymers that are represented by the following formulae (R1) and/or (R2) and have a mass average molecular weight of 1,000 to 100,000, and more preferably 3,000 to 30,000. However, the base resin is not limited thereto.

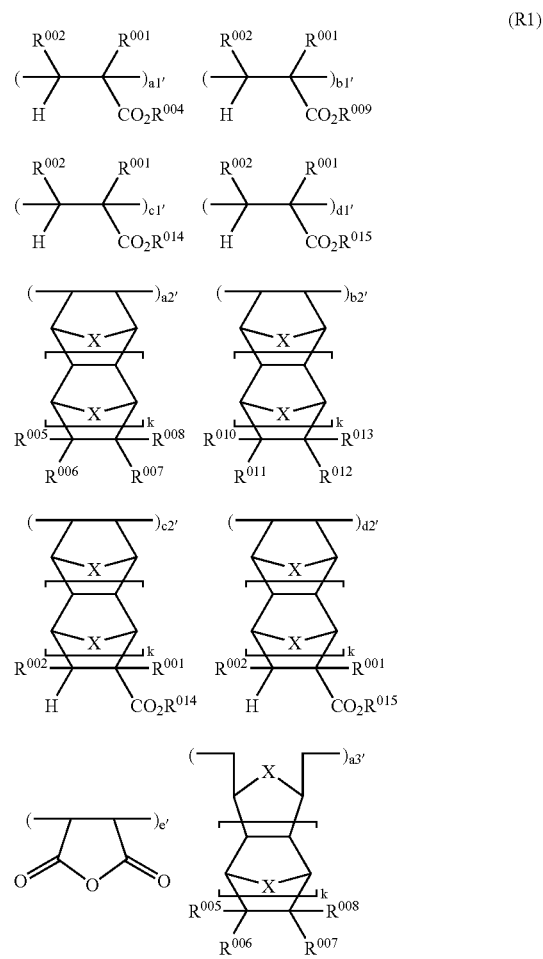

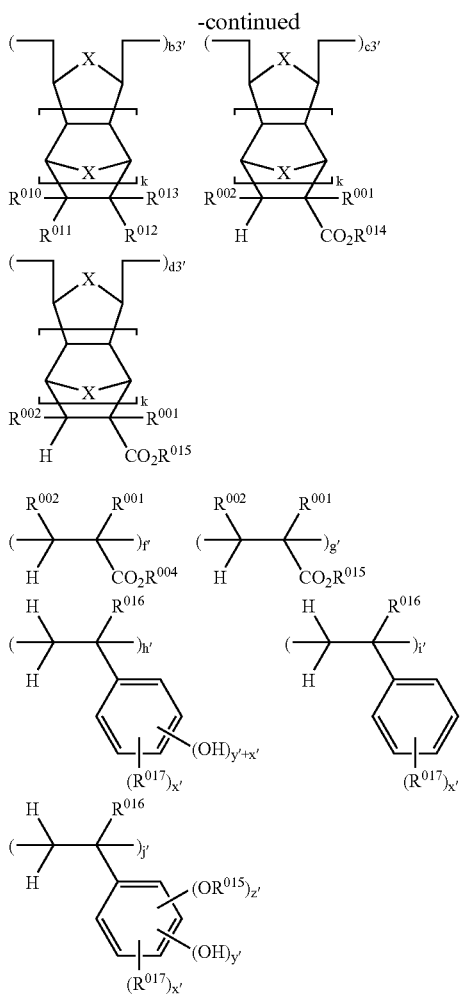

In the formulae, $R^{001}$ represents a hydrogen atom, a methyl group, or $-CH_2CO_2R^{003}$.

$R^{002}$ represents a hydrogen atom, a methyl group, or $-CO_2R^{003}$.

$R^{003}$ represents a linear, branched, or cyclic alkyl group having 1-15 carbon atoms. Examples thereof may include: a methyl group, an ethyl group, a propyl group, an isopropyl group, n-butyl group, sec-butyl group, tert-butyl group, tert-amyl group, n-pentyl group, n-hexyl group, a cyclopentyl group, a cyclohexyl group, an ethyl cyclopentyl group, a butyl cyclopentyl group, an ethyl cyclohexyl group, a butyl cyclohexyl group, an adamantyl group, an ethyl adamantyl group, a butyl adamantyl group, and the like.

$R^{004}$ represents a hydrogen atom or a monovalent hydrocarbon group having 1-15 carbon atoms which contains a fluorine-containing substituent and/or a carboxy group or a hydroxy group. Examples thereof may include: a hydrogen atom, carboxy ethyl, carboxy butyl, carboxy cyclopentyl, carboxy cyclohexyl, carboxy norbornyl, carboxy adamantyl, hydroxy ethyl, hydroxy butyl, hydroxy cyclopentyl, hydroxy cyclohexyl, hydroxy norbornyl, hydroxy adamantyl, hydroxy hexafluoro isopropyl cyclohexyl, di(hydroxy hexafluoro isopropyl)cyclohexyl, and the like.

At least one of $R^{005}$-$R^{008}$ represents a monovalent hydrocarbon group having 1-15 carbon atoms which contains a fluorine-containing substituent and/or a carboxy group or a hydroxy group, and the remainder independently represents a hydrogen atom or a linear, branched, or cyclic alkyl group having 1-15 carbon atoms. Examples of the monovalent hydrocarbon group having 1-15 carbon atoms which contains a fluorine-containing substituent and/or a carboxy group or a hydroxy group may include: carboxy, carboxy methyl, carboxy ethyl, carboxy butyl, hydroxy methyl, hydroxy ethyl, hydroxy butyl, 2-carboxy ethoxy carbonyl, 4-carboxy butoxy carbonyl, 2-hydroxy ethoxy carbonyl, 4-hydroxy butoxy carbonyl, carboxy cyclopentyloxy carbonyl, carboxy cyclohexyloxy carbonyl, carboxy norbornyloxy carbonyl, carboxyl adamantyloxy carbonyl, hydroxy cyclopentyloxy carbonyl, hydroxy cyclohexyloxy carbonyl, hydroxy norbornyloxy carbonyl, hydroxy adamantyloxy carbonyl, hydroxy hexafluoro isopropyl cyclohexyloxy carbonyl, di(hydroxy hexafluoro isopropyl)cyclohexyloxy carbonyl, and the like.

Examples of the linear, branched, or cyclic alkyl group having 1-15 carbon atoms may include the examples described in $R^{003}$.

$R^{005}$-$R^{008}$ may bond to each other and form a ring. In the case of forming a ring, at least one of $R^{005}$-$R^{008}$ represents a divalent hydrocarbon group having carbon atoms 1-15 which contains a fluorine-containing substituent and/or a carboxy group or a hydroxy group, and the remainder independently represents a single bond or a linear, branched, or cyclic alkylene group having 1-15 carbon atoms. Examples of the divalent hydrocarbon group having 1-15 carbon atoms which contains a fluorine-containing substituent and/or a carboxy group or a hydroxy group may include groups in which a hydrogen atom is removed from the examples of the monovalent hydrocarbon group which contains a fluorine-containing substituent and/or a carboxy group or a hydroxy group. Examples of the linear, branched, or cyclic alkylene group having 1-15 carbon atoms may include groups in which a hydrogen atom is removed from the examples described in $R^{003}$.

$R^{009}$ represents a monovalent hydrocarbon group having 3-15 carbon atoms which contains $-CO_2-$ moiety. Examples thereof may include: 2-oxooxolane-3-yl, 4,4-dimethyl-2-oxooxolane-3-yl, 4-methyl-2-oxooxane-4-yl, 2-oxo-1,3-dioxolane-4-yl methyl, 5-methyl-2-oxooxolane-5-yl, and the like.

At least one of $R^{010}$-$R^{013}$ represents a monovalent hydrocarbon group having 2-15 carbon atoms which contains $-CO_2-$ moiety, and the remainder independently represents a hydrogen atom or a linear, branched, or cyclic alkyl group having 1-15 carbon atoms. Examples of the monovalent hydrocarbon group having 2-15 carbon atoms which contains $-CO_2-$ moiety may include: 2-oxo-oxolane-3-yloxy carbonyl, 4,4-dimethyl-2-oxo-oxolane-3-yloxy carbonyl, 4-methyl-2-oxo-oxane-4-yloxy carbonyl, 2-oxo-1,3-dioxolane-4-yl methyloxy carbonyl, 5-methyl-2-oxo-oxolane-5-yloxy carbonyl, and the like. Examples of the linear, branched, or cyclic alkyl group having 1-15 carbon atoms may include the examples described in $R^{003}$.

$R^{010}$-$R^{013}$ may bond to each other and form a ring. In the case of forming a ring, at least one of $R^{010}$-$R^{013}$ represents a divalent hydrocarbon group having 1-15 carbon atoms which contains $-CO_2-$ moiety, and the remainder independently represents a single bond or a linear, branched, or cyclic alkylene group having 1-15 carbon atoms. Examples of the divalent hydrocarbon group having 1-15 carbon atoms which contains $-CO_2-$ moiety may include: 1-oxo-2-oxapropane-1,3-diyl, 1,3-dioxo-2-oxapropane-1,3-diyl, 1-oxo-2-oxabutane-1,4-diyl, 1,3-dioxo-2-oxabutane-1,4-diyl, and the like, groups in which a hydrogen atom is removed from the examples of the monovalent hydrocarbon group which contains $-CO_2-$ moiety. Examples of the linear, branched, or cyclic alkylene group having 1-15 carbon atoms may include groups in which a hydrogen atom is removed from the examples described in $R^{O03}$.

$R^{O14}$ represents a polycyclic-hydrocarbon group having 7-15 carbon atoms or an alkyl group which contains a polycyclic-hydrocarbon group having 7-15 carbon atoms. Examples thereof may include: norbornyl, bicyclo[3.3.1] nonyl, tricyclo[5.2.1.0$^{2,6}$]decyl, adamantyl, ethyl adamantyl, butyl adamantyl, norbornyl methyl, adamantyl methyl and the like.

$R^{O15}$ represents an acid labile group, and examples thereof are described later.

X represents —CH$_2$ or an oxygen atom.

k represents 0 or 1.

Various kinds of acid labile groups may be used as $R^{O15}$, but examples of $R^{O15}$ may include groups represented by the following general formulae (L1)-(L4); tertiary alkyl groups having 4-20, preferably 4-15 carbon atoms; trialkylsilyl groups wherein each alkyl group has 1-6 carbon atoms; an oxoalkyl group having 4-20 carbon atoms, and the like.

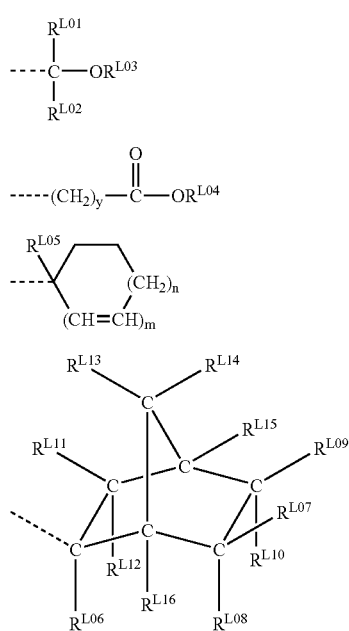

In the formulae, the broken lines denote bonds. $R^{L01}$ and $R^{L02}$ represent a hydrogen atom or a linear, branched or cyclic alkyl group having 1-18, preferably 1-10 carbon atoms. Examples thereof may include: a methyl group, an ethyl group, a propyl group, an isopropyl group, n-butyl group, sec-butyl group, tert-butyl group, a cyclopentyl group, a cyclohexyl group, 2-ethylhexyl group, n-octyl group, adamantyl group and the like. $R^{L03}$ represents a monovalent hydrocarbon group having 1-18, preferably 1-10 carbon atoms which may contain a hetero atom such as an oxygen atom and the like. Examples thereof may include: a linear, branched or cyclic alkyl group, and these alkyl groups in which a part of hydrogen atoms is substituted with a hydroxyl group, an alkoxy group, an oxo group, an amino group, an alkyl amino group, and the like. Examples of the linear, branched or cyclic alkyl group may include the same as the $R^{L01}$ and $R^{L02}$. Examples of the substituted alkyl groups may include the following groups and the like.

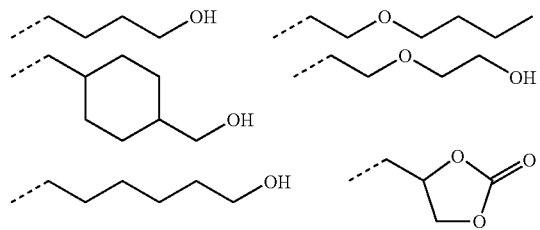

$R^{L01}$ and $R^{L02}$, $R^{L01}$ and $R^{L03}$, and $R^{L02}$ and $R^{L03}$ may bond to each other and form a ring with the carbon atom and/or the oxygen atom, which links with $R^{L01}$ and $R^{L02}$, or $R^{L03}$. In the case that the ring is formed, each of $R^{L01}$, $R^{L02}$ and $R^{L03}$ represents a linear or branched alkylene group having 1-18, preferably 1-10 carbon atoms.

$R^{L04}$ represents tertiary alkyl group having 4-20, preferably 4-15 carbon atoms, a trialkyl silyl group wherein each of the alkyl groups has 1-6 carbon atoms, an oxoalkyl group having 4-20 carbon atoms, or the group represented by the above-mentioned general formula (L1). Examples of the tertiary alkyl group may include: tert-butyl group, tert-amyl group, 1,1-diethyl propyl group, 2-cyclopentyl propane-2-yl group, 2-cyclohexyl propane-2-yl group, 2-(bicyclo[2.2.1] heptane-2-yl)propane-2-yl group, 2-(adamantane-1-yl)propane-2-yl group, 1-ethyl cyclopentyl group, 1-butylcyclopentyl group, 1-ethyl cyclohexyl group, 1-butylcyclohexyl group, 1-ethyl-2-cyclopentenyl group, 1-ethyl-2-cyclohexenyl group, 2-methyl-2-adamantyl group, 2-ethyl-2-adamantyl group, and the like. Examples of the trialkyl silyl group may include: a trimethylsilyl group, a triethylsilyl group, a dimethyl-tert-butylsilyl group, and the like. Examples of the oxo-alkyl group may include: 3-oxo-cyclohexyl group, 4-methyl-2-oxooxane-4-yl group, 5-methyl 2-oxooxolane-5-yl group, and the like. y is an integer of 0-6.

$R^{L05}$ represents a linear, branched or cyclic alkyl group having 1 to 10 carbon atoms that may optionally be substituted, or an aryl group having 6 to 20 carbon atoms that may optionally be substituted. Examples of the alkyl group that may optionally be substituted may include: a linear, branched or cyclic alkyl group such as a methyl group, an ethyl group, a propyl group, an isopropyl group, n-butyl group, sec-butyl group, tert-butyl group, tert-amyl group, n-pentyl group, n-hexyl group, a cyclopentyl group, a cyclohexyl group, bicyclo[2.2.1]heptyl group; and these groups in which a part of hydrogen atoms are substituted with a hydroxy group, an alkoxy group, a carboxy group, an alkoxy carbonyl group, an oxo group, an amino group, an alkyl amino group, a cyano group, a mercapto group, an alkylthio group, a sulfo group, or the like, or these groups where a part of methylene groups is substituted with an oxygen atom or a sulfur atom. Examples of the aryl group which may be substituted may include: a phenyl group, a methyl phenyl group, a naphthyl group, an anthryl group, a phenanthryl group, a pyrenyl group, and the like. In the formula (L3), m is 0 or 1, and n is 0, 1, 2, or 3, and m and n satisfy the formula: 2m+n=2 or 3.

$R^{L06}$ represents a linear, branched or cyclic alkyl group having 1 to 10 carbon atoms that may optionally be substituted, or an aryl group having 6 to 20 carbon atoms that may optionally be substituted. Examples thereof may include the same groups as $R^{L05}$ and the like.

$R^{L07}$ to $R^{L16}$ independently represent a hydrogen atom or a monovalent hydrocarbon group having 1-15 carbon atoms. Examples thereof may include: a linear, branched or cyclic alkyl group such as a methyl group, an ethyl group, a propyl group, an isopropyl group, n-butyl group, sec-butyl group, tert-butyl group, tert-amyl group, n-pentyl group, n-hexyl group, n-octyl group, n-nonyl group, n-decyl group, a cyclopentyl group, a cyclohexyl group, a cyclopentyl methyl group, a cyclopentyl ethyl group, cyclopentyl butyl group, a cyclohexyl methyl group, a cyclohexyl ethyl group, a cyclohexyl butyl group and the like; and these groups in which a part of hydrogen atoms are substituted with a hydroxy group, an alkoxy group, a carboxy group, an alkoxy carbonyl group, an oxo group, an amino group, an alkyl amino group, a cyano group, a mercapto group, an alkylthio group, a sulfo group, and the like. $R^{L07}$ to $R^{L16}$ may bond to each other, and form a ring (for example, $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, $R^{L13}$ and $R^{L14}$ and the like). In the case of forming a ring, they represent a divalent hydrocarbon group having 1-15 carbon atoms and examples thereof may include those groups in which a hydrogen atom is removed from the examples of a monovalent hydrocarbon group described above. Moreover, the groups among $R^{L07}$ to $R^{L16}$ that bonds to a carbon atom may bond to each other without any groups therebetween, and form a double bond (for example, $R^{L07}$ and $R^{L09}$, $R^{L09}$ and $R^{L15}$, $R^{L13}$ and $R^{L15}$ and the like).

Examples of the linear or branched group among the acid labile groups represented by the above-mentioned formula (L1) may include the following groups.

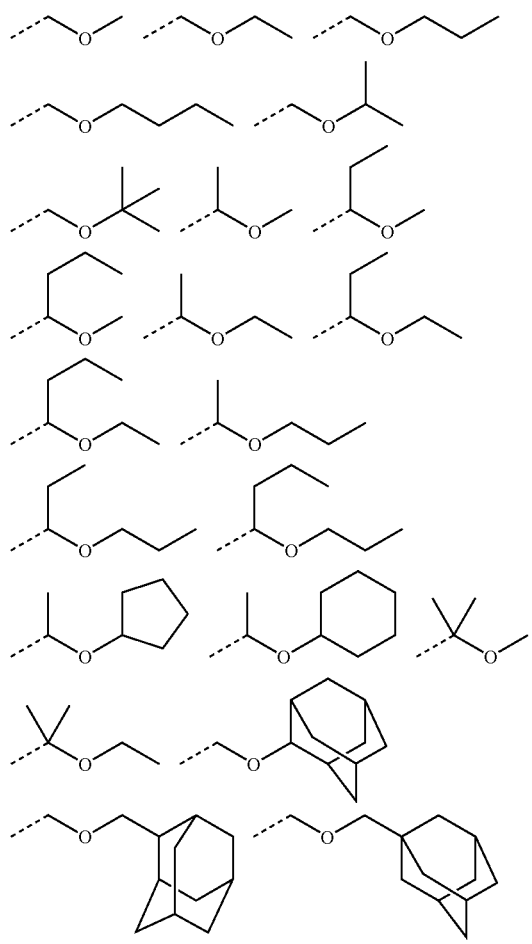

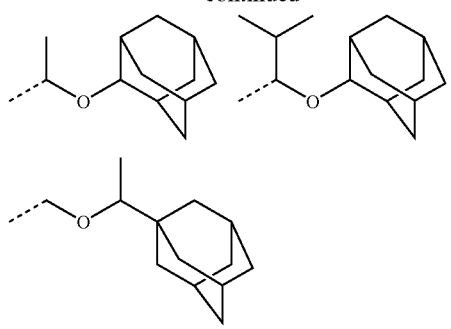

Examples of the cyclic group among the acid labile groups represented by the above-mentioned formula (L1) may include: a tetrahydrofuran-2-yl group, 2-methyl tetrahydrofuran-2-yl group, tetrahydropyran-2-yl group, 2-methyl tetrahydropyran-2-yl group, and the like.

Examples of the acid labile group represented by the above-mentioned formula (L2) may include: tert-butoxy carbonyl group, tert-butoxy carbonyl methyl group, tert-amyloxy carbonyl group, tert-amyloxy carbonyl methyl group, 1,1-diethyl propyl oxy-carbonyl group, 1,1-diethyl propyloxy carbonyl methyl group, 1-ethylcyclopentyl oxy-carbonyl group, 1-ethylcyclopentyloxy-carbonyl methyl group, 1-ethyl-2-cyclopentenyloxy-carbonyl group, 1-ethyl-2-cyclopentenyloxy-carbonyl methyl group, 1-ethoxy ethoxy carbonyl methyl group, 2-tetrahydro pyranyl oxy-carbonyl methyl group, 2-tetrahydrofuranyl oxy-carbonyl methyl group, and the like.

Examples of the acid labile group represented by the above-mentioned formula (L3) may include: 1-methyl cyclopentyl, 1-ethyl cyclopentyl, 1-n-propyl cyclopentyl, 1-isopropyl cyclopentyl, 1-n-butylcyclopentyl, 1-sec-butylcyclopentyl, 1-cyclohexyl cyclopentyl, 1-(4-methoxy-n-butyl) cyclopentyl, 1-(bicyclo[2.2.1]heptane-2-yl)cyclopentyl, 1-(7-oxabicyclo[2.2.1]heptane-2-yl)cyclopentyl, 1-methyl cyclohexyl, 1-ethyl cyclohexyl, 3-methyl-1-cyclopentene-3-yl, 3-ethyl-1-cyclopentene-3-yl, 3-methyl-1-cyclohexene-3-yl, 3-ethyl-1-cyclohexene-3-yl, and the like.

Most preferred examples of the acid labile group of the above-mentioned formula (L4) are groups represented by the following formulae (L4-1) to (L4-4).

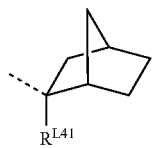
(L4-1)

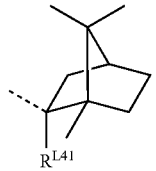
(L4-2)

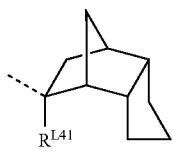
(L4-3)

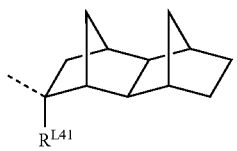
(L4-4)

In the general formulae (L4-1) to (L4-4), the broken lines denote bonding positions and bonding directions. $R^{L41}$ independently represents a monovalent hydrocarbon group such as a linear, branched or cyclic alkyl group having 1-10 carbon atoms. Examples thereof may include a methyl group, an ethyl group, a propyl group, an isopropyl group, n-butyl group, sec-butyl group, tert-butyl group, tert-amyl group, n-pentyl group, n-hexyl group, a cyclopentyl group, a cyclohexyl group, and the like.

The general formulae (L4-1) to (L4-4) can have enantiomers or diastereomers, but the general formulae (L4-1) to (L4-4) are intended to denote all the stereoisomers thereof. Such stereoisomers may be used alone, or as a mixture thereof.

For example, the general formula (L4-3) is intended to represent one or a mixture of two selected from the following formulae (L4-3-1) and (L4-3-2).

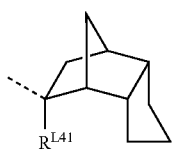
(L4-3-1)

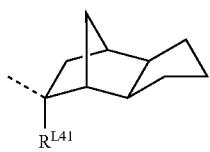
(L4-3-2)

In the formulae, $R^{L41}$ represents the same as above.

Furthermore, the general formula (L4-4) is intended to represent one or a mixture of two or more selected from the following formulae (L4-4-1) to (L4-4-4).

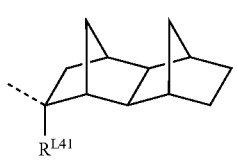
(L4-4-1)

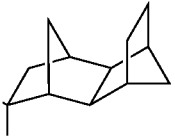
(L4-4-2)

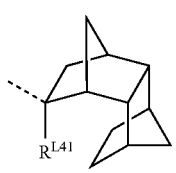
(L4-4-3)

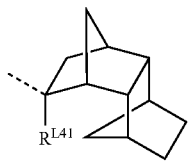
(L4-4-4)

In the formulae, $R^{L41}$ represents the same as above.

The general formulae (L4-1) to (L4-4), (L4-3-1), (L4-3-2), and (L4-4-1) to (L4-4-4) are intended to also represent their enantiomers and mixtures of the enantiomers.

Incidentally, the bonding directions in the general formulae (L4-1) to (L4-4), (L4-3-1), (L4-3-2), and (L4-4-1) to (L4-4-4) are on the exo side relative to bicyclo[2,2,1]heptane ring, and which realizes high reactivity in the elimination reaction with an acid catalyst (See Japanese Publication of Unexamined Application No. 2000-336121). In manufacturing monomers having the bicyclo[2,2,1]heptane structure and having a tertiary exo-alkyl group as a substituent, monomers substituted with endo-alkyl groups represented by the following general formulae (L4-1-endo) to (L4-4-endo) can be contained. In order to realize good reactivity, exo ratio is preferably 50% or more, and more preferably 80% or more.

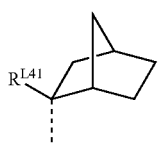
(L4-1-endo)

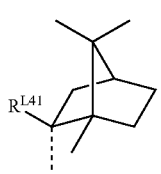
(L4-2-endo)

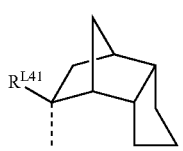
(L4-3-endo)

-continued

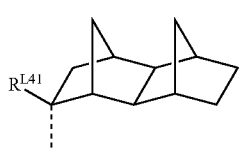
(L4-4-endo)

In the formulae, $R^{L41}$ represents the same as above.

Examples of the acid labile groups of the formula (L4) may include the following groups.

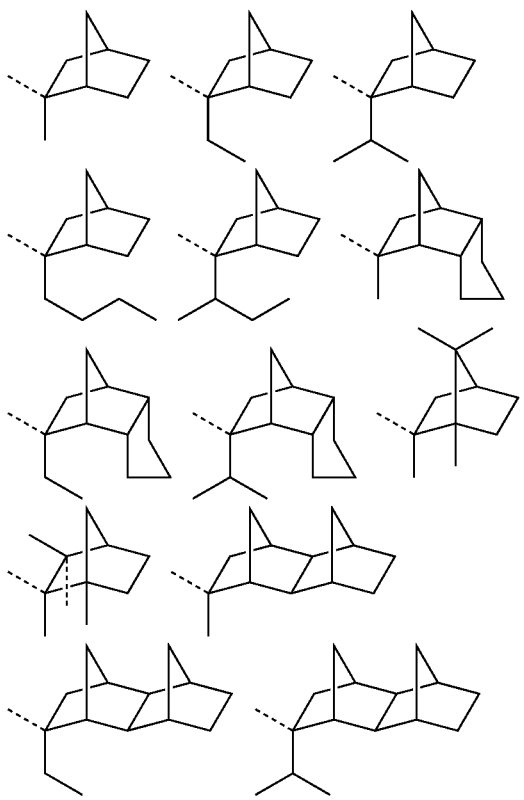

Furthermore, examples of the tertiary alkyl groups having 4-20 carbon atoms; the trialkylsilyl groups wherein each alkyl group has 1-6 carbon atoms; and the oxoalkyl group having 4-20 carbon atoms may include the same examples described for $R^{L04}$.

In (R2), $R^{O16}$ represents a hydrogen atom or a methyl group. $R^{O17}$ represents a linear, branched or cyclic alkyl group having 1 to 8 carbon atoms.

In (R1), a1', a2', a3', b1', b2', b3', c1', c2', c3', d1', d2', d3', and e' are numbers in the range of 0 to less than 1, and satisfy the relationship a1'+a2'+a3'+b1'+b2'+b3'+c1'+c2'+c3'+d1'+d2'+d3'+e'=1. In (R2), f', g', h', i', and j' are numbers in the range of 0 to less than 1, and satisfy the relationship f'+g'+h'+i'+j'=1. x', y', and z' are integers of 0 to 3, and satisfy the relationship $1 \leq x'+y'+z' \leq 5$, and $1 \leq y'+z' \leq 3$.

Examples of repeating units with the composition ratio a1' in (R1) may include the following units. However, the repeating units are not limited thereto.

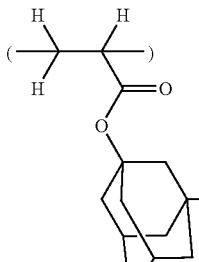
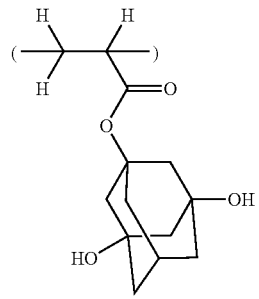
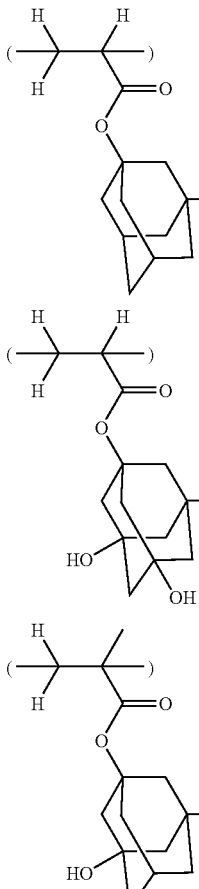
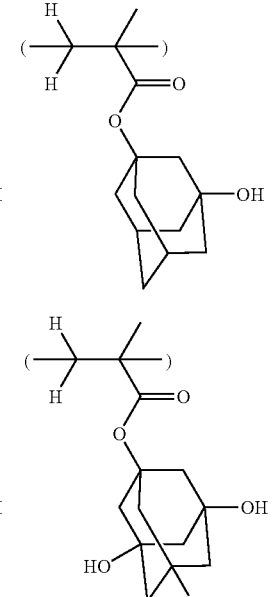
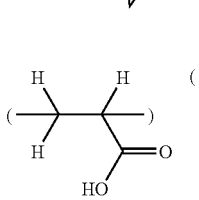
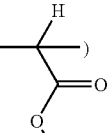
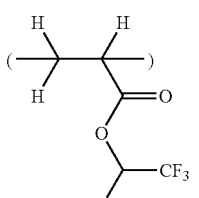
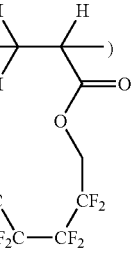
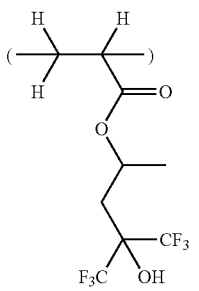
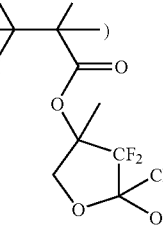

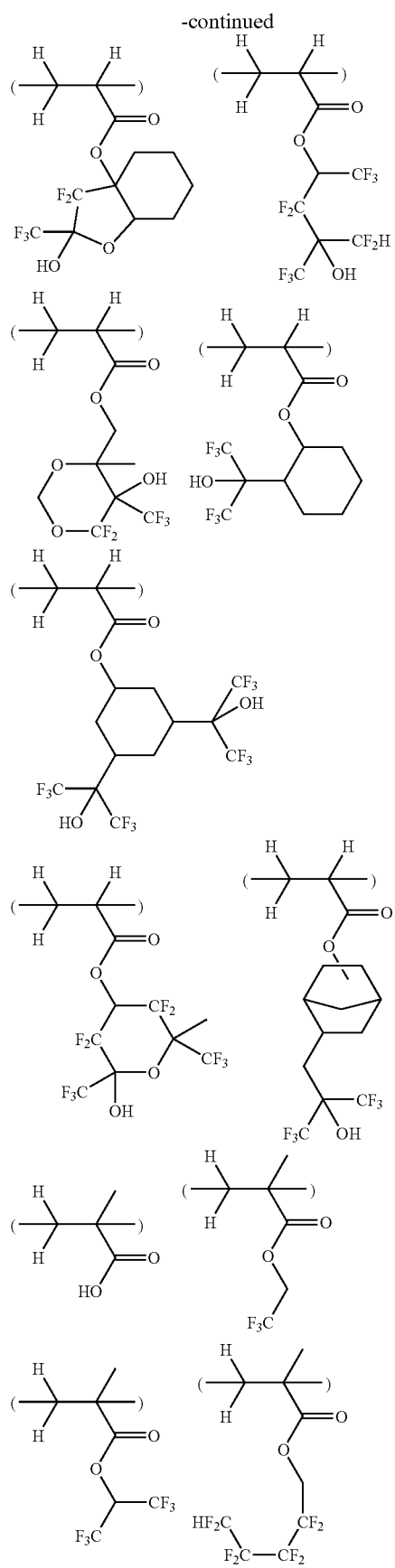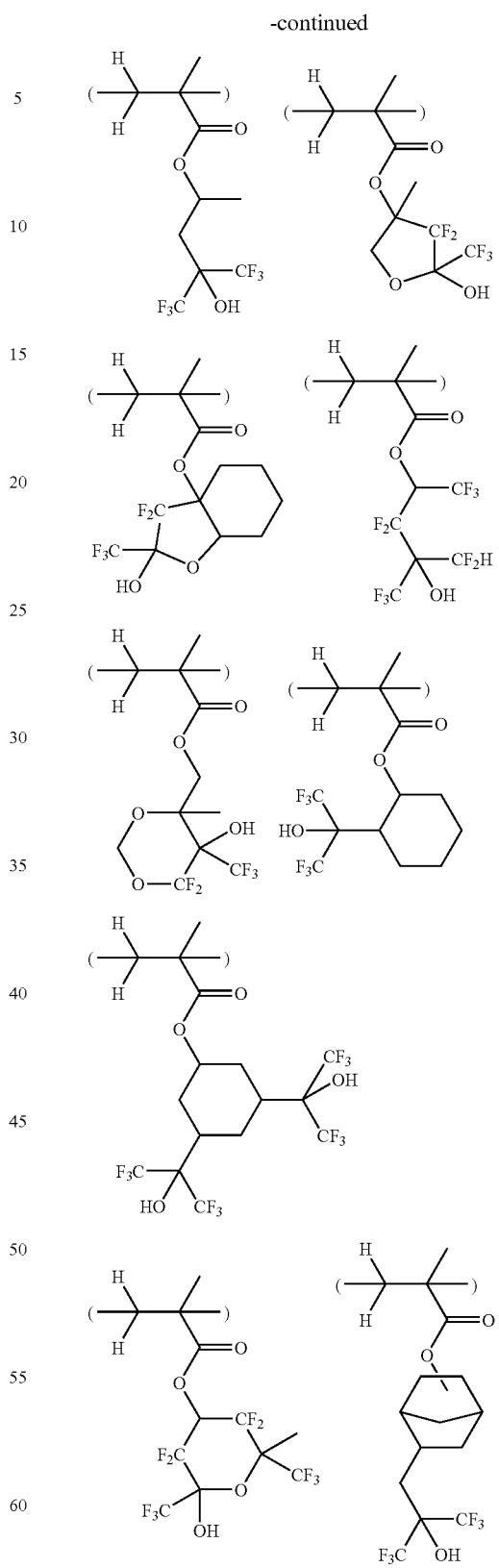
Examples of repeating units with the composition ratio b1' in (R1) may include the following units. However, the repeating units are not limited thereto.

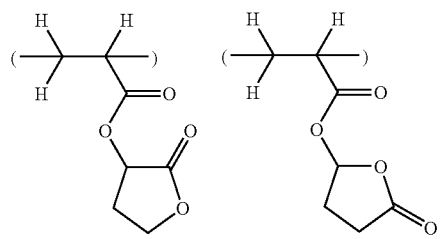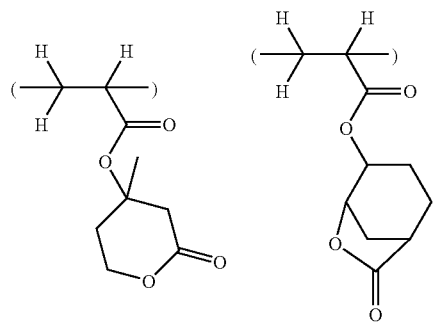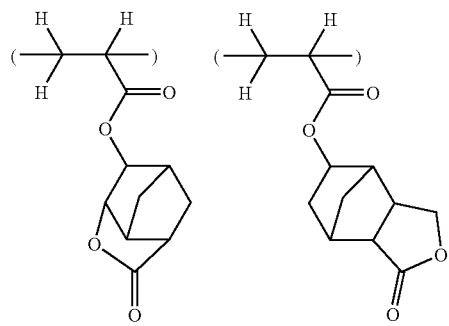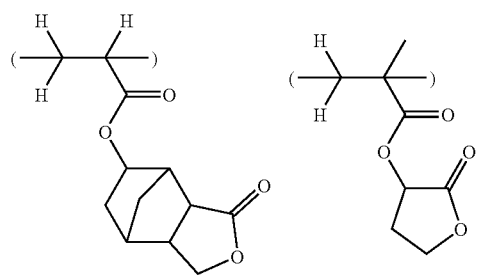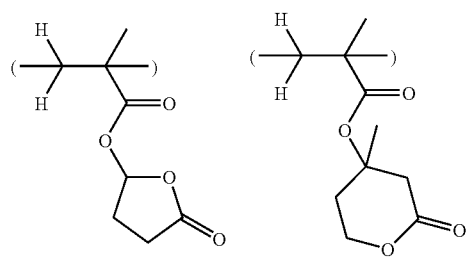
-continued
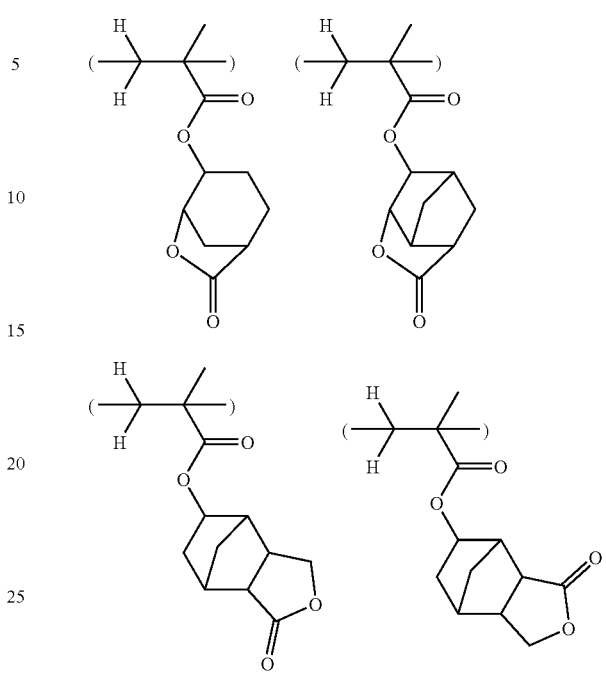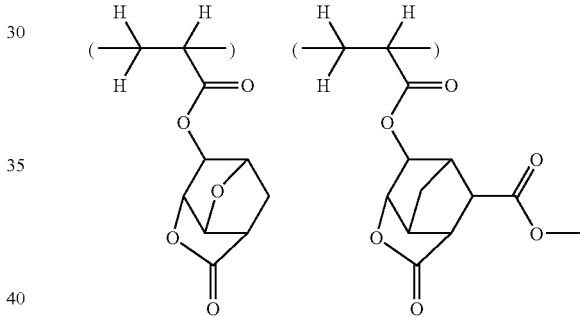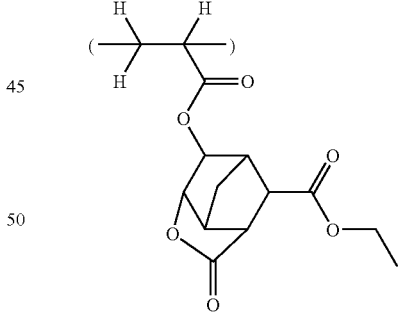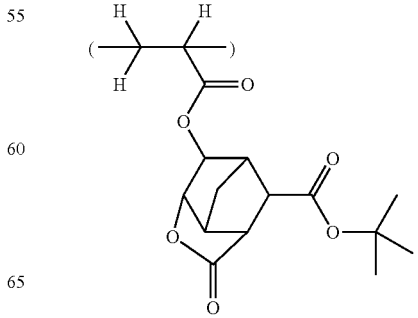

-continued
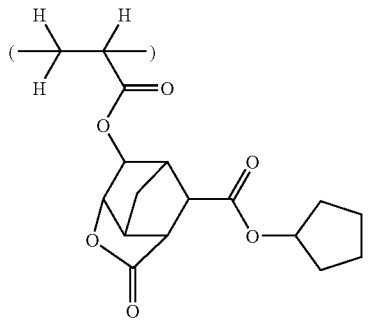
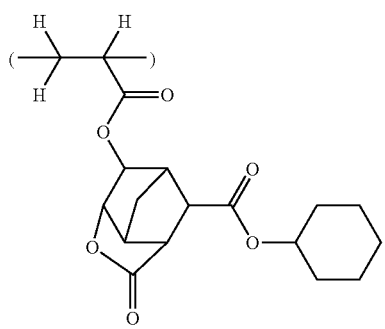
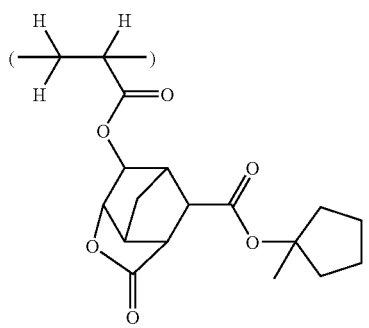
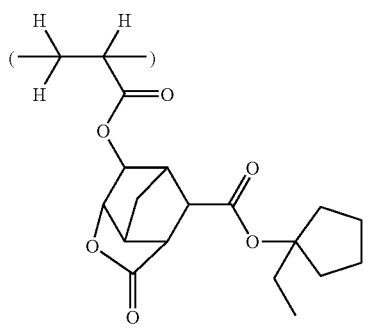
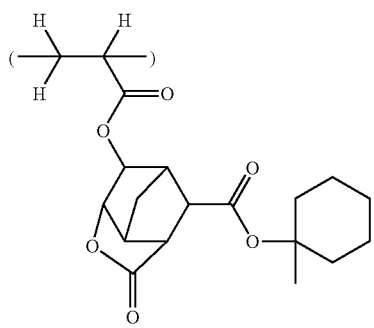
-continued
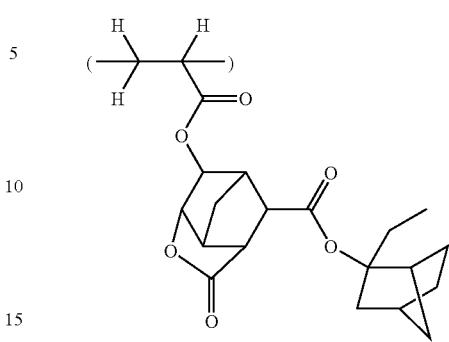
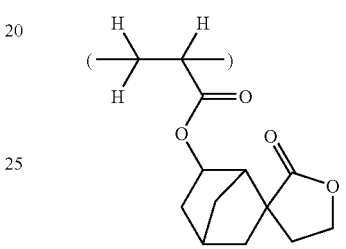
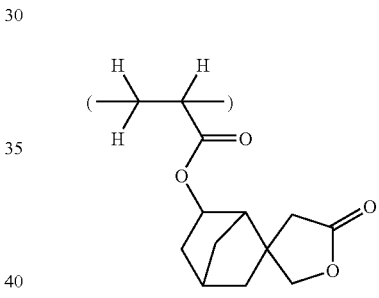
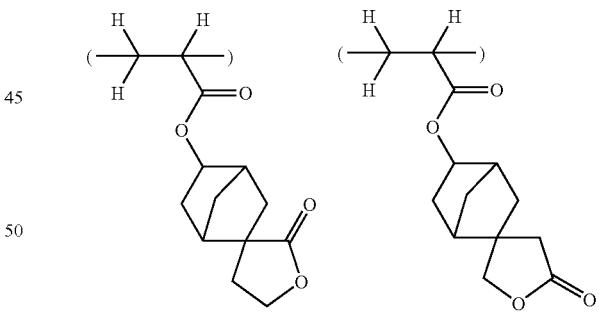
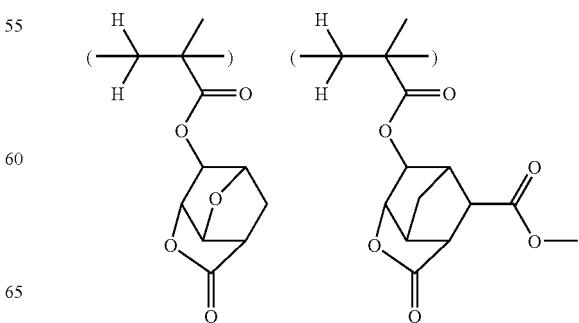

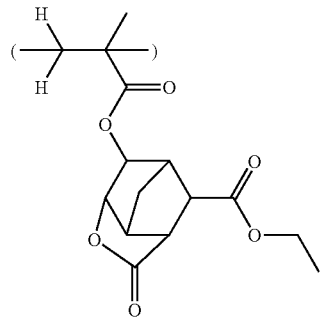
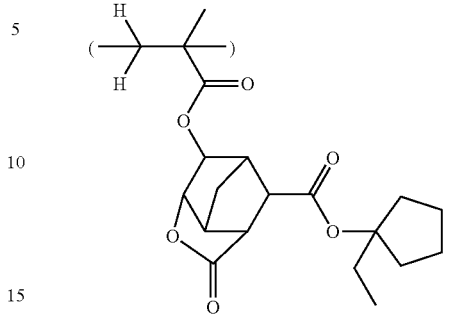
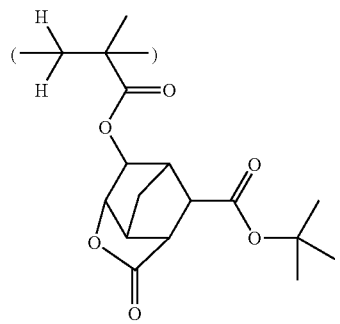
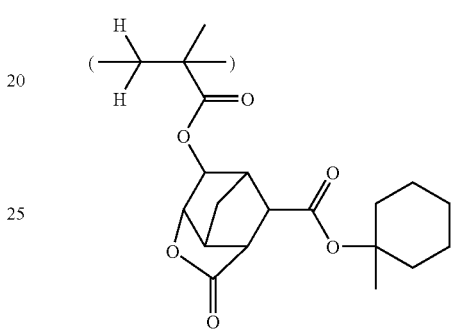
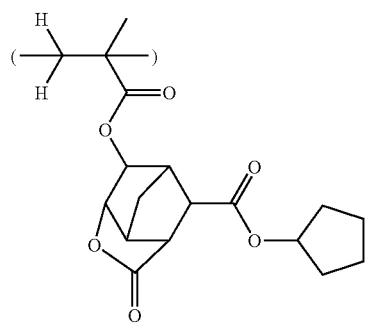
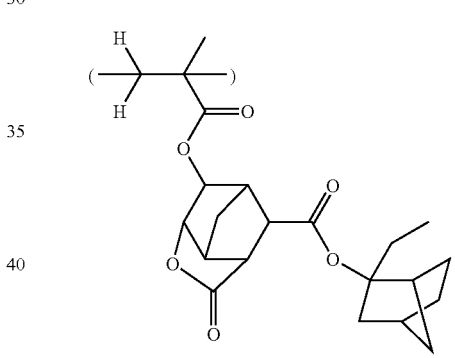
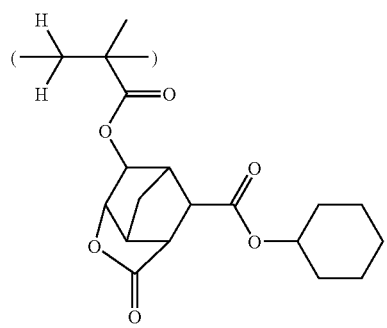
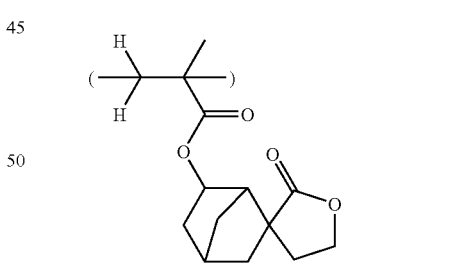
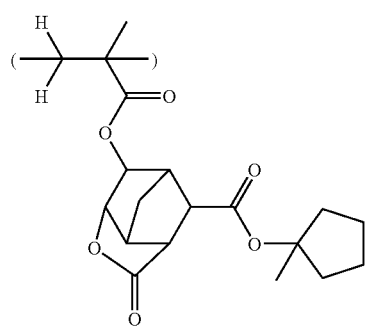
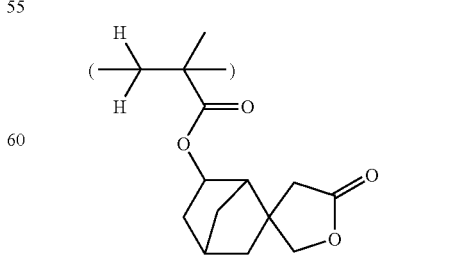

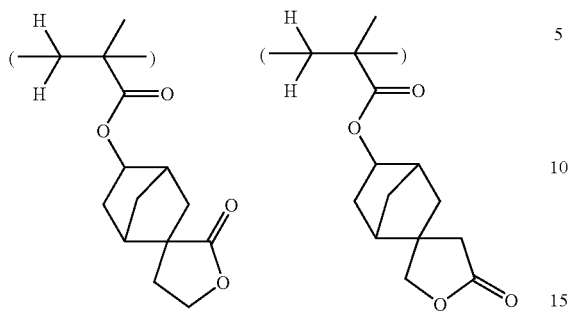
Examples of repeating units with the composition ratio d1' in (R1) may include the following units. However, the repeating units are not limited thereto.
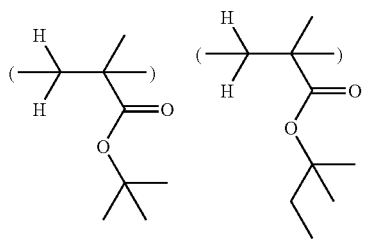
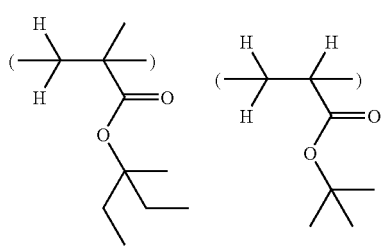
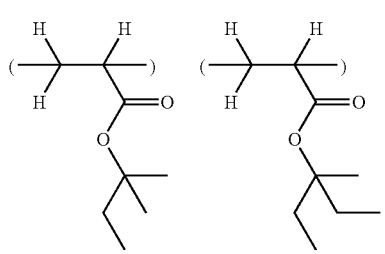
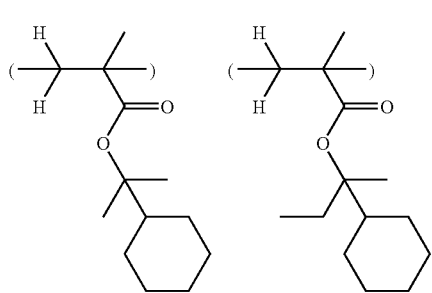
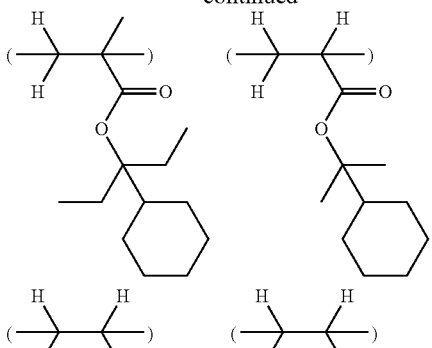
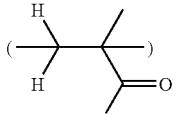 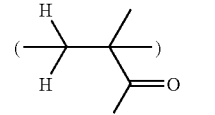
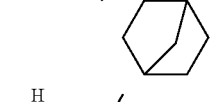 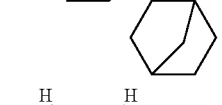
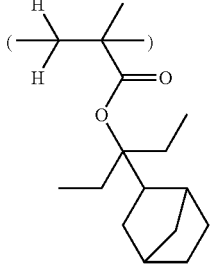 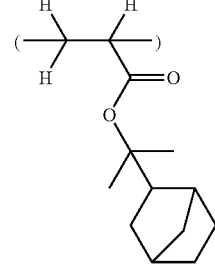
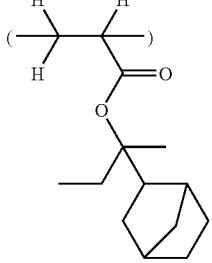 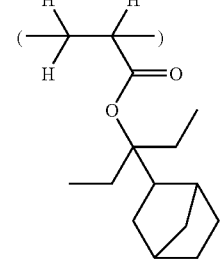
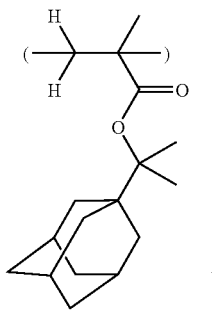 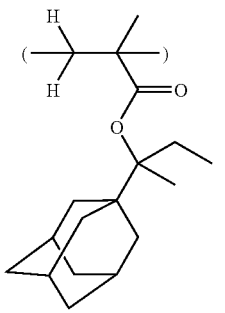

-continued
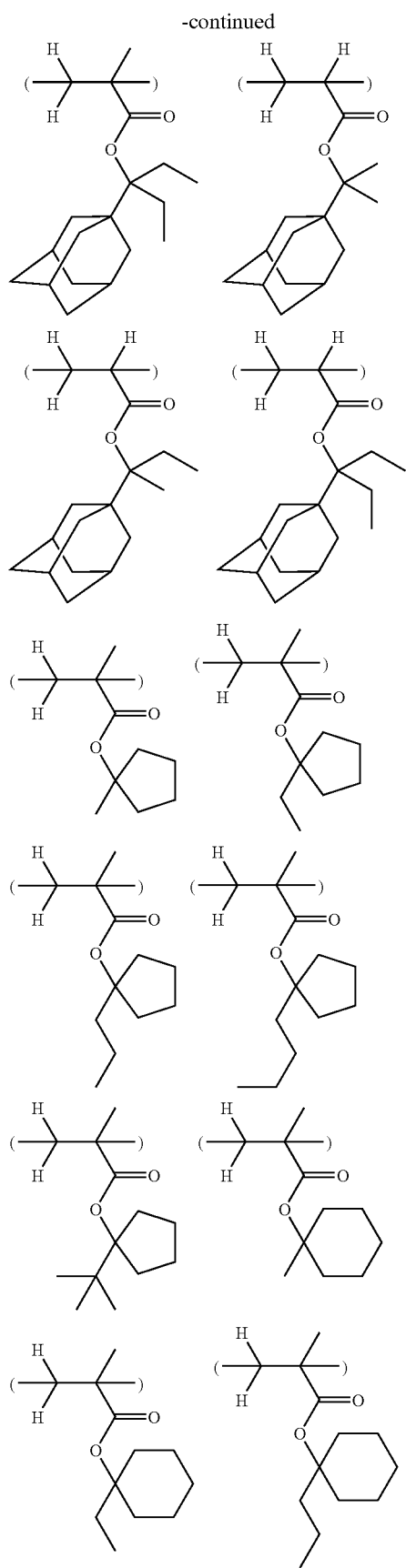
-continued
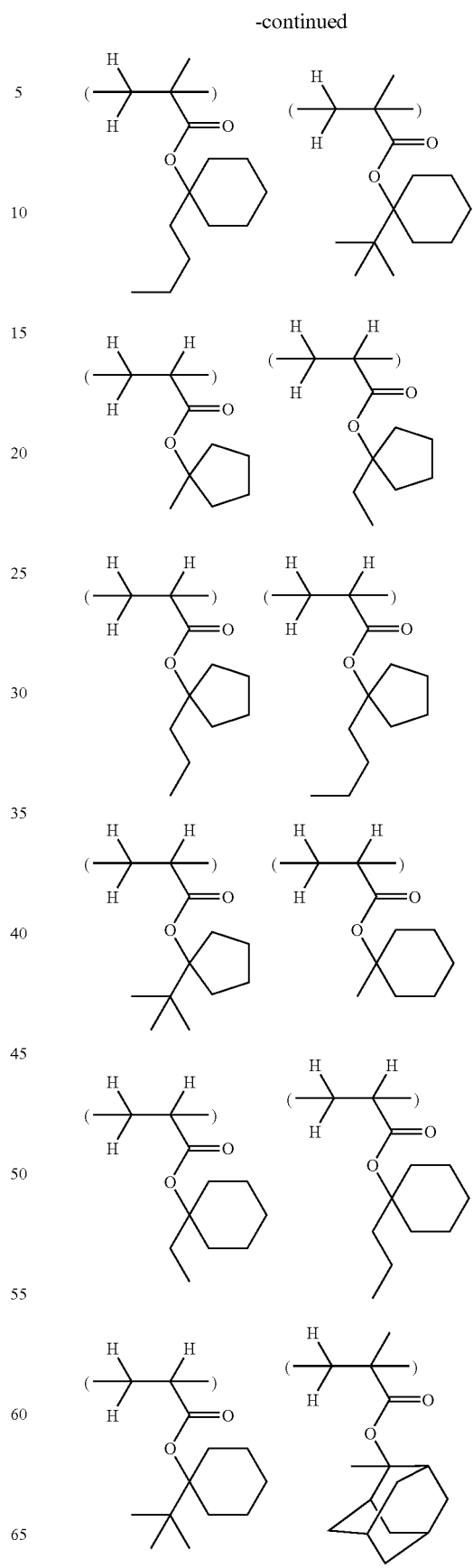

-continued
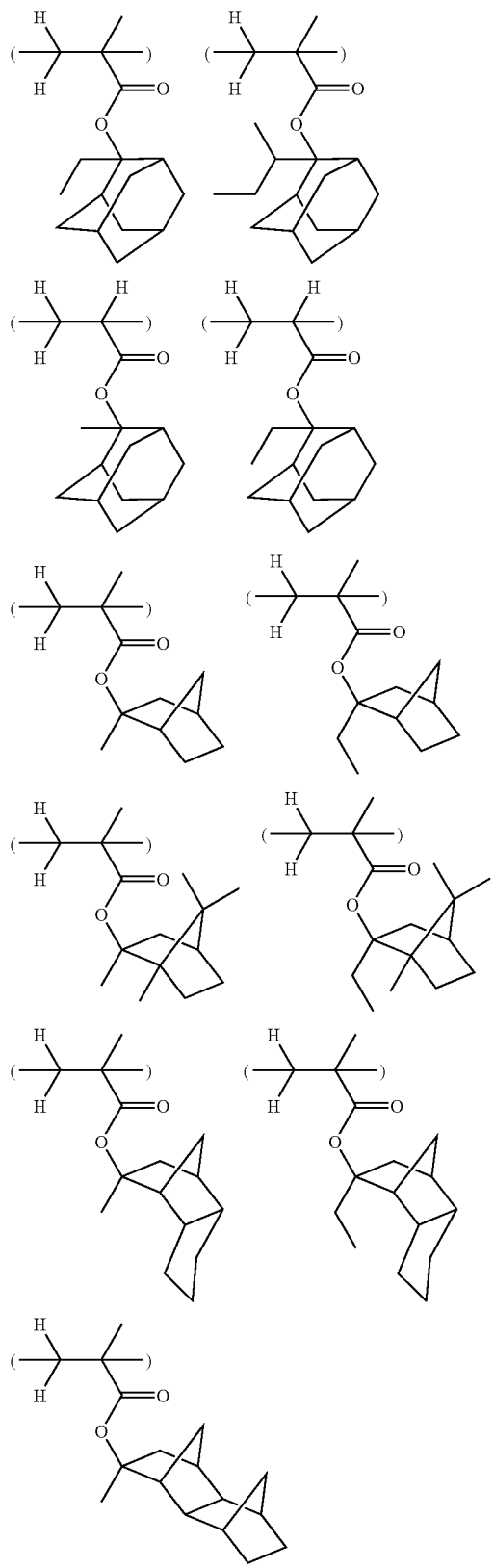
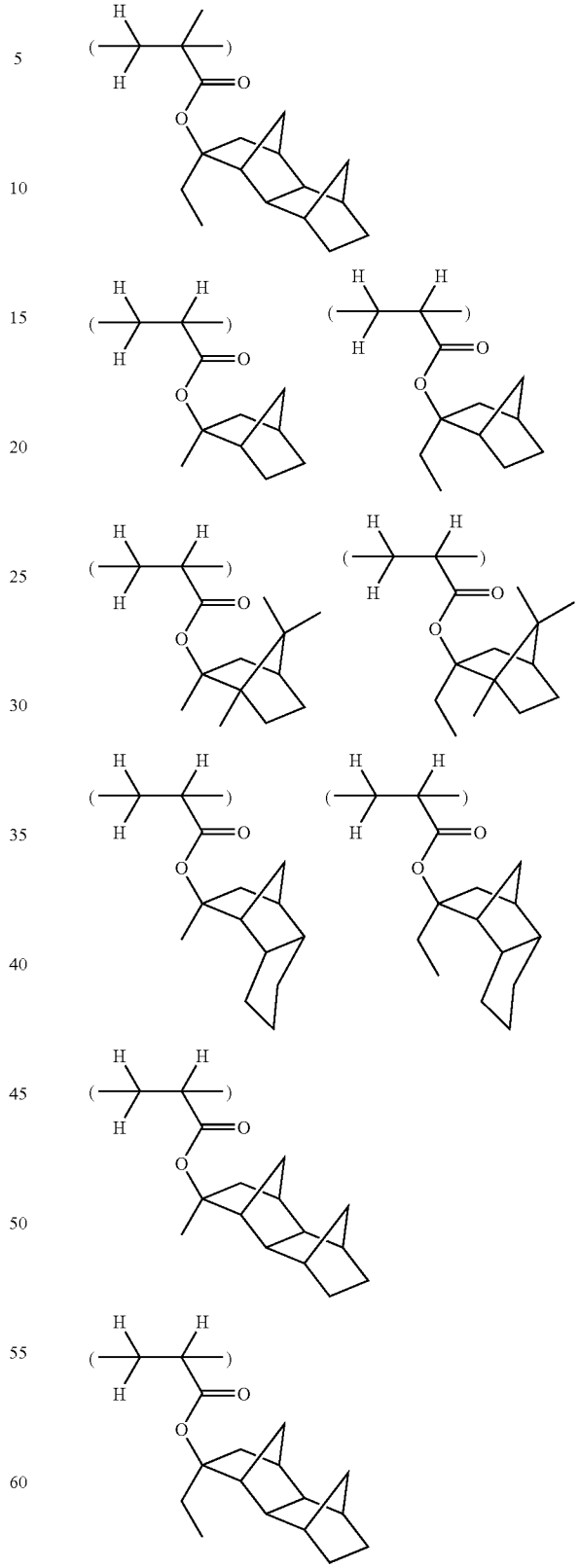

-continued
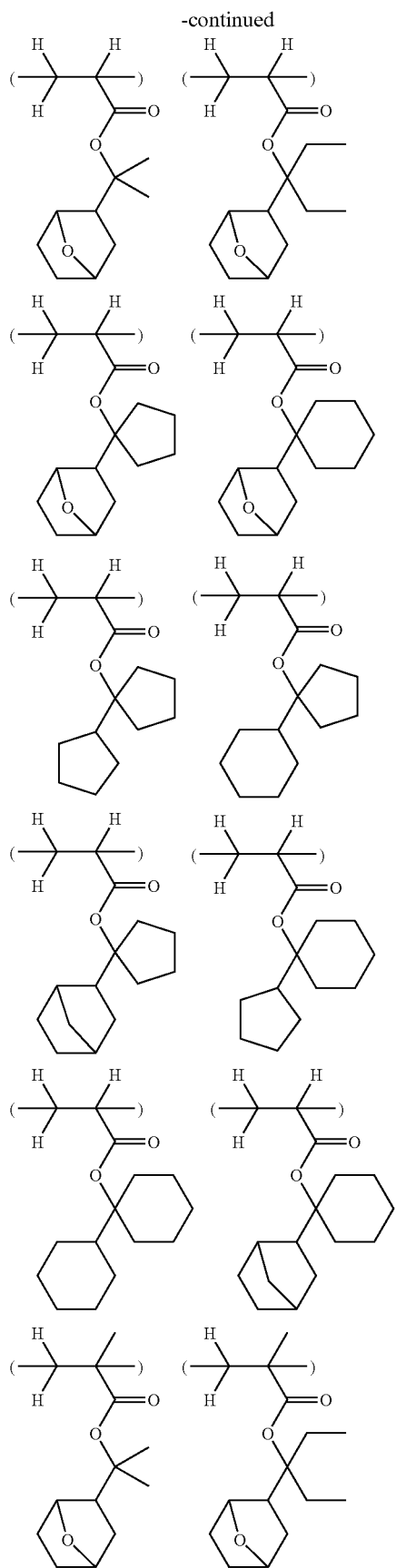
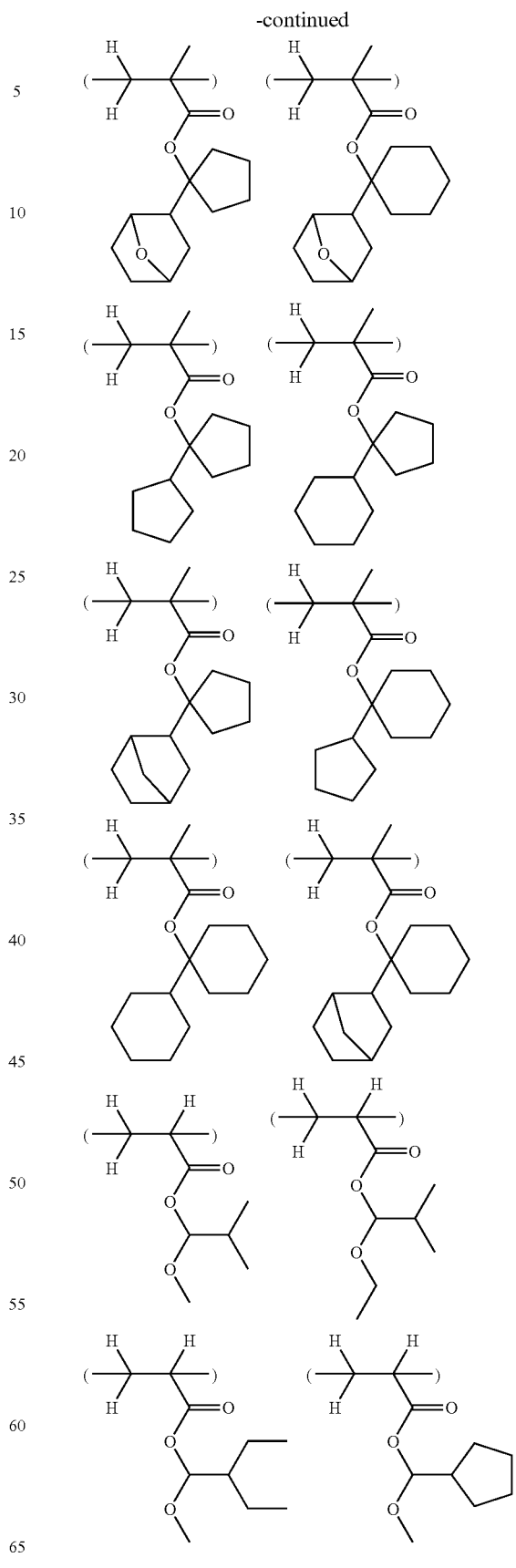

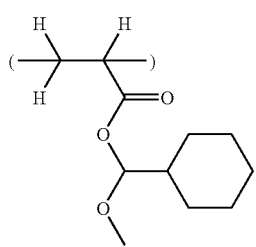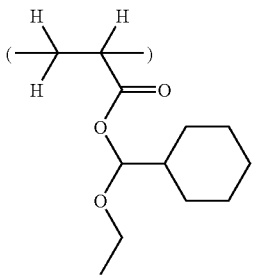
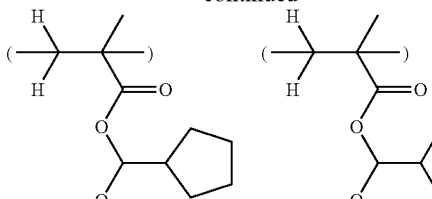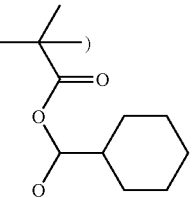
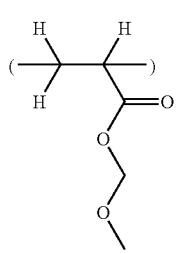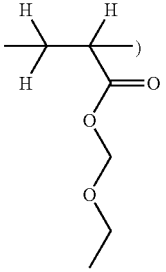
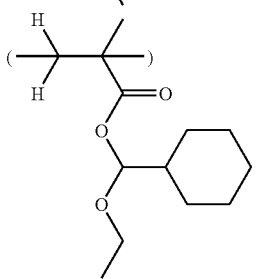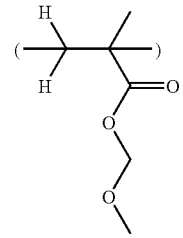
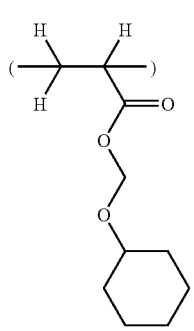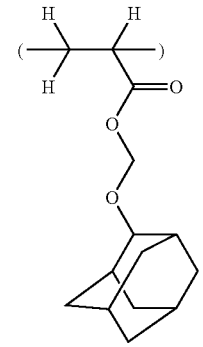
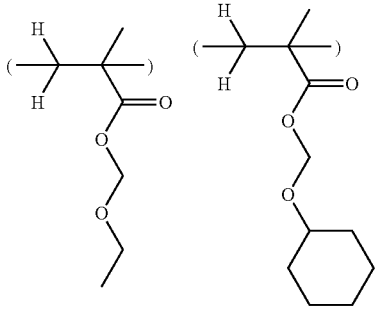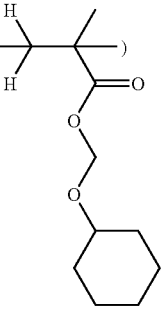
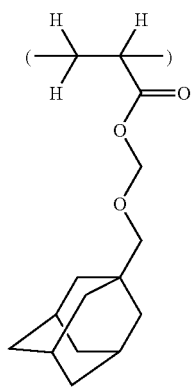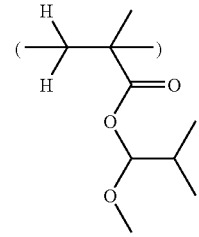
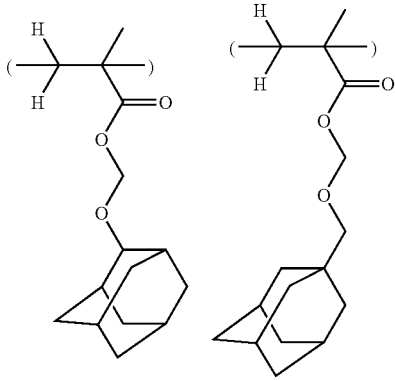
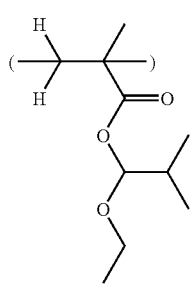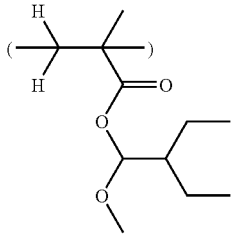
Examples of polymers having repeating units with the composition ratio of a3', b3', c3' and d3' in (R1) may include the following polymers, however, not limited thereto.
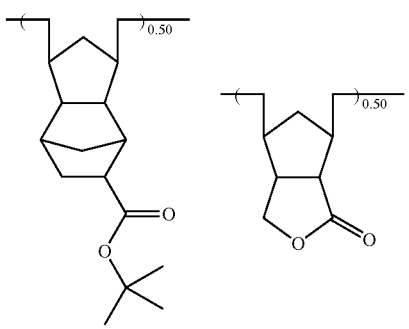

-continued
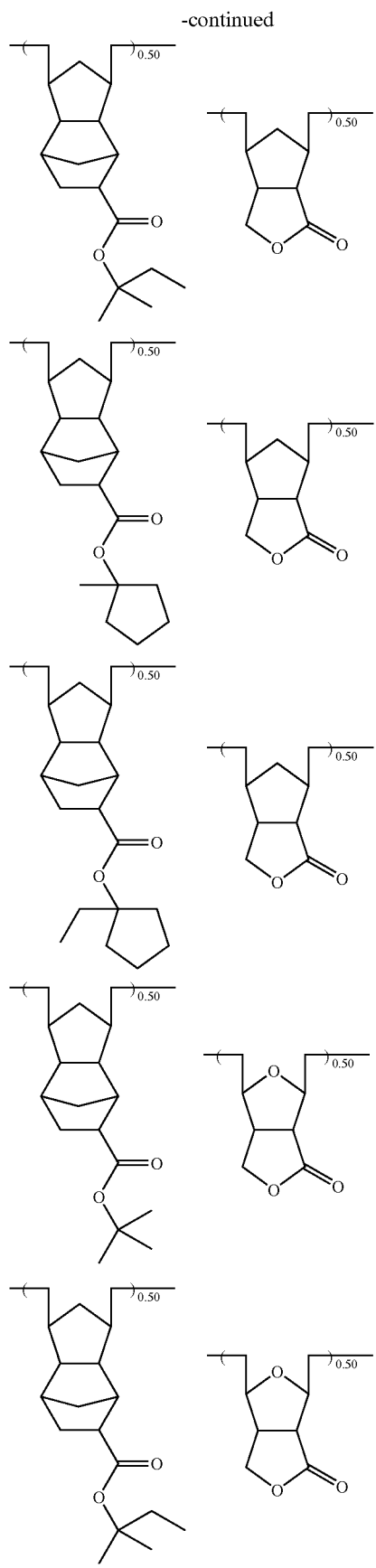
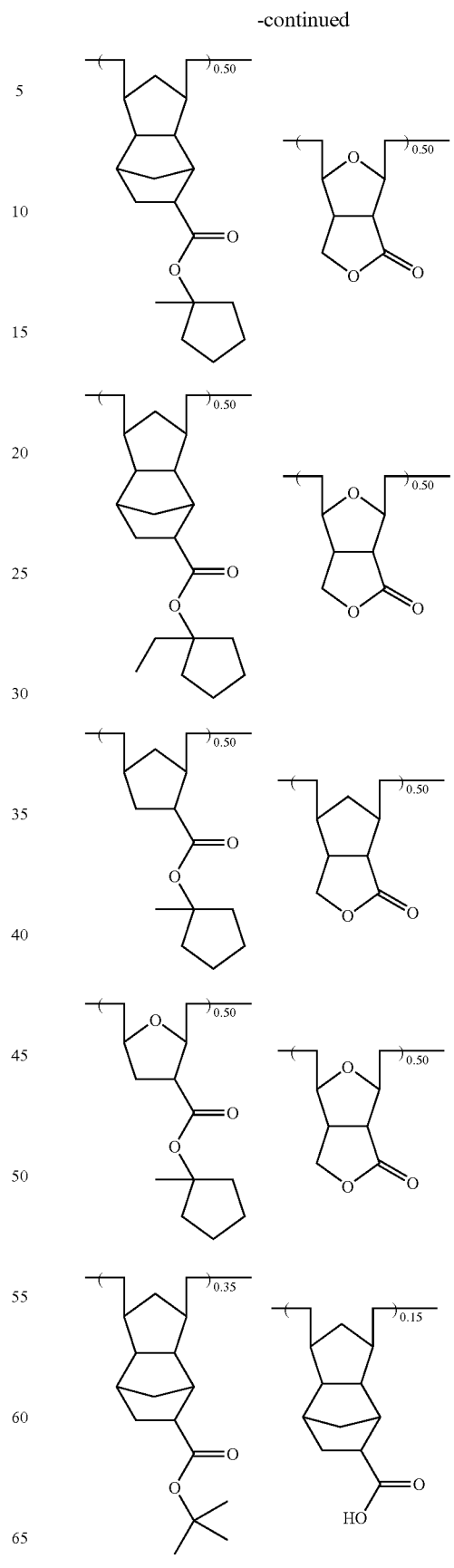

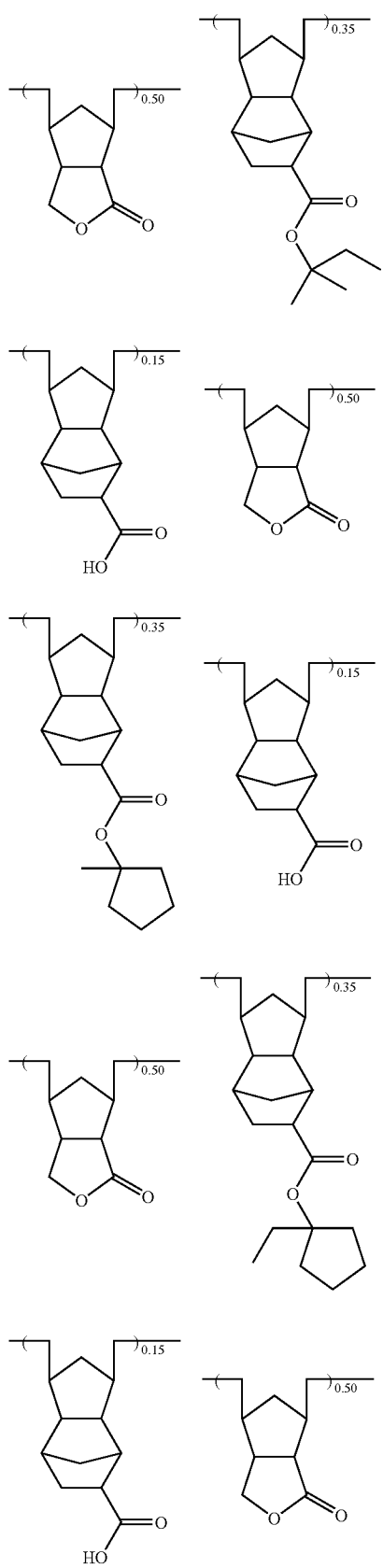
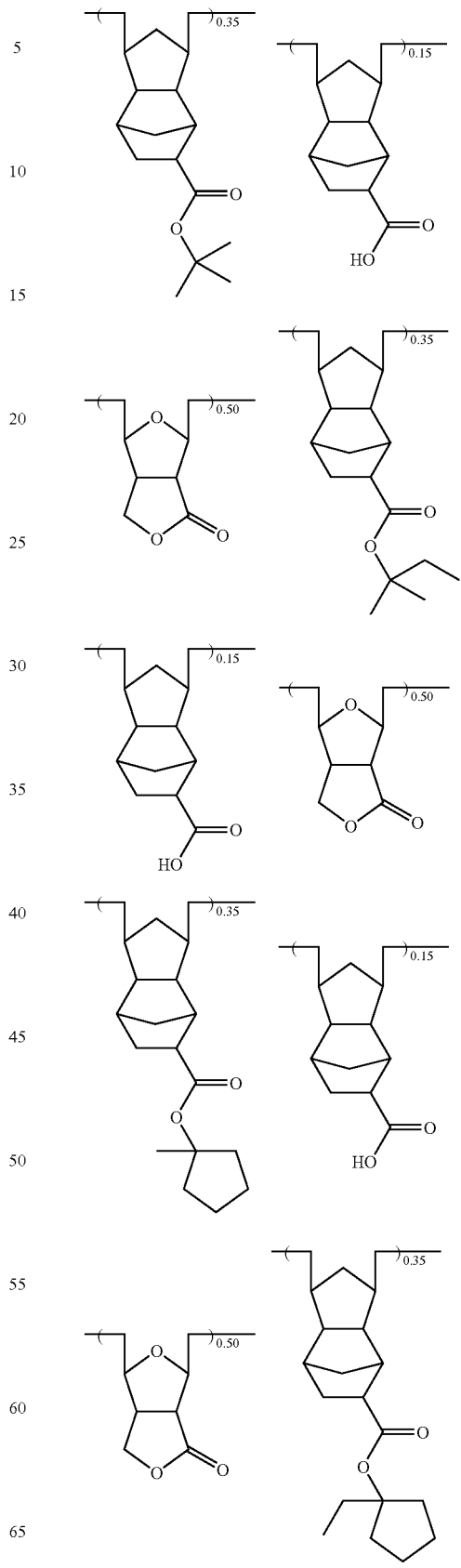

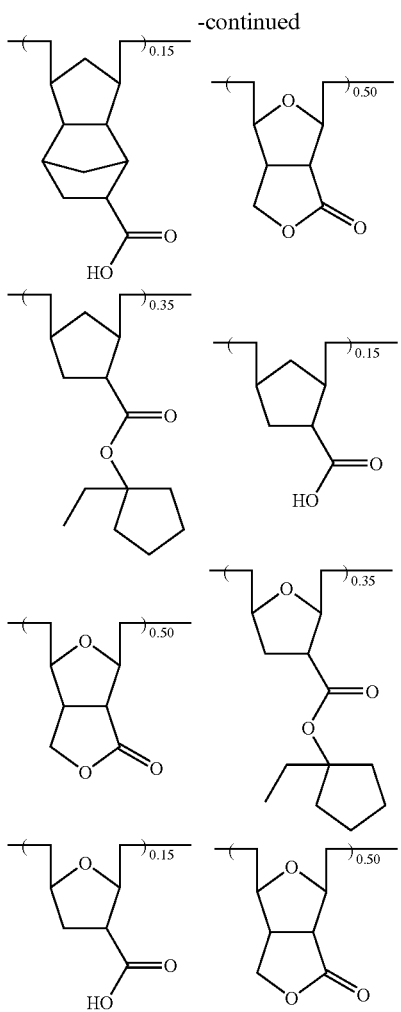

Incidentally, as a polymer that constitutes the base resin, not only a single polymer but also two or more polymers may be added. Use of plural polymers makes it possible to adjust the properties of a resist composition.

The resist composition according to the present invention may contain an acid generator to function as a chemically amplified positive resist composition. For example, the composition may contain compounds (photo acid generators) that generate acid upon exposure of an active beam or a radiation. As for components of the photo acid generators, any compounds that generate acid upon exposure to a high energy beam can be used. Preferred photo acid generators may include sulfonium salt, iodonium salt, sulfonyl diazomethane, N-sulfonyl oxyimide, oxime-O-sulfonate, and the like. Examples of the photo acid generators are shown below in detail, and they can be used alone or in admixture.

A sulfonium salt is a salt of sulfonium cation and sulfonate, bis(substituted alkyl sulfonyl)imide or tris(substituted alkyl sulfonyl)methide.

Examples of the sulfonium cation may include: triphenyl sulfonium, (4-tert-butoxy phenyl)diphenyl sulfonium, bis(4-tert-butoxy phenyl)phenyl sulfonium, tris(4-tert-butoxy phenyl)sulfonium, (3-tert-butoxy phenyl)diphenyl sulfonium, bis(3-tert-butoxy phenyl)phenyl sulfonium, tris(3-tert-butoxy phenyl)sulfonium, (3,4-ditert-butoxy phenyl)diphenyl sulfonium, bis(3,4-ditert-butoxy phenyl)phenyl sulfonium, tris(3,4-ditert-butoxy phenyl)sulfonium, diphenyl(4-thiophenoxy phenyl)sulfonium, (4-tert-butoxy carbonyl methyl oxy phenyl)diphenyl sulfonium, tris(4-tert-butoxy carbonyl methyl oxy phenyl)sulfonium, (4-tert-butoxy phenyl)bis(4-dimethyl amino phenyl)sulfonium, tris(4-dimethyl amino phenyl)sulfonium, 2-naphthyl diphenyl sulfonium, dimethyl2-naphthyl sulfonium, 4-hydroxy phenyl dimethyl sulfonium, 4-methoxy phenyl dimethyl sulfonium, trimethyl sulfonium, 2-oxocyclohexyl cyclohexyl methyl sulfonium, trinaphthyl sulfonium, tribenzyl sulfonium, diphenyl methyl sulfonium, dimethyl phenyl sulfonium, 2-oxo-2-phenyl ethyl thiacyclo pentanium, 4-n-butoxy naphthyl-1-thiacyclo pentanium, 2-n-butoxy naphthyl-1-thiacyclo pentanium, and the like.

In addition, examples of the sulfonate may include: trifluoro methanesulfonate, pentafluoro ethanesulfonate, nonafluoro butane sulfonate, dodecafluoro hexane sulfonate, pentafluoro ethyl perfluoro cyclohexane sulfonate, heptadecafluoro octane sulfonate, 2,2,2-trifluoro ethane sulfonate, pentafluoro benzene sulfonate, 4-trifluoro methyl benzene sulfonate, 4-fluorobenzene sulfonate, mesitylene sulfonate, 2,4,6-triisopropyl benzene sulfonate, toluene sulfonate, benzene sulfonate, 4-(4'-toluene sulfonyloxy)benzene sulfonate, naphthalene sulfonate, camphor sulfonate, octane sulfonate, dodecylbenzene sulfonate, butane sulfonate, methanesulfonate, 2-benzoyloxy-1,1,3,3,3-pentafluoro propane sulfonate, 1,1,3,3,3-pentafluoro-2-(4-phenyl benzoyloxy)propane sulfonate, 1,1,3,3,3-pentafluoro-2-pivaloyloxy propane sulfonate, 2-cyclohexane carbonyloxy-1,1,3,3,3-pentafluoro propane sulfonate, 1,1,3,3,3-pentafluoro-2-furoyloxy propane sulfonate, 2-naphthoyloxy-1,1,3,3,3-pentafluoro propane sulfonate, 2-(4-tert-butyl benzoyloxy-1,1,3,3,3-pentafluoro propane sulfonate, 2-adamantane carbonyloxy-1,1,3,3,3-pentafluoro propane sulfonate, 2-acetyloxy-1,1,3,3,3-pentafluoro propane sulfonate, 1,1,3,3,3-pentafluoro-2-hydroxy propane sulfonate, 1,1,3,3,3-pentafluoro-2-tosyloxy propane sulfonate, 1,1-difluoro-2-naphthyl-ethane sulfonate, 1,1,2,2-tetrafluoro-2-(norbornane-2-yl)ethane sulfonate, 1,1,2,2-tetrafluoro-2-(tetracyclo[4.4.0.1$^{2,5}$,1$^{7,10}$]dodeca-3-ene-8-yl)ethane sulfonate, and the like.

Examples of the bis(substituted alkyl sulfonyl)imide may include: bis trifluoro methyl sulfonyl imide, bis pentafluoro ethyl sulfonyl imide, bis heptafluoro propyl sulfonyl imide, 1,3-propylene bis sulfonyl imide, and the like. Examples of the tris(substituted alkyl sulfonyl)methide may include tris trifluoro methyl sulfonyl methide.

Examples of the sulfonium salt may include combinations what are mentioned above.

An iodonium salt is a salt of iodonium cation and sulfonate, bis(substituted alkyl sulfonyl)imide or tris(substituted alkyl sulfonyl)methide.

Examples of iodonium cation may include: aryl iodonium cation like diphenyl iodonium, bis(4-tert-butyl phenyl)iodonium, 4-tert-butoxy phenyl phenyl iodonium, 4-methoxyphenyl phenyl iodonium, etc.

In addition, examples of sulfonate may include: trifluoro methanesulfonate, pentafluoro ethanesulfonate, nonafluoro butane sulfonate, dodecafluoro hexane sulfonate, pentafluoro ethyl perfluoro cyclohexane sulfonate, heptadecafluoro octane sulfonate, 2,2,2-trifluoro ethane sulfonate, pentafluoro benzene sulfonate, 4-trifluoro methyl benzene sulfonate, 4-fluorobenzene sulfonate, mesitylene sulfonate, 2,4,6-triisopropyl benzene sulfonate, toluene sulfonate, benzene sulfonate, 4-(4-toluene sulfonyloxy)benzene sulfonate, naphthalene sulfonate, camphor sulfonate, octane sulfonate, dodecylbenzene sulfonate, butane sulfonate, methanesulfonate, 2-benzoyloxy-1,1,3,3,3-pentafluoro propane sulfonate, 1,1,3,3,3-pentafluoro-2-(4-phenyl benzoyloxy)propane sulfonate, 1,1,3,3,3-pentafluoro-2-pivaloyloxy propane sulfonate, 2-cyclohexane carbonyloxy-1,1,3,3,3-pentafluoro propane sulfonate, 1,1,3,3,3-pentafluoro-2-furoyloxy propane sulfonate, 2-naphthoyloxy-1,1,3,3,3-pentafluoro propane sulfonate, 2-(4-tert-butyl benzoyloxy-1,1,3,3,3-pentafluoro propane sulfonate, 2-adamantane carbonyloxy-1,1,3,3,3-pentafluoro propane sulfonate, 2-acetyloxy-1,1,3,3,3-pentafluoro propane sulfonate, 1,1,3,3,3-pentafluoro-2-hydroxy propane sulfonate, 1,1,3,3,3-pentafluoro-2-tosyloxy propane sulfonate, 1,1-difluoro-2-naphthyl-ethane sulfonate, 1,1,2,2-tetrafluoro-2-(norbornane-2-yl)ethane sulfonate, 1,1,2,2-tetrafluoro-2-(tetracyclo[4.4.0.1$^{2,5}$, 1$^{7,10}$]dodeca-3-ene-8-yl)ethane sulfonate, and the like.

Examples of the bis(substituted alkyl sulfonyl)imide may include: bis trifluoro methyl sulfonyl imide, bis pentafluoro ethyl sulfonyl imide, bis heptafluoro propyl sulfonyl imide, 1,3-propylene bis sulfonyl imide, and the like. Examples of the tris(substituted alkyl sulfonyl)methide may include tris trifluoro methyl sulfonyl methide.

Examples of the iodonium salt may include combinations what are mentioned above.

Examples of sulfonyl diazomethane may include: bissulfonyl diazomethane and sulfonyl-carbonyl diazomethane such as bis(ethyl sulfonyl)diazomethane, bis(1-methylpropyl sulfonyl)diazomethane, bis(2-methylpropyl sulfonyl)diazomethane, bis(1,1-dimethylethyl sulfonyl)diazomethane, bis(cyclohexylsulfonyl)diazomethane, bis(perfluoro isopropyl sulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, bis(4-acetyloxyphenylsulfonyl)diazomethane, bis(4-methanesulfonyloxyphenylsulfonyl)diazomethane, bis(4-(4-toluenesulfonyloxy)phenylsulfonyl)diazomethane, bis(4-n-hexyloxy)phenylsulfonyl)diazomethane, bis(2-methyl-4-(n-hexyloxy)phenylsulfonyl)diazomethane, bis(2,5-dimethyl-4-(n-hexyloxy)phenylsulfonyl)diazomethane, bis(3,5-dimethyl-4-(n-hexyloxy)phenylsulfonyl)diazomethane, bis(2-methyl-5-isopropyl-4-(n-hexyloxy)phenylsulfonyl)diazomethane, 4-methylphenylsulfonyl benzoyl diazomethane, tert-butylcarbonyl-4-methylphenylsulfonyl diazomethane, 2-naphthylsulfonyl benzoyl diazomethane, 4-methylphenylsulfonyl-2-naphthoyl diazomethane, methylsulfonyl benzoyl diazomethane, tert-butoxy carbonyl-4-methylphenylsulfonyl diazomethane.

Examples of N-sulfonyl oxyimide type photo acid generator may include: combined compounds of imide structure like succinimide, naphthalene dicarboxyimide, phthalimide, cyclohexyl dicarboxyimide, 5-norbornene-2,3-dicarboxyimide, 7-oxabicyclo[2.2.1]-5-heptene-2,3-dicarboxyimide; and trifluoro methanesulfonate, pentafluoro ethanesulfonate, nonafluoro butane sulfonate, dodecafluoro hexane sulfonate, pentafluoro ethyl perfluoro cyclohexane sulfonate, heptadecafluoro octane sulfonate, 2,2,2-trifluoro ethane sulfonate, pentafluoro benzene sulfonate, 4-trifluoro methyl benzene sulfonate, 4-fluorobenzene sulfonate, mesitylene sulfonate, 2,4,6-triisopropyl benzene sulfonate, toluene sulfonate, benzene sulfonate, naphthalene sulfonate, camphor sulfonate, octane sulfonate, dodecylbenzene sulfonate, butane sulfonate, methanesulfonate, 2-benzoyloxy-1,1,3,3,3-pentafluoro propane sulfonate, 1,1,3,3,3-pentafluoro-2-(4-phenyl benzoyloxy)propane sulfonate, 1,1,3,3,3-pentafluoro-2-pivaloyloxy propane sulfonate, 2-cyclohexane carbonyloxy-1,1,3,3,3-pentafluoro propane sulfonate, 1,1,3,3,3-pentafluoro-2-furoyloxy propane sulfonate, 2-naphthoyloxy-1,1,3,3,3-pentafluoro propane sulfonate, 2-(4-tert-butyl benzoyloxy-1,1,3,3,3-pentafluoro propane sulfonate, 2-adamantane carbonyloxy-1,1,3,3,3-pentafluoro propane sulfonate, 2-acetyloxy-1,1,3,3,3-pentafluoro propane sulfonate, 1,1,3,3,3-pentafluoro-2-hydroxy propane sulfonate, 1,1,3,3,3-pentafluoro-2-tosyloxy propane sulfonate, 1,1-difluoro-2-naphthyl-ethane sulfonate, 1,1,2,2-tetrafluoro-2-(norbornane-2-yl)ethane sulfonate, 1,1,2,2-tetrafluoro-2-(tetracyclo[4.4.0.1$^{2,5}$, 1$^{7,10}$]dodeca-3-ene-8-yl)ethane sulfonate, and the like.

Examples of benzoin sulfonate type photo acid generator may include: benzoin tosylate, benzoin mesylate, benzoin butane sulfonate, etc.

Examples of pyrogallol trisulfonate type photo acid generator may include: compounds obtained by substituting all hydroxyl groups of pyrogallol, phloroglucinol, catechol, resorcinol and hydroquinone with trifluoro methanesulfonate, pentafluoro ethanesulfonate, nonafluoro butane sulfonate, dodecafluoro hexane sulfonate, pentafluoro ethyl perfluoro cyclohexane sulfonate, heptadecafluoro octane sulfonate, 2,2,2-trifluoro ethane sulfonate, pentafluoro benzene sulfonate, 4-trifluoro methyl benzene sulfonate, 4-fluorobenzene sulfonate, toluene sulfonate, benzene sulfonate, naphthalene sulfonate, camphor sulfonate, octane sulfonate, dodecylbenzene sulfonate, butane sulfonate, methanesulfonate, 2-benzoyloxy-1,1,3,3,3-pentafluoro propane sulfonate, 1,1,3,3,3-pentafluoro-2-(4-phenyl benzoyloxy)propane sulfonate, 1,1,3,3,3-pentafluoro-2-pivaloyloxy propane sulfonate, 2-cyclohexane carbonyloxy-1,1,3,3,3-pentafluoro propane sulfonate, 1,1,3,3,3-pentafluoro-2-furoyloxy propane sulfonate, 2-naphthoyloxy-1,1,3,3,3-pentafluoro propane sulfonate, 2-(4-tert-butyl benzoyloxy-1,1,3,3,3-pentafluoro propane sulfonate, 2-adamantane carbonyloxy-1,1,3,3,3-pentafluoro propane sulfonate, 2-acetyloxy-1,1,3,3,3-pentafluoro propane sulfonate, 1,1,3,3,3-pentafluoro-2-hydroxy propane sulfonate, 1,1,3,3,3-pentafluoro-2-tosyloxy propane sulfonate, 1,1-difluoro-2-naphthyl-ethane sulfonate, 1,1,2,2-tetrafluoro-2-(norbornane-2-yl)ethane sulfonate, 1,1,2,2-tetrafluoro-2-(tetracyclo[4.4.0.1$^{2,5}$, 1$^{7,10}$]dodeca-3-ene-8-yl)ethane sulfonate, and the like.

Examples of nitro benzyl sulfonate type photo acid generator may include: 2,4-dinitro benzyl sulfonate, 2-nitro benzyl sulfonate, 2,6-dinitro benzyl sulfonate, etc. Examples of sulfonate may include: trifluoro methanesulfonate, trifluoro ethanesulfonate, nonafluoro butane sulfonate, dodecafluoro hexane sulfonate, pentafluoro ethyl perfluoro cyclohexane sulfonate, heptadecafluoro octane sulfonate, 2,2,2-trifluoro ethane sulfonate, pentafluoro benzene sulfonate, 4-trifluoro methyl benzene sulfonate, 4-fluorobenzene sulfonate, benzene sulfonate, naphthalene sulfonate, camphor sulfonate, octane sulfonate, dodecylbenzene sulfonate, butane sulfonate, methanesulfonate, 2-benzoyloxy-1,1,3,3,3-pentafluoro propane sulfonate, 1,1,3,3,3-pentafluoro-2-(4-phenyl benzoyloxy)propane sulfonate, 1,1,3,3,3-pentafluoro-2-pivaloyloxy propane sulfonate, 2-cyclohexane carbonyloxy-1,1,3,3,3-pentafluoro propane sulfonate, 1,1,3,3,3-pentafluoro-2-furoyloxy propane sulfonate, 2-naphthoyloxy-1,1,3,3,3-pentafluoro propane sulfonate, 2-(4-tert-butyl benzoyloxy-1,1,3,3,3-pentafluoro propane sulfonate, 2-adamantane carbonyloxy-1,1,3,3,3-pentafluoro propane sulfonate, 2-acetyloxy-1,1,3,3,3-pentafluoro propane sulfonate, 1,1,3,3,3-pentafluoro-2-hydroxy propane sulfonate, 1,1,3,3,3-pentafluoro-2-tosyloxy propane sulfonate, 1,1-difluoro-2-naphthyl-ethane sulfonate, 1,1,2,2-tetrafluoro-2-(norbornane-2-yl)ethane sulfonate, 1,1,2,2-tetrafluoro-2-(tetracyclo[4.4.0.1$^{2,5}$, 1$^{7,10}$]dodeca-3-ene-8-yl)ethane sulfonate, and the like. In addition, compounds in which a nitro group on the benzyl side is substituted with a trifluoromethyl group can also be used.

Examples of sulfone type photo acid generator may include: bis(phenylsulfonyl)methane, bis(4-methyl phenylsulfonyl)methane, bis(2-naphthyl sulfonyl)methane, 2,2-bis (phenylsulfonyl)propane, 2,2-bis(4-methyl phenylsulfonyl) propane, 2,2-bis(2-naphthyl sulfonyl)propane, 2-methyl-2-(p-toluene sulfonyl)propiophenone, 2-(cyclohexyl carbonyl)-2-(p-toluene sulfonyl)propane, 2,4-dimethyl-2-(p-toluene sulfonyl)pentane-3-one, etc.

Examples of glyoxime derivative type photo acid generator may include compounds disclosed in Japanese Publication of Patent Application No. 2906999 and Japanese Publication of Unexamined Application No. 09-301948. Examples thereof may include: bis-O-(p-toluene sulfonyl)-α-dimethylglyoxime, bis-O-(p-toluene sulfonyl)-α-diphenyl glyoxime, bis-O-(p-toluene sulfonyl)-α-dicyclohexyl glyoxime, bis-O-(p-toluene sulfonyl)-2,3-pentanedione-glyoxime, bis-O-(n-butane sulfonyl)-α-dimethylglyoxime, bis-O-(n-butane sulfonyl)-α-diphenyl glyoxime, bis-O-(n-butane sulfonyl)-α-dicyclohexyl glyoxime, bis-O-(methane sulfonyl)-α-dimethylglyoxime, bis-O-(trifluoromethane sulfonyl)-α-dimethylglyoxime, bis-O-(2,2,2-trifluoro ethane sulfonyl)-α-dimethylglyoxime, bis-O-(10-camphor sulfonyl)-α-dimethylglyoxime, bis-O-(benzene sulfonyl)-α-dimethylglyoxime, bis-O-(p-fluorobenzene sulfonyl)-α-dimethylglyoxime, bis-O-(p-trifluoromethyl benzene sulfonyl)-α-dimethylglyoxime, bis-O-(xylene sulfonyl)-α-dimethylglyoxime, bis-O-(trifluoromethane sulfonyl)-dioxime, bis-O-(2,2,2-trifluoro ethane sulfonyl)-dioxime, bis-O-(10-camphor sulfonyl)-dioxime, bis-O-(benzene sulfonyl)-dioxime, bis-O-(p-fluorobenzene sulfonyl)-dioxime, bis-O-(p-trifluoromethyl benzene sulfonyl)-dioxime, bis-O-(xylene sulfonyl)-dioxime, and the like.

Furthermore, examples of the photo acid generators may include oxime sulfonates disclosed in U.S. Pat. No. 6,004,724 Specification such as (5-(4-toluensulfonyl)oxyimino-5H-thiophene-2-ylidene)phenylacetonitrile, (5-(10-camphor sulfonyl)oxyimino-5H-thiophene-2-ylidene)phenylacetonitrile, (5-n-octanesulfonyl oxyimino-5H-thiophene-2-ylidene)phenylacetonitrile, (5-(4-toluene sulfonyl)oxyimino-5H-thiophene-2-ylidene)(2-methylphenyl)acetonitrile, (5-(10-camphor sulfonyl)oxyimino-5H-thiophene-2-ylidene)(2-methylphenyl)acetonitrile, (5-n-octanesulfonyl oxyimino-5H-thiophene-2-ylidene)(2-methylphenyl)acetonitrile, and the like; and (5-(4-(4-toluensulfonyloxy)benzene sulfonyl) oxyimino-5H-thiophene-2-ylidene)phenylacetonitrile, (5-(2, 5-bis(4-toluensulfonyloxy)benzene sulfonyl)oxyimino-5H-thiophene-2-ylidene)phenylacetonitrile, and the like disclosed in U.S. Pat. No. 6,916,591 Specification.

Furthermore, examples of the photo acid generators may include oxime sulfonates disclosed in U.S. Pat. No. 6,261,738 Specification and Japanese Publication of Unexamined Application No. 2000-314956, in particular, 2,2,2-trifluoro-1-phenyl-ethanone oxime-O-methyl sulfonate, 2,2,2-trifluoro-1-phenyl-ethanone oxime-O-(10-camphoryl sulfonate), 2,2,2-trifluoro-1-phenyl-ethanone oxime-O-(4-methoxy phenyl sulfonate), 2,2,2-trifluoro-1-phenyl-ethanone oxime-O-(1-naphthyl sulfonate), 2,2,2-trifluoro-1-phenyl-ethanone oxime-O-(2-naphthyl sulfonate), 2,2,2-trifluoro-1-phenyl-ethanone oxime-O-(2,4,6-trimethyl phenyl sulfonate), 2,2,2-trifluoro-1-(4-methylphenyl)-ethanone oxime-O-(10-camphoryl sulfonate), 2,2,2-trifluoro-1-(4-methylphenyl)-ethanone oxime-O-(methyl sulfonate), 2,2,2-trifluoro-1-(2-methylphenyl)-ethanone oxime-O-(10-camphoryl sulfonate), 2,2,2-trifluoro-1-(2,4-dimethylphenyl)-ethanone oxime-O-(10-camphoryl sulfonate), 2,2,2-trifluoro-1-(2,4-dimethylphenyl)-ethanone oxime-O-(1-naphthyl sulfonate), 2,2,2-trifluoro-1-(2,4-dimethylphenyl)-ethanone oxime-O-(2-naphthyl sulfonate), 2,2,2-trifluoro-1-(2,4,6-trimethylphenyl)-ethanone oxime-O-(10-camphoryl sulfonate), 2,2,2-trifluoro-1-(2,4,6-trimethylphenyl)-ethanone oxime-O-(1-naphthyl sulfonate), 2,2,2-trifluoro-1-(2,4,6-trimethylphenyl)-ethanone oxime-O-(2-naphthyl sulfonate), 2,2,2-trifluoro-1-(4-methoxyphenyl)-ethanone oxime-O-methylsulfonate, 2,2,2-trifluoro-1-(4-methylthiophenyl)-ethanone oxime-O-methylsulfonate, 2,2,2-trifluoro-1-(3,4-dimethoxyphenyl)-ethanone oxime-O-methylsulfonate, 2,2,3,3,4,4,4-heptafluoro-1-phenyl-butanone oxime-O-(10-camphoryl sulfonate), 2,2,2-trifluoro-1-(phenyl)-ethanone oxime-O-methylsulfonate, 2,2,2-trifluoro-1-(phenyl)-ethanone oxime-O-10-camphoryl sulfonate, 2,2,2-trifluoro-1-(phenyl)-ethanone oxime-O-(4-methoxyphenyl) sulfonate, 2,2,2-trifluoro-1-(phenyl)-ethanone oxime-O-(1-naphthyl)sulfonate, 2,2,2-trifluoro-1-(phenyl)-ethanone oxime-O-(2-naphthyl)sulfonate, 2,2,2-trifluoro-1-(phenyl)-ethanone oxime-O-(2,4,6-trimethylphenyl)sulfonate, 2,2,2-trifluoro-1-(4-methylphenyl)-ethanone oxime-O-(10-camphoryl)sulfonate, 2,2,2-trifluoro-1-(4-methylphenyl)-ethanone oxime-O-methylsulfonate, 2,2,2-trifluoro-1-(2-methylphenyl)-ethanone oxime-O-(10-camphoryl)sulfonate, 2,2,2-trifluoro-1-(2,4-dimethylphenyl)-ethanone oxime-O-(1-naphthyl)sulfonate, 2,2,2-trifluoro-1-(2,4-dimethylphenyl)-ethanone oxime-O-(2-naphthyl)sulfonate, 2,2,2-trifluoro-1-(2,4,6-trimethylphenyl)-ethanone oxime-O-(10-camphoryl)sulfonate, 2,2,2-trifluoro-1-(2,4,6-trimethylphenyl)-ethanone oxime-O-(1-naphthyl)sulfonate, 2,2,2-trifluoro-1-(2,4,6-trimethylphenyl)-ethanone oxime-O-(2-naphthyl)sulfonate, 2,2,2-trifluoro-1-(4-methoxyphenyl)-ethanone oxime-O-methylsulfonate, 2,2,2-trifluoro-1-(4-thiomethylphenyl)-ethanone oxime-O-methylsulfonate, 2,2,2-trifluoro-1-(3,4-dimethoxyphenyl)-ethanone oxime-O-methylsulfonate, 2,2,2-trifluoro-1-(4-methoxyphenyl)-ethanone oxime-O-(4-methylphenyl)sulfonate, 2,2,2-trifluoro-1-(4-methoxyphenyl)-ethanone oxime-O-(4-methoxyphenyl) sulfonate, 2,2,2-trifluoro-1-(4-methoxyphenyl)-ethanone oxime-O-(4-dodecylphenyl)sulfonate, 2,2,2-trifluoro-1-(4-methoxyphenyl)-ethanone oxime-O-octylsulfonate, 2,2,2-trifluoro-1-(4-thiomethylphenyl)-ethanone oxime-O-(4-methoxyphenyl)sulfonate, 2,2,2-trifluoro-1-(4-thiomethylphenyl)-ethanone oxime-O-(4-dodecylphenyl) sulfonate, 2,2,2-trifluoro-1-(4-thiomethylphenyl)-ethanone oxime-O-octylsulfonate, 2,2,2-trifluoro-1-(4-thiomethylphenyl)-ethanone oxime-O-(2-naphthyl)sulfonate, 2,2,2-trifluoro-1-(2-methylphenyl)-ethanone oxime-O-methylsulfonate, 2,2,2-trifluoro-1-(4-methylphenyl)-ethanone oxime-O-phenylsulfonate, 2,2,2-trifluoro-1-(4-chlorophenyl)-ethanone oxime-O-phenylsulfonate, 2,2,3,3,4,4,4-heptafluoro-1-(phenyl)-butanone oxime-O-(10-camphoryl) sulfonate, 2,2,2-trifluoro-1-naphthyl-ethanone oxime-O-methylsulfonate, 2,2,2-trifluoro-2-naphthyl-ethanone oxime-O-methylsulfonate, 2,2,2-trifluoro-1-[4-benzyl phenyl]-ethanone oxime-O-methylsulfonate, 2,2,2-trifluoro-1-[4-(phenyl-1,4-dioxa-buto-1-yl)phenyl]-ethanone oxime-O-methylsulfonate, 2,2,2-trifluoro-1-naphthyl-ethanone oxime-O-propylsulfonate, 2,2,2-trifluoro-2-naphthyl-ethanone oxime-O-propylsulfonate, 2,2,2-trifluoro-1-[4-benzyl phenyl]-ethanone oxime-O-propylsulfonate, 2,2,2-trifluoro-1-[4-methylsulfonylphenyl]-ethanone oxime-O-propylsulfonate, 1,3-bis[1-(4-phenoxyphenyl)-2,2,2-trifluoro ethanone oxime-O-sulfonyl]phenyl, 2,2,2-trifluoro-1-[4-methylsulfonylphenyl]-ethanone oxime-O-propylsulfonate, 2,2,2-trifluoro-1-[4-methylcarbonyloxyphenyl]-ethanone oxime-O-propylsulfonate, 2,2,2-trifluoro-1-[6H,7H-5,8-dioxonaphtho-2-yl]-ethanone oxime-O-propylsulfonate, 2,2,2-trifluoro-1-[4-methoxylcarbonylmethoxyphenyl]-ethanone oxime-O-propylsulfonate, 2,2,2-trifluoro-1-[4-(methoxylcarbonyl)-(4-amino-1-oxa-penta-1-yl)-phenyl]-ethanone oxime-O-propylsulfonate, 2,2,2-trifluoro-1-[3,5-dimethyl- 4-ethoxyphenyl]-ethanone oxime-O-propylsulfonate, 2,2,2-trifluoro-1-[4-benzyloxyphenyl]-ethanone oxime-O-propylsulfonate, 2,2,2-trifluoro-1-[2-thiophenyl]-ethanone oxime-O-propylsulfonate, 2,2,2-trifluoro-1-[1-dioxa-thiophene-2-yl]-ethanone oxime-O-propylsulfonate, 2,2,2-trifluoro-1-(4-(3-(4-(2,2,2-trifluoro-1-(trifluoromethane sulfonyloxyimino)-ethyl)-phenoxy)-propoxy)-phenyl)ethanone oxime(trifluoro methane sulfonate), 2,2,2-trifluoro-1-(4-(3-(4-(2,2,2-trifluoro-1-(1-propane sulfonyloxyimino)-ethyl)-phenoxy)-propoxy-phenyl)ethanone oxime(1-propane sulfonate), 2,2,2-trifluoro-1-(4-(3-(4-(2,2,2-trifluoro-1-(1-butane sulfonyloxyimino)-ethyl)-phenoxy)-propoxy)-phenyl)ethanone oxime(1-butane sulfonate), and the like; and 2,2,2-trifluoro-1-(4-(3-(4-(2,2,2-trifluoro-1-(4-(4-methylphenylsulfonyloxy)phenylsulfonyloxyimino)-ethyl)-phenoxy)-propoxy)-phenyl)ethanone oxime(4-(4-methylphenylsulfonyloxy)phenyl sulfonate), 2,2,2-trifluoro-1-(4-(3-(4-(2,2,2-trifluoro-1-(2,5-bis(4-methylphenylsulfonyloxy)benzenesulfonyloxy)phenylsulfonyloxyimino)-ethyl)-phenoxy)-propoxy)-phenyl)ethanone oxime(2,5-bis(4-methylphenylsulfonyloxy)benzenesulfonyloxy)phenyl sulfonate) and the like disclosed in U.S. Pat. No. 6,916,591 Specification.

Furthermore, examples of the photo acid generators may include oxime sulfonates disclosed in Japanese Publication of Unexamined Application No. 09-95479, No. 09-230588, and compounds disclosed as prior art in these publications: α-(p-toluene sulfonyloxyimino)phenylacetonitrile, α-(p-chlorobenzene sulfonyloxyimino)phenylacetonitrile, α-(4-nitrobenzene sulfonyloxyimino)phenylacetonitrile, α-(4-nitro-2-trifluoromethylbenzene sulfonyloxyimino) phenylacetonitrile, α-(benzene sulfonyloxyimino)-4-chlorophenylacetonitrile, α-(benzene sulfonyloxyimino)-2,4-dichlorophenylacetonitrile, α-(benzene sulfonyloxyimino)-2,6-dichlorophenylacetonitrile, α-(benzene sulfonyloxyimino)-4-methoxyphenylacetonitrile, α-(2-chlorobenzene sulfonyloxyimino)-4-methoxyphenylacetonitrile, α-(benzene sulfonyloxyimino)-2-thienylacetonitrile, α-(4-dodecylbenzene sulfonyloxyimino)-phenylacetonitrile, α-[(4-toluene sulfonyloxyimino)-4-methoxyphenyl]acetonitrile, α-[(dodecylbenzene sulfonyloxyimino)-4-methoxyphenyl]acetonitrile, α-(tosyloxyimino)-3-thienylacetonitrile, α-(methyl sulfonyloxyimino)-1-cyclopentenylacetonitrile, α-(ethyl sulfonyloxyimino)-1-cyclopentenylacetonitrile, α-(isopropyl sulfonyloxyimino)-1-cyclopentenylacetonitrile, α-(n-butyl sulfonyloxyimino)-1-cyclopentenylacetonitrile, α-(ethyl sulfonyloxyimino)-1-cyclohexenylacetonitrile, α-(isopropyl sulfonyloxyimino)-1-cyclohexenylacetonitrile, α-(n-butyl sulfonyloxyimino)-1-cyclohexenylacetonitrile, and the like.

Furthermore, examples of the photo acid generators may include oxime sulfonates represented by the following formula (specific examples thereof are disclosed in WO2004/074242).

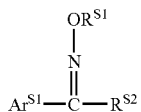

(In the formula, $R^{S1}$ represents substituted or unsubstituted haloalkyl sulfonyl or halobenzene sulfonyl having 1 to 10 carbon atoms. $R^{S2}$ represents a haloalkyl group having 1 to 11 carbon atoms. $Ar^{S1}$ represents a substituted or unsubstituted aromatic group or hetero aromatic group.

Examples of the oxime sulfonates may include: 2-[2,2,3,3,4,4,5,5-octafluoro-1-(nonafluoro butyl sulfonyloxyimino)-pentyl]-fluorene, 2-[2,2,3,3,4,4-pentafluoro-1-(nonafluoro butyl sulfonyloxyimino)-butyl]-fluorene, 2-[2,2,3,3,4,4,5,5,6,6-decafluoro-1-(nonafluoro butyl sulfonyloxyimino)-hexyl]-fluorene, 2-[2,2,3,3,4,4,5,5-octafluoro-1-(nonafluoro butyl sulfonyloxyimino)-pentyl]-4-biphenyl, 2-[2,2,3,3,4,4-pentafluoro-1-(nonafluoro butyl sulfonyloxyimino)-butyl]-4-biphenyl, 2-[2,2,3,3,4,4,5,5,6,6-decafluoro-1-(nonafluoro butyl sulfonyloxyimino)-hexyl]-4-biphenyl, and the like.

Furthermore, examples of the photo acid generators may include bisoxime sulfonates disclosed in Japanese Publication of Unexamined Application No. 09-208554, in particular, bis(α-(4-toluene sulfonyloxy)imino)-p-phenylenediacetonitrile, bis(α-(benzene sulfonyloxy)imino)-p-phenylenediacetonitrile, bis(α-(methane sulfonyloxy)imino)-p-phenylenediacetonitrile, bis(α-(butane sulfonyloxy)imino)-p-phenylenediacetonitrile, bis(α-(10-camphor sulfonyloxy)imino)-p-phenylenediacetonitrile, bis(α-(4-toluene sulfonyloxy)imino)-p-phenylenediacetonitrile, bis(α-(trifluoromethane sulfonyloxy)imino)-p-phenylenediacetonitrile, bis(α-(4-methoxybenzene sulfonyloxy)imino)-p-phenylenediacetonitrile, bis(α-(4-toluene sulfonyloxy)imino)-m-phenylenediacetonitrile, bis(α-(benzene sulfonyloxy)imino)-m-phenylenediacetonitrile, bis(α-(methane sulfonyloxy)imino)-m-phenylenediacetonitrile, bis(α-(butane sulfonyloxy)imino)-m-phenylenediacetonitrile, bis(α-(10-camphor sulfonyloxy)imino)-m-phenylenediacetonitrile, bis(α-(4-toluene sulfonyloxy)imino)-m-phenylenediacetonitrile, bis(α-(trifluoromethane sulfonyloxy)imino)-m-phenylenediacetonitrile, bis(α-(4-methoxybenzene sulfonyloxy)imino)-m-phenylenediacetonitrile, and the like.

Among the above photo acid generators, preferred photo acid generators are sulfonium salts, bissulfonyl diazomethanes, N-sulfonyl oxyimides, oxime-O-sulfonates, and glyoxime derivatives, and more preferably, sulfonium salts, bissulfonyl diazomethanes, N-sulfonyl oxyimides, and oxime-O-sulfonates. Examples of preferred photo acid generators may include: triphenyl sulfonium p-toluenesulfonate, triphenyl sulfonium camphor sulfonate, triphenyl sulfonium pentafluoro benzene sulfonate, triphenyl sulfonium nonafluoro butane sulfonate, triphenyl sulfonium 4-(4'-toluene sulfonyloxy)benzene sulfonate, triphenyl sulfonium 2,4,6-triisopropyl benzene sulfonate, 4-tert-butoxy phenyl diphenyl sulfonium p-toluenesulfonate, 4-tert-butoxy phenyl diphenyl sulfonium camphor sulfonate, 4-tert-butoxy phenyl diphenyl sulfonium 4-(4'-toluene sulfonyloxy)benzene sulfonate, tris(4-methyl phenyl)sulfonium camphor sulfonate, tris(4-tert butyl phenyl)sulfonium camphor sulfonate, 4-tert butyl phenyl diphenyl sulfonium camphor sulfonate, 4-tert butyl phenyl diphenyl sulfonium nonafluoro-1-butane sulfonate, 4-tert butyl phenyl diphenyl sulfonium pentafluoro ethyl perfluoro cyclohexane sulfonate, 4-tert butyl phenyl diphenyl sulfonium perfluoro-1-octane sulfonate, triphenyl sulfonium 1,1-difluoro-2-naphthyl-ethane sulfonate, triphenyl sulfonium 1,1,2,2-tetrafluoro-2-(norbornane-2-yl) ethane sulfonate, bis(tert-butyl sulfonyl)diazomethane, bis(cyclohexyl sulfonyl)diazomethane, bis(2,4-dimethylphenylsulfonyl)diazomethane, bis(4-n-hexyloxy) phenylsulfonyl)diazomethane, bis(2-methyl-4-(n-hexyloxy) phenylsulfonyl)diazomethane, bis(2,5-dimethyl-4-(n-hexyloxy)phenylsulfonyl)diazomethane, bis(3,5-dimethyl-4-(n-hexyloxy)phenylsulfonyl)diazomethane, bis(2-methyl-5-isopropyl-4-(n-hexyloxy)phenylsulfonyl)diazomethane, bis(4-tert-butyl phenyl sulfonyl)diazomethane, N-camphor sulfonyloxy-5-norbornene-2,3-dicarboxyimide, N-p-toluene sulfonyloxy-5-norbornene-2,3-dicarboxyimide, 2-[2,2,3,3,4,4,5,5-octafluoro-1-(nonafluoro butyl sulfonyloxyimino)-pentyl]-fluorene, 2-[2,2,3,3,4,4-pentafluoro-1-(nonafluoro butyl sulfonyloxyimino)-butyl]-fluorene, 2-[2,2,3,3,4,4,5,5,6,6-decafluoro-1-(nonafluoro butyl sulfonyloxyimino)-hexyl]-fluorene, and the like.

Any amount of a photo acid generator may be added to the chemically amplified resist composition of the present invention, but the amount is preferably 0.1 to 20 parts by mass, and more preferably 0.1 to 10 parts by mass to 100 parts by mass of the base resin in the resist composition. When 20 or less parts by mass of a photo acid generator is added, a photoresist film has sufficiently high transmittance, and thus there is less possibility of resolution being deteriorated. The photo acid generator can be used alone or in admixture. Furthermore, an acid generator with low transmittance at an exposure wavelength can be used, thereby transmittance of a resist film can be controlled with an addition amount of the acid generator.

Furthermore, an acid amplifier, which is a compound that breaks down by acid and generates acid may be added to the resist composition of the present invention This compound is disclosed in J. Photopolym. Sci. and Tech., 8. 43-44, 45-46 (1995), and J. Photopolym. Sci. and Tech., 9. 29-30 (1996).

Examples of the acid amplifier may include tert-butyl 2-methyl 2-tosyloxy methyl acetoacetate, 2-phenyl 2-(2-tosyloxy ethyl) 1,3-dioxolan, and the like. However, the acid amplifier is not limited thereto. Among known photo acid generators, compounds lacking stability, particularly thermal stability, often exhibit properties of an acid amplifier.

The amount of addition of the acid amplifier to the resist composition according to the present invention is preferably 2 or less parts by mass, and more preferably 1 or less part by mass to 100 parts by mass of the base resin in the resist composition. When the amount is 2 or less parts by mass, acid diffusion is controlled, and thus there is little possibility resolution and pattern profile may be deteriorated.

The resist composition according to the present invention may further contain any one or more of an organic solvent, a basic compound, a dissolution inhibitor and a surfactant.

Any organic solvent that can dissolve a base resin, an acid generator and other additives can be used for the resist composition of the present invention. Examples of such an organic solvent may include: ketones such as cyclohexanone, methyl-2-n-amyl ketone; alcohols such as 3-methoxy butanol, 3-methyl-3-methoxy butanol, 1-methoxy-2-propanol, 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono tert-butyl ether acetate; lactones such as γ-butyrolactone. Above solvents may be used alone or in admixture. However, the solvents are not limited thereto.

Among the solvents, diethylene glycol dimethyl ether, 1-ethoxy-2-propanol, propylene glycol monomethyl ether acetate, or a mixture thereof can be preferably used for the present invention because these solvents have very high solubility of an acid generator in resist components.

An amount of the organic solvent to be added is preferably 200 to 3,000 parts by mass, and more preferably 400 to 2,500 parts by mass to 100 parts of the base resin.

Furthermore, one or more nitrogen-containing organic compound can be further added as a basic compound to the resist composition of the present invention.

Suitable nitrogen-containing organic compound can suppress an acid diffusion rate when an acid generated from an acid generator diffuses in a resist film. Addition of the nitrogen-containing organic compound suppresses a diffusion rate of the acid in the resist film, thereby enhancing resolution, suppressing change of sensitivity after exposure to radiation, reducing dependency on a substrate or atmosphere, and enhancing exposure margin, pattern profile and the like.

Examples of such a nitrogen-containing organic compound may include: primary, secondary and tertiary aliphatic amines, mixed amines, aromatic amines, heterocyclic amines, nitrogen-containing compounds having a carboxy group, nitrogen-containing compounds having a sulfonyl group, nitrogen-containing compounds having a hydroxyl group, nitrogen-containing compounds having a hydroxy phenyl group, nitrogen-containing alcohol compounds, amides, imides, carbamates and the like.

Examples of the primary aliphatic amine may include: ammonia, methylamine, ethylamine, n-propylamine, isopropylamine, n-butylamine, isobutyl amine, sec-butyl-amine, tert-butylamine, pentylamine, tert-amylamine, cyclopentyl amine, hexylamine, cyclohexyl amine, heptylamine, octylamine, nonylamine, decyl amine, dodecylamine, cetylamine, methylene diamine, ethylenediamine, tetraethylene pentamine and the like. Examples of the secondary aliphatic amine may include: dimethylamine, diethylamine, di-n-propylamine, diisopropyl amine, di-n-butylamine, diisobutyl amine, di-sec-butylamine, dipentylamine, dicyclopentyl amine, dihexyl amine, dicyclohexyl amine, diheptylamine, dioctylamine, dinonylamine, didecylamine, didodecylamine, dicetylamine, N,N-dimethyl methylenediamine, N,N-dimethyl ethylenediamine, N,N-dimethyl tetraethylene pentamine and the like. Examples of the tertiary aliphatic amine may include: trimethylamine, triethylamine, tri-n-propylamine, triisopropyl amine, tri-n-butyl amine, triisobutyl amine, tri-sec-butyl amine, tripentyl amine, tricyclopentyl amine, trihexyl amine, tricyclohexyl amine, triheptyl amine, trioctyl amine, trinonyl amine, tridecyl amine, tridodecyl amine, tricetyl amine, N,N,N',N'-tetra methyl methylene diamine, N,N,N',N'-tetramethyl ethylenediamine, N,N,N',N'-tetramethyl tetraethylene pentamine and the like.

Moreover, examples of the mixed amines may include: a dimethyl ethylamine, methyl ethyl propyl amine, benzylamine, phenethyl amine, benzyl dimethylamine, and the like.

Examples of the aromatic amines and the heterocyclic amines may include: an aniline derivative (for example, aniline, N-methyl aniline, and N-ethyl aniline, N-propyl aniline, N,N-dimethylaniline, 2-methyl aniline, 3-methyl aniline, 4-methyl aniline, ethyl aniline, propyl aniline, trimethyl aniline, 2-nitroaniline, 3-nitroaniline, 4-nitroaniline, 2,4-dinitro aniline, 2,6-dinitro aniline, 3,5-dinitro aniline, N,N-dimethyl toluidine and the like), diphenyl(p-tolyl) amine, methyl diphenylamine, triphenylamine, phenylenediamine, naphthylamine, diamino naphthalene, a pyrrole derivative (for example, pyrrole, 2H-pyrrole, 1-methyl pyrrole, 2,4-dimethyl pyrrole, 2,5-dimethyl pyrrole, N-methyl pyrrole, and the like), oxazole derivative (for example, oxazole, isoxazole and the like), a thiazole derivative (for example, thiazole, isothiazole, and the like), an imidazole derivative (for example, imidazole, 4-methyl imidazole, 4-methyl-2-phenyl imidazole and the like), a pyrazole derivative, a furazan derivative, a pyrroline derivative (for example, pyrroline, 2-methyl-1-pyrroline and the like), a pyrrolidine derivative (for example, pyrrolidine, N-methyl pyrrolidine, pyrrolidinone, N-methyl pyrolidone and the like), an imidazoline derivative, an imidazolidine derivative, a pyridine derivative (for example, pyridine, methyl pyridine, ethyl pyridine, propyl pyridine, butyl pyridine, 4-(1-butyl pentyl)pyridine, dimethyl pyridine, trimethyl pyridine, triethyl pyridine, phenyl pyridine, 3-methyl-2-phenyl pyridine, 4-tert-butyl pyridine, diphenyl pyridine, benzyl pyridine, methoxy pyridine, butoxy pyridine, dimethoxy pyridine, 4-pyrrolidino pyridine, 2-(1-ethylpropyl)pyridine, amino pyridine, dimethyl amino pyridine and the like), a pyridazine derivative, a pyrimidine derivative, a pyrazine derivative, a pyrazoline derivative, a pyrazolidine derivative, a piperidine derivative, a piperazine derivative, a morpholine derivative, an indole derivative, an isoindole derivative, a 1H-indazole derivative, an indoline derivative, a quinoline derivative (for example, quinoline, 3-quinoline carbonitrile, and the like), an isoquinoline derivative, a cinnoline derivative, a quinazoline derivative, a quinoxaline derivative, a phthalazine derivative, a purine derivative, a pteridine derivative, a carbazole derivative, a phenanthridine derivative, an acridine derivative, a phenazine derivative, 1,10-phenanthroline derivative, an adenine derivative, an adenosine derivative, a guanine derivative, a guanosine derivative, an uracil derivative, an uridine derivative and the like.

Furthermore, examples of the nitrogen-containing compounds having a carboxy group may include: aminobenzoic acid, indole carboxylic acid, and an amino acid derivative (for example, nicotinic acid, alanine, arginine, aspartic acid, glutamic acid, glycine, histidine, isoleucine, glycyl leucine, leucine, methionine, phenylalanine, threonine, lysine, 3-aminopyrazine-2-carboxylic acid, methoxy alanine) and the like. Examples of the nitrogen-containing compounds having a sulfonyl group may include: 3-pyridine sulfonic acid, p-toluenesulfonic acid pyridinium and the like. Examples of the nitrogen-containing compounds having a hydroxyl group, the nitrogen-containing compounds having a hydroxy phenyl group, and the nitrogen-containing alcohol compounds may include: 2-hydroxy pyridine, amino cresol, 2,4-quinoline diol, 3-Indole methanol hydrate, monoethanolamine, diethanolamine, triethanolamine, N-ethyl diethanolamine, N,N-diethyl ethanolamine, triisopropanol amine, 2,2'-iminodiethanol, 2-amino ethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxy ethyl)pyrrolidine, 1-(2-hydroxyethyl)-2-pyrrolidinone, 3-piperidinone-1,2-propanediol, 3-pyrrolidino-1,2-propanediol, 8-hydroxy julolidine, 3-quinuclidinol, 3-tropanol, 1-methyl-2-pyrrolidine ethanol, 1-aziridine ethanol, N-(2-hydroxyethyl)phthalimide, N-(2-hydroxyethyl)isonicotinamide, and the like.

Examples of the amides may include: formamide, N-methyl formamide, N,N-dimethylformamide, acetamide, N-methyl acetamide, N,N-dimethylacetamide, propione amide, benzamide, 1-cyclohexyl pyrolidone and the like.

Examples of the imides may include: phthalimide, succinimide, maleimide, and the like.

Examples of the carbamates may include: N-t-butoxy carbonyl-N,N-dicyclohexylamine, N-t-butoxy carbonyl-benzimidazole, oxazolidine and the like.

Furthermore, the nitrogen-containing organic compound may include compounds represented by the following general formula (B)-1.

N(X)$_n$(Y)$_{3-n}$       (B)-1

(In the formula, n is 1, 2, or 3. The side chain X may be the same or different, and represent the following general formulae (X)-1 to (X)-3. The side chain Y may be the same or different, and represents a hydrogen atom or a linear, branched or cyclic alkyl group having 1-20 carbon atoms which may contain an ether group or a hydroxyl group. Moreover, X may bond each other and form a ring.)

(X1)

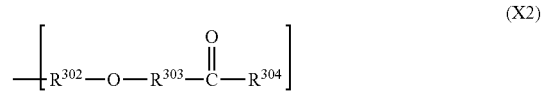

(X2)

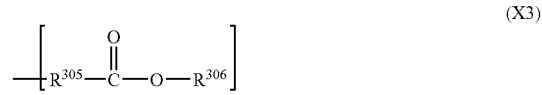

(X3)

In the general formulae (X1) to (X3), $R^{300}$, $R^{302}$, and $R^{305}$ represent a linear or branched alkylene group having 1-4 carbon atoms, and $R^{301}$ and $R^{304}$ represent a hydrogen atom or a linear, branched or cyclic alkyl group having 1-20 carbon atoms, which may contain one or more of a hydroxy group, an ether group, an ester group, and a lactone ring.

$R^{303}$ represents a single bond, or a linear or branched alkylene group having 1-4 carbon atoms, $R^{306}$ represents a linear, branched or cyclic alkyl group having 1-20 carbon atoms, which may contain one or more of a hydroxy group, an ether group, an ester group, and a lactone ring.

Examples of the compound represented by the general formula (B)-1 may be as follows:

Tris(2-methoxy methoxy ethyl)amine, tris{2-(2-methoxyethoxy)ethyl}amine, tris{2-(2-methoxy ethoxy methoxy)ethyl}amine, tris{2-(1-methoxyethoxy)ethyl}amine, tris{2-(1-ethoxy ethoxy)ethyl}amine, tris{2-(1-ethoxy propoxy)ethyl}amine, tris[2-{2-(2-hydroxy ethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane,1,4,10,13-tetraoxa-7,16-diazabicyclo octadecane, 1-aza-12-crown-4,1-aza-15-crown-5,1-aza-18-crown-6, tris(2-formyloxy-ethyl)amine, tris(2-acetoxy ethyl)amine, tris(2-propionyloxy-ethyl)amine, tris(2-butylyloxy-ethyl)amine, tris(2-isobutyryl oxy-ethyl)amine, tris(2-valeryloxy-ethyl)amine, tris(2-pivaloyloxy-ethyl)amine, N,N-bis(2-acetoxy ethyl) 2-(acetoxyacetoxy)ethylamine, tris(2-methoxycarbonyl oxy-ethyl)amine, tris(2-tert-butoxy carbonyl oxy-ethyl)amine, tris[2-(2-oxo propoxy)ethyl]amine, tris[2-(methoxycarbonyl methyl)oxy-ethyl]amine, tris[2-(tert-butoxycarbonylmethyloxy)ethyl]amine, tris[2-(cyclohexyloxy carbonylmethyloxy)ethyl]amine, tris(2-methoxycarbonyl ethyl)amine, tris(2-ethoxy carbonyl ethyl)amine, N,N-bis(2-hydroxy ethyl) 2-(methoxycarbonyl)ethylamine, N,N-bis(2-acetoxy ethyl) 2-(methoxycarbonyl)ethylamine, N,N-bis(2-hydroxy ethyl) 2-(ethoxy carbonyl)ethylamine, N,N-bis(2-acetoxy ethyl) 2-(ethoxy carbonyl)ethylamine, N,N-bis(2-hydroxy ethyl) 2-(2-methoxy ethoxy carbonyl)ethylamine, N,N-bis(2-acetoxy ethyl) 2-(2-methoxy ethoxy carbonyl)ethylamine, N,N-bis(2-hydroxy ethyl) 2-(2-hydroxy ethoxy carbonyl)ethylamine, N,N-bis(2-acetoxy ethyl) 2-(2-acetoxy ethoxy carbonyl)ethylamine, N,N-bis(2-hydroxy ethyl) 2-[(methoxycarbonyl)methoxycarbonyl]ethylamine, N,N-bis(2-acetoxy ethyl) 2-[(methoxycarbonyl)methoxycarbonyl]ethylamine, N,N-bis(2-hydroxy ethyl)-2-(2-oxo propoxy carbonyl)ethylamine, N,N-bis(2-acetoxy ethyl)-2-(2-oxo propoxy carbonyl)ethylamine, N,N-bis(2-hydroxy ethyl) 2-(tetrahydro furfuryl oxy-carbonyl)ethylamine, N,N-bis(2-acetoxy ethyl)

2-(tetrahydro furfuryl oxy-carbonyl)ethylamine, N,N-bis(2-hydroxy ethyl) 2-[(2-oxo tetrahydrofuran-3-yl)oxy-carbonyl]ethylamine, N,N-bis(2-acetoxy ethyl) 2-[(2-oxo-tetrahydrofuran-3-yl)oxy-carbonyl]ethylamine, N,N-bis(2-hydroxy ethyl) 2-(4-hydroxy butoxy carbonyl)ethylamine, N,N-bis(2-formyl oxy-ethyl) 2-(4-formyloxybutoxy carbonyl)ethylamine, N,N-bis(2-formyl oxy-ethyl) 2-(2-formyloxy ethoxy carbonyl)ethylamine, N,N-bis(2-methoxy ethyl) 2-(methoxycarbonyl)ethylamine, N-(2-hydroxy ethyl)bis[2-(methoxycarbonyl)ethyl]amine, N-(2-acetoxy ethyl)bis[2-(methoxycarbonyl)ethyl]amine, N-(2-hydroxy ethyl)bis[2-(ethoxy carbonyl)ethyl]amine, N-(2-acetoxy ethyl)bis[2-(ethoxy carbonyl)ethyl]amine, N-(3-hydroxy-1-propyl)bis[2-(methoxycarbonyl)ethyl]amine, N-(3-acetoxy-1-propyl)bis[2-(methoxycarbonyl)ethyl]amine, N-(2-methoxy ethyl)bis[2-(methoxycarbonyl)ethyl]amine, N-butylbis[2-(methoxycarbonyl)ethyl]amine, N-butylbis[2-(2-methoxy ethoxy carbonyl)ethyl]amine, N-methyl bis(2-acetoxy ethyl) amine, N-ethyl bis(2-acetoxy ethyl)amine, N-methyl bis(2-pivaloyloxy-ethyl)amine, N-ethyl bis[2-(methoxy carbonyloxy)ethyl]amine, N-ethyl bis[2-(tert-butoxycarbonyloxy) ethyl]amine, tris(methoxycarbonyl methyl)amine, tris (ethoxy carbonyl methyl)amine, N-butyl bis (methoxycarbonyl methyl)amine, N-hexyl bis (methoxycarbonyl methyl)amine, and β-(diethylamino)-δ-valerolactone.

Furthermore, examples of the nitrogen-containing organic compound may include a compound with a cyclic structure represented by the following general formula (B)-2.

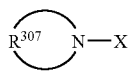

(B)-2

(In the formula, X represents the same as explained above, $R^{307}$ represents a linear or branched alkylene group having 2-20 carbon atoms, which may contain one or more of a carbonyl group, an ether group, an ester group, and a sulfide.)

Examples of (B)-2 may include: 1-[2-(methoxy methoxy) ethyl]pyrrolidine, 1-[2-(methoxy methoxy)ethyl]piperidine, 4-[2-(methoxy methoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy) methoxy]ethyl]morpholine, 2-(1-pyrrolidinyl)ethyl acetate, 2-piperidino ethyl acetate, 2-morpholino ethyl acetate, 2-(1-pyrrolidinyl)ethyl formate, 2-piperidino ethyl propionate, 2-morpholino ethyl acetoxy acetate, 2-(1-pyrrolidinyl)ethyl methoxy acetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidino propionate, methyl 3-morpholino propionate, methyl 3-(thiomorpholino) propionate, methyl 2-methyl-3-(1-pyrrolidinyl)propionate, ethyl 3-morpholino propionate, methoxycarbonyl methyl 3-piperidino propionate, 2-hydroxy ethyl 3-(1-pyrrolidinyl) propionate, 2-acetoxy ethyl 3-morpholino propionate, 2-oxo tetrahydrofuran-3-yl 3-(1-pyrrolidinyl)propionate, tetrahydrofurfuryl 3-morpholino propionate, glycidyl 3-piperidino propionate, 2-methoxy ethyl 3-morpholino propionate, 2-(2-methoxyethoxy)ethyl 3-(1-pyrrolidinyl)propionate, butyl 3-morpholino propionate, cyclohexyl 3-piperidino propionate, α-(1-pyrrolidinyl)methyl-γ-butyrolactone, β-piperidino-γ-butyrolactone, β-morpholino-δ-valerolactone, methyl 1-pyrrolidinyl acetate, methyl piperidino acetate, methyl morpholino acetate, methyl thio morpholino acetate, ethyl 1-pyrrolidinyl acetate, 2-methoxy ethyl morpholino acetate, 2-morpholino ethyl 2-methoxy acetate, 2-morpholino ethyl 2-(2-methoxy ethoxy)acetate, 2-morpholino ethyl 2-[2-(2-methoxy ethoxy)ethoxy]acetate, 2-morpholino ethyl hexanoate, 2-morpholino ethyl octanoate, 2-morpholino ethyl decanoate, 2-morpholino ethyl laurate, 2-morpholino ethyl myristate, 2-morpholino ethyl palmitate, 2-morpholino ethyl stearate, and the like.

Furthermore, the nitrogen-containing organic compound may include a compound containing a cyano group represented by the general formulae (B)-3 to (B)-6.

(B)-3

(B)-4

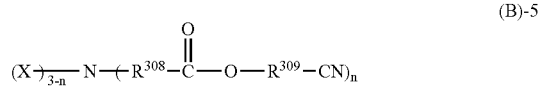

(B)-5

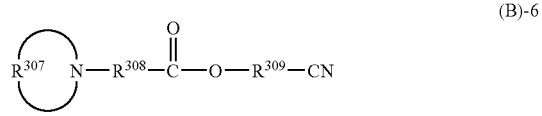

(B)-6

(In the formulae, X, $R^{307}$, and n are the same as explained above. $R^{308}$ and $R^{309}$ are the same or different, and represent a linear or branched alkylene group having 1-4 carbon atoms.)

Examples of the nitrogen-containing organic compound containing a cyano group represented by the formulae (B)-3 to (B)-6 may include: 3-(diethylamino)propiononitrile, N,N-bis(2-hydroxy ethyl)-3-amino propiononitrile, N,N-bis(2-acetoxy ethyl)-3-amino propiononitrile, N,N-bis(2-formyl oxy-ethyl)-3-amino propiononitrile, N,N-bis(2-methoxy ethyl)-3-amino propiononitrile, N,N-bis[2-(methoxy methoxy) ethyl]-3-amino propiononitrile, methyl N-(2-cyanoethyl)-N-(2-methoxy ethyl)-3-amino propionate, methyl N-(2-cyanoethyl)-N-(2-hydroxy ethyl)-3-amino propionate, methyl N-(2-acetoxy ethyl)-N-(2-cyanoethyl)-3-amino propionate, N-(2-cyanoethyl)-N-ethyl-3-amino propiononitrile, N-(2-cyanoethyl)-N-(2-hydroxy ethyl)-3-amino propiononitrile, N-(2-acetoxy ethyl)-N-(2-cyanoethyl)-3-amino propiononitrile, N-(2-cyanoethyl)-N-(2-formyl oxy-ethyl)-3-amino propiononitrile, N-(2-cyanoethyl)-N-(2-methoxy ethyl)-3-amino propiononitrile, N-(2-cyanoethyl)-N-[2-(methoxy methoxy)ethyl]-3-amino propiononitrile, N-(2-cyanoethyl)-N-(3-hydroxy-1-propyl)-3-amino propiononitrile, N-(3-acetoxy-1-propyl)-N-(2-cyanoethyl)-3-amino propiononitrile, N-(2-cyanoethyl)-N-(3-formyloxy-1-propyl)-3-amino propiononitrile, N-(2-cyanoethyl)-N-tetrahydrofurfuryl-3-amino propiononitrile, N,N-bis(2-cyanoethyl)-3-amino propiononitrile, diethyl amino acetonitrile, N,N-bis(2-hydroxy ethyl)amino acetonitrile, N,N-bis(2-acetoxy ethyl)amino acetonitrile, N,N-bis(2-formyl oxy-ethyl) amino acetonitrile, N,N-bis(2-methoxy ethyl)amino acetonitrile, N,N-bis[2-(methoxy methoxy)ethyl]amino acetonitrile, methyl N-cyanomethyl-N-(2-methoxy ethyl)-3-amino propionate, methyl N-cyanomethyl-N-(2-hydroxy ethyl)-3-amino propionate, methyl N-(2-acetoxy ethyl)-N-cyanomethyl-3-amino propionate, N-cyanomethyl-N-(2-hydroxy ethyl) amino acetonitrile, N-(2-acetoxy ethyl)-N-(cyanomethyl) amino acetonitrile, N-cyanomethyl-N-(2-formyloxy-ethyl) amino acetonitrile, N-cyanomethyl-N-(2-methoxy ethyl)

amino acetonitrile, N-cyanomethyl-N-[2-(methoxy methoxy)ethyl]amino acetonitrile, N-(cyanomethyl)-N-(3-hydroxy-1-propyl)amino acetonitrile, N-(3-acetoxy-1-propyl)-N-(cyanomethyl)amino acetonitrile, N-cyanomethyl-N-(3-formyloxy-1-propyl)amino acetonitrile, N,N-bis (cyanomethyl)amino acetonitrile, 1-pyrrolidine propiononitrile, 1-piperidine propiononitrile, 4-morpholine propiononitrile, 1-pyrrolidine acetonitrile, 1-piperidine acetonitrile, 4-morpholine acetonitrile, cyanomethyl 3-diethyl amino propionate, cyanomethyl N,N-bis(2-hydroxyethyl)-3-amino propionate, cyanomethyl N,N-bis(2-acetoxy ethyl)-3-amino propionate, cyanomethyl N,N-bis(2-formyloxy-ethyl)-3-amino propionate, cyanomethyl N,N-bis(2-methoxy ethyl)-3-amino propionate, cyanomethyl N,N-bis [2-(methoxy methoxy)ethyl]-3-amino propionate, (2-cyanoethyl) 3-diethyl amino propionate, (2-cyanoethyl) N,N-bis(2-hydroxy ethyl)-3-amino propionate, (2-cyanoethyl)N,N-bis(2-acetoxyethyl)-3-amino propionate, (2-cyanoethyl) N,N-bis(2-formyl oxy-ethyl)-3-amino propionate, (2-cyanoethyl) N,N-bis(2-methoxy ethyl)-3-amino propionate, (2-cyanoethyl) N,N-bis[2-(methoxy methoxy)ethyl]-3-amino propionate, cyanomethyl 1-pyrrolidine propionate, cyanomethyl 1-piperidine propionate, cyanomethyl 4-morpholine propionate, (2-cyanoethyl) 1-pyrrolidine propionate, (2-cyanoethyl) 1-piperidine propionate, (2-cyanoethyl) 4-morpholine propionate, and the like.

Furthermore, examples of the nitrogen-containing organic compound may include a nitrogen-containing organic compound having an imidazole structure and a polar functional group represented by the following general formula (B)-7.

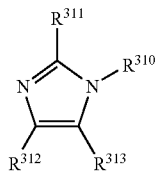

(B)-7

In the formula, $R^{310}$ represents a linear, branched or cyclic alkyl group having a polar functional group. The polar functional group is one or more of a hydroxy group, a carbonyl group, an ester group, an ether group, a sulfide group, a carbonate group, a cyano group, and an acetal group. $R^{311}$, $R^{312}$, and $R^{313}$ represents a hydrogen atom, a linear, branched or cyclic alkyl group having 1-10 carbon atoms, an aryl group, or an aralkyl group.

Furthermore, examples of the nitrogen-containing organic compound may include a nitrogen-containing organic compound having a benzimidazole structure and a polar functional group represented by the following general formula (B)-8.

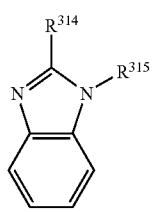

(B)-8

In the formula, $R^{314}$ represents a hydrogen atom, a linear, branched or cyclic alkyl group having 1-10 carbon atoms, an aryl group, or an aralkyl group. $R^{315}$ represents a linear, branched or cyclic alkyl group having 1-20 carbon atoms and a polar functional group. The polar functional group is one or more of an ester group, an acetal group and a cyano group; and may further contain one or more of a hydroxy group, a carbonyl group, an ether group, a sulfide group, and a carbonate group.

Furthermore, examples of the nitrogen-containing organic compound may include a nitrogen-containing organic compound having a polar functional group represented by the following general formulae (B)-9 and (B)-10.

(B)-9

(B)-10

In the formulae, A represents a nitrogen atom or $\equiv C-R^{322}$. B represents a nitrogen atom or $\equiv C-R^{323}$. $R^{316}$ represents a linear, branched or cyclic alkyl group having 2-20 carbon atoms and a polar functional group. The polar functional group is one or more of a hydroxy group, a carbonyl group, an ester group, an ether group, a sulfide group, a carbonate group, a cyano group, and an acetal group. $R^{317}$, $R^{318}$, $R^{319}$, and $R^{320}$ represents a hydrogen atom, a linear, branched or cyclic alkyl group having 1-10 carbon atoms, or an aryl group. Furthermore, $R^{317}$ and $R^{318}$; and $R^{319}$ and $R^{320}$ can be linked to form a benzene ring, a naphthalene ring or a pyridine ring. $R^{321}$ represents a hydrogen atom, a linear, branched or cyclic alkyl group having 1-10 carbon atoms, or an aryl group. $R^{322}$ and $R^{323}$ represent a hydrogen atom, a linear, branched or cyclic alkyl group having 1-10 carbon atoms, or an aryl group. $R^{321}$ and $R^{323}$ can be linked to form a benzene ring or a naphthalene ring.

Furthermore, examples of the nitrogen-containing organic compound may include a nitrogen-containing organic compound having an aromatic carboxylate structure represented by the following general formulae (B)-11, 12, 13 and 14.

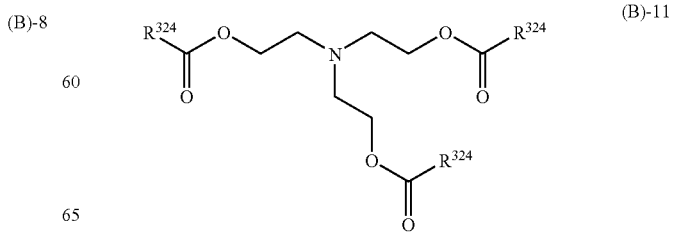

(B)-11

-continued

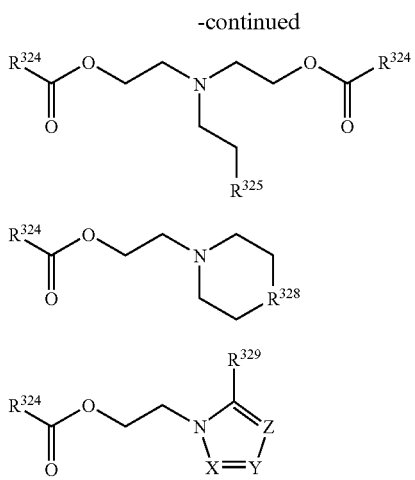

In the formulae, $R^{324}$ represents an aryl group having 6-20 carbon atoms or a hetero aromatic group having 4-20 carbon atoms where a part of or all hydrogen atoms may optionally substituted with a halogen atom, a linear, branched or cyclic alkyl group having 1-20 carbon atoms, an aryl group having 6-20 carbon atoms, an aralkyl group having 7-20 carbon atoms, an alkoxy group having 1-10 carbon atoms, an acyloxy group having 1-10 carbon atoms, or an alkyl thio group having 1-10 carbon atoms. $R^{325}$ represents $CO_2R^{326}$, $OR^{327}$, or a cyano group. $R^{326}$ represents an alkyl group having 1-10 carbon atoms where methylene groups may partially be substituted with oxygen atoms. $R^{327}$ represents an alkyl group or an acyl group having 1-10 carbon atoms where methylene groups may partially be substituted with oxygen atoms. $R^{328}$ represents a single bond, a methylene group, an ethylene group, a sulfur atom, or —$O(CH_2CH_2O)_n$— group. n denotes 0, 1, 2, 3, or 4. $R^{329}$ represents a hydrogen atom, a methyl group, an ethyl group, or a phenyl group. X represents a nitrogen atom or $CR^{330}$. Y represents a nitrogen atom or $CR^{331}$. Z represents a nitrogen atom or $CR^{332}$. $R^{330}$, $R^{331}$, and $R^{332}$ independently represent a hydrogen atom, a methyl group or a phenyl group. Furthermore, $R^{330}$ and $R^{331}$; or $R^{331}$ and $R^{332}$ can be linked to form an aromatic ring having 6-20 carbon atoms or a hetero aromatic ring having 2-20 carbon atoms.

Furthermore, examples of the nitrogen-containing organic compound may include a nitrogen-containing organic compound having a 7-oxa norbornane-2-carboxylate structure represented by the following general formula (B)-15.

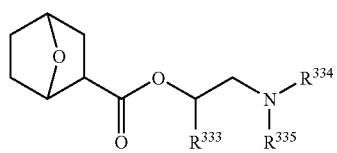

In the formula, $R^{333}$ represents a hydrogen atom, a linear, branched or cyclic alkyl group having 1-10 carbon atoms. $R^{334}$ and $R^{335}$ independently represent an alkyl group having 1-20 carbon atoms, an aryl group having 6-20 carbon atoms, or an aralkyl group having 7-20 carbon atoms, in which these groups may have one or more polar functional group such as ether, carbonyl, ester, alcohol, sulfide, nitrile, amine, imine or amide; and a part of or all hydrogen atoms may optionally be substituted with a halogen atom. $R^{334}$ and $R^{335}$ can be linked to form a hetero ring or a hetero aromatic ring having 2-20 carbon atoms.

The amount of addition of the nitrogen-containing organic compound to the resist composition according to the present invention is preferably 0.001 to 2 parts by mass, and more preferably 0.01 to 1 parts by mass to 100 parts by mass of the base resin in the resist composition. When the amount is 0.001 or more parts by mass, sufficient effects due to adding the compound are obtained. When the amount is 2 or less parts by mass, there is little possibility that resolution may be deteriorated.

A commonly used surfactant can be added to the resist composition of the present invention as an arbitrary component in addition to the above-mentioned components for the purpose of improving application properties. The amount of addition of the arbitrary component is a normal amount in the range that the effect of the present invention is not impeded.

The surfactant is preferably non-ionic one. Examples thereof may include: perfluoro alkyl polyoxyethylene ethanol, fluorinated alkyl ester, perfluoro alkylamine oxide, perfluoro alkyl EO adduct, a fluorine-containing organosiloxane compound, and the like. For example, there are Fluorad "FC-430" and "FC-431" (both are manufactured by Sumitomo 3M), Surflon "S-141", "S-145", "KH-10", "KH-20", "KH-30", and "KH-40" (all are manufactured by Asahi Glass Co., Ltd.), Unidyne. "DS-401", "DS-403" and "DS-451" (all are manufactured by Daikin Industries, LTD.), MEGAFACE "F-8151" (manufactured by Dainippon Ink Industry), "X-70-092", and "X-70-093" (both are manufactured by Shin-Etsu Chemical Co., Ltd.), and the like. Preferred examples are Fluorad "FC-430" (manufactured by Sumitomo 3M), "KH-20" and "KH-30" (manufactured by Asahi Glass Co., Ltd.), and "X-70-093" (manufactured by Shin-Etsu Chemical Co., Ltd.).

If desired, other components such as a dissolution inhibitor (a dissolution controller), a carboxylic compound, or an acetylene alcohol derivative can be further added to the resist composition of the present invention as an arbitrary component. The amount of addition of the arbitrary component is a normal amount in the range that the effect of the present invention is not impeded.

A suitable example of the dissolution inhibitor to be added to the resist composition according to the present invention is a compound having a mass average molecular weight of 100 to 1,000, preferably 150 to 800, where the compound has two or more of phenolic hydroxyl groups in a molecule and the hydrogen atom of the phenolic hydroxyl group is substituted with an acid labile group at a ratio of 0 to 100 mole % on average as a whole; or the compound has a carboxy group and the hydrogen atom of the carboxy group is substituted with an acid labile group at a ratio of 50 to 100 mole % on average as a whole.

The substitution ratio of the hydrogen atom of the phenolic hydroxyl group with an acid labile group is preferably 0 or more mole % in the whole phenolic hydroxyl groups on average, and more preferably 30 or more mole %. The upper limit of the substitution ratio is 100 mole %, and more preferably 80 mole %.

Incidentally, the substitution ratio of the hydrogen atoms of the carboxy groups with acid labile groups in the whole carboxyl groups on average is 50 mole % or more, preferably 70 mole % or more. The upper limit of the substitution ratio is 100 mole %.

Suitable examples of the compound which has two or more of phenolic hydroxyl groups and the compound which has a carboxy group are shown by the following formulae (D1)-(D14).

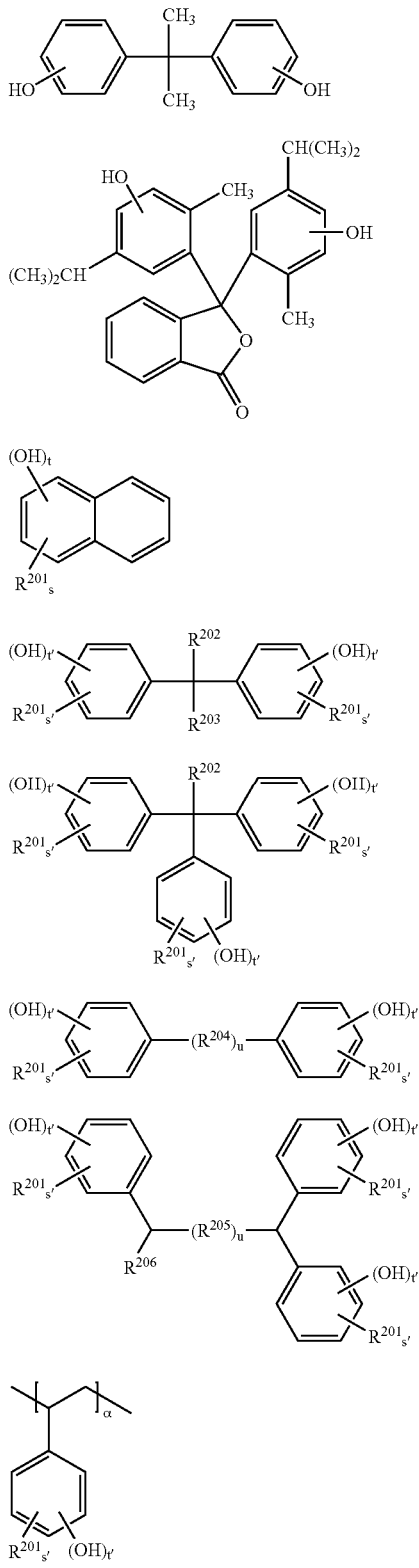

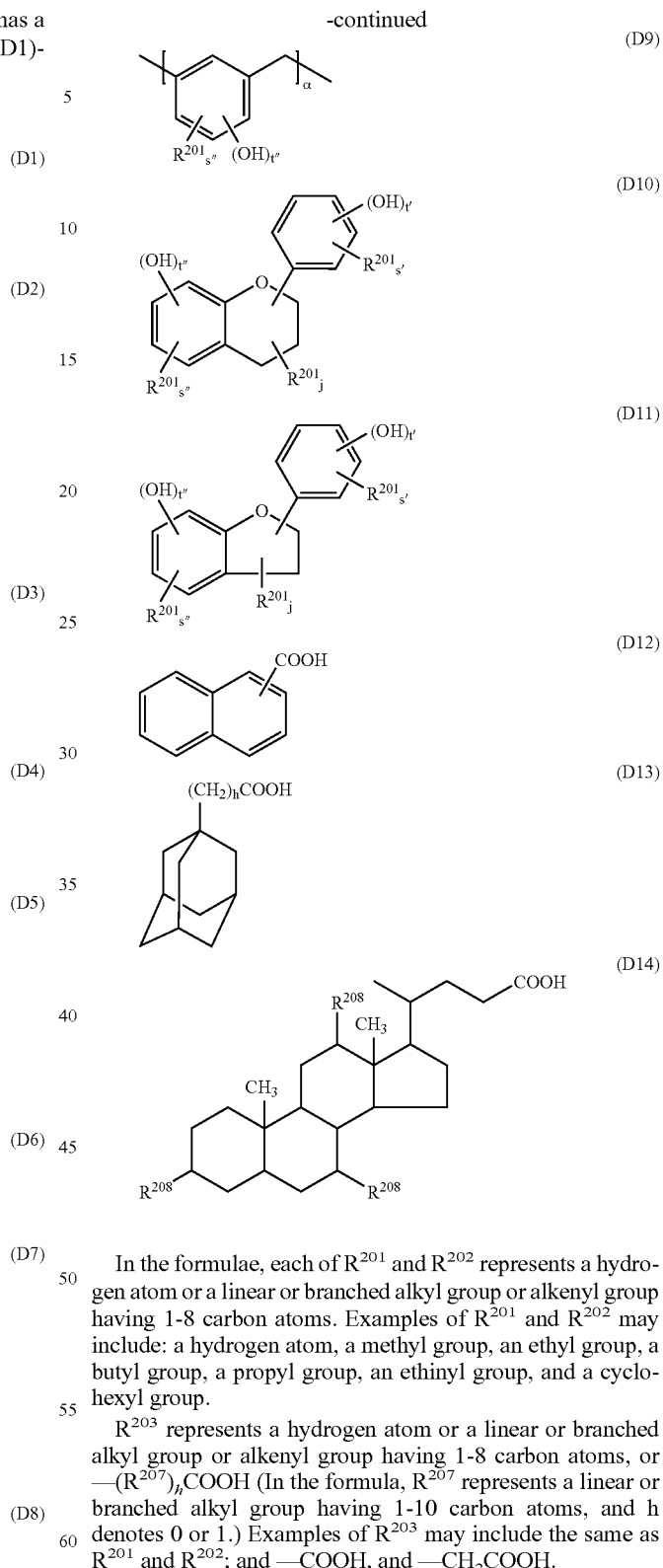

In the formulae, each of $R^{201}$ and $R^{202}$ represents a hydrogen atom or a linear or branched alkyl group or alkenyl group having 1-8 carbon atoms. Examples of $R^{201}$ and $R^{202}$ may include: a hydrogen atom, a methyl group, an ethyl group, a butyl group, a propyl group, an ethinyl group, and a cyclohexyl group.

$R^{203}$ represents a hydrogen atom or a linear or branched alkyl group or alkenyl group having 1-8 carbon atoms, or —$(R^{207})_h$COOH (In the formula, $R^{207}$ represents a linear or branched alkyl group having 1-10 carbon atoms, and h denotes 0 or 1.) Examples of $R^{203}$ may include the same as $R^{201}$ and $R^{202}$; and —COOH, and —CH$_2$COOH.

$R^{204}$ represents —(CH$_2$)$_i$— (i=2-10), an arylene group having 6-10 carbon atoms, a carbonyl group, a sulfonyl group, an oxygen atom, or a sulfur atom. Examples of $R^{204}$ may include an ethylene group, a phenylene group, a carbonyl group, a sulfonyl group, an oxygen atom, a sulfur atom, and the like.

$R^{205}$ represents an alkylene group having 1-10 carbon atoms, an arylene group having 6-10 carbon atoms, a carbonyl group, a sulfonyl group, an oxygen atom, or a sulfur atom. Examples of $R^{205}$ may include a methylene group and the same as $R^{204}$.

$R^{206}$ represents a hydrogen atom, a linear or branched alkyl group or alkenyl group having 1-8 carbon atoms, a phenyl group or a naphthyl group each substituted with a hydroxyl group. Examples of $R^{206}$ may include a hydrogen atom, a methyl group, an ethyl group, a butyl group, a propyl group, an ethinyl group, a cyclohexyl group, a hydroxyl-group-substituted phenyl group, a hydroxyl-group-substituted naphthyl group, and the like.

$R^{208}$ represents a hydrogen atom or a hydroxyl group.

j is an integer of 0-5. u and h are 0 or 1. s, t, s', t', s", and t" are numbers that satisfy s+t=8, s'+t'=5, s"+t"=4, and provide each of the phenyl structure with at least one hydroxyl group. α is a number that makes the mass average molecular weight of the compounds of the formulae (D8) and (D9) to be 100 to 1,000.

As an acid labile group of the dissolution inhibitor, various kinds of acid labile groups may be used. Examples of the acid labile groups may include: the groups represented by the general formulae (L1) to (L4), tertiary alkyl group having 4-20 carbon atoms, a trialkyl silyl group wherein each of the alkyl groups has 1-6 carbon atoms, and an oxoalkyl group having 4-20 carbon atoms. Incidentally, examples of these groups are the same as mentioned above.

The blending amount of the dissolution inhibitor is 0 to 50 parts by mass, preferably 0 to 40 parts by mass, and more preferably 0 to 30 parts by mass to 100 parts by mass of the base resin of the resist composition. The dissolution inhibitor can be used alone or in admixture. When the blending amount of the dissolution inhibitor is 50 or less parts by mass, there is little possibility that film loss in a pattern is caused, and resolution is degraded.

Incidentally, the dissolution inhibitors are manufactured by introducing an acid labile group to a compound having phenolic hydroxyl groups or a carboxy group with organic chemical treatments.

As the carboxylic compound that can be added to the resist composition of the present invention, one or more kinds of compounds selected from the following [group I] and [group II] can be used, but the carboxylic compound is not limited thereto. By blending this component, PED (Post Exposure Delay) stability of a resist, and edge roughness on a nitride film substrate are improved.

[Group I]

Compounds where a part of or all hydrogen atoms of phenolic hydroxyl groups of the compound represented by the following general formulae (A1)-(A10) are substituted with —$R^{401}$—COOH ($R^{401}$ represents a linear or branched alkylene group having 1-10 carbon atoms), and a mole ratio of the phenolic hydroxyl group (C) and the group (D) represented by =C—COOH in a molecule is as follows: C/(C+D)=0.1 to 1.0.

[Group II]

Compounds represented by the following general formulae (A11) to (A15).

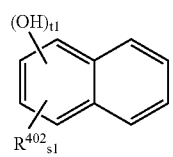
(A1)

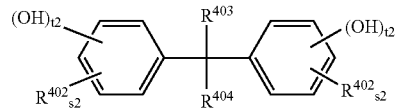
(A2)

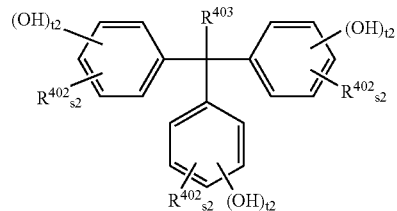
(A3)

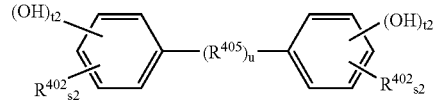
(A4)

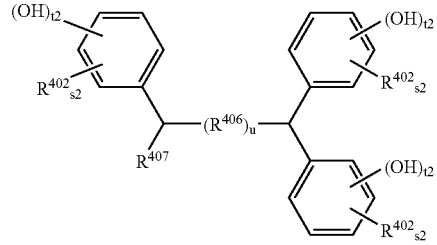
(A5)

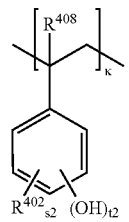
(A6)

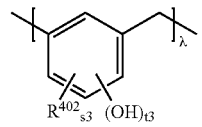
(A7)

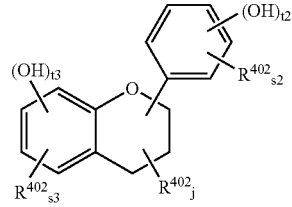
(A8)

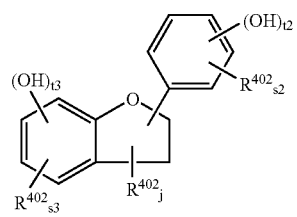
(A9)

-continued

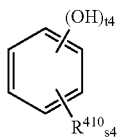  (A10)

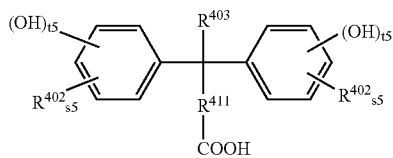  (A11)

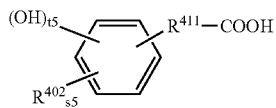  (A12)

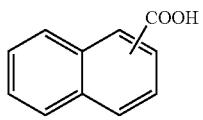  (A13)

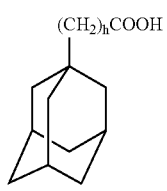  (A14)

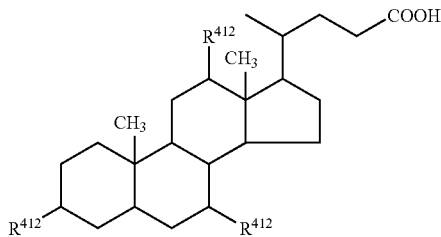  (A15)

In the formulae, $R^{408}$ represents a hydrogen atom or a methyl group.

$R^{402}$ and $R^{403}$ independently represent a hydrogen atom or a linear or branched alkyl group or alkenyl group having 1-8 carbon atoms. $R^{404}$ represents a hydrogen atom or a linear or branched alkyl group or alkenyl group having 1-8 carbon atoms, or —$(R^{409})_h$—COOR' (R' represents a hydrogen atom or —$R^{409}$—COOH).

$R^{405}$ represents —$(CH_2)_i$— (i=2-10), an arylene group having 6-10 carbon atoms, a carbonyl group, a sulfonyl group, an oxygen atom, or a sulfur atom.

$R^{406}$ represents an alkylene group having 1-10 carbon atoms, an arylene group having 6-10 carbon atoms, a carbonyl group, a sulfonyl group, an oxygen atom, or a sulfur atom.

$R^{407}$ represents a hydrogen atom or a linear or branched alkyl group or alkenyl group having 1-8 carbon atoms, a phenyl group substituted with a hydroxyl group or a naphthyl group substituted with a hydroxyl group.

$R^{409}$ represents a linear or branched alkylene group having 1-10 carbon atoms.

$R^{410}$ represents a hydrogen atom or a linear or branched alkyl group or alkenyl group having 1-8 carbon atoms, or —$R^{411}$—COOH group (In the formula, $R^{411}$ represents a linear or branched alkylene group having 1-10 carbon atoms).

$R^{412}$ represents a hydrogen atom or a hydroxyl group.

j is a number of 0 to 3. Each of s1, t1, s2, t2, s3, t3, s4, and t4 are numbers that satisfy s1+t1=8, s2+t2=5, s3+t3=4, and s4+t4=6, and provide each phenyl structure with at least one hydroxyl group.

s5 and t5 are numbers that satisfy s5≧0, t5≧0, and s5+t5=5.

u is a number that satisfies 1≦u≦4. h is a number that satisfies 1≦h≦4.

κ is a number that makes the mass average molecular weight of the compound represented by the formula (A6) fall within the range of 1,000 to 5,000.

λ is a number that makes the mass average molecular weight of the compound represented by the formula (A7) fall within the range of 1,000 to 10,000.

Illustrative examples of the above compounds may include compounds represented by the following general formulae (AI-1) to (AI-14) and (AII-1) to (AII-10). However, the compounds are not limited thereto.

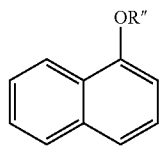  (AI-1)

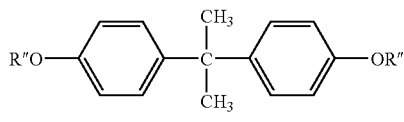  (AI-2)

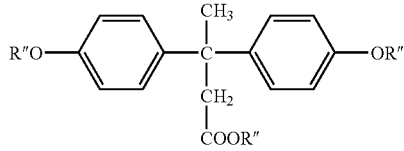  (AI-3)

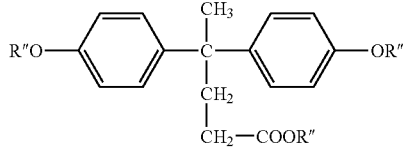  (AI-4)

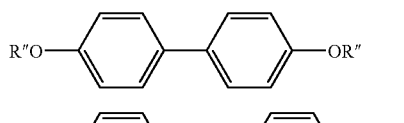  (AI-5)

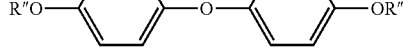  (AI-6)

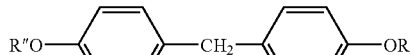  (AI-7)

  (AI-8)

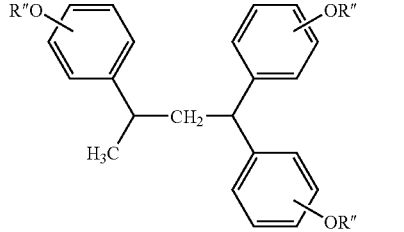

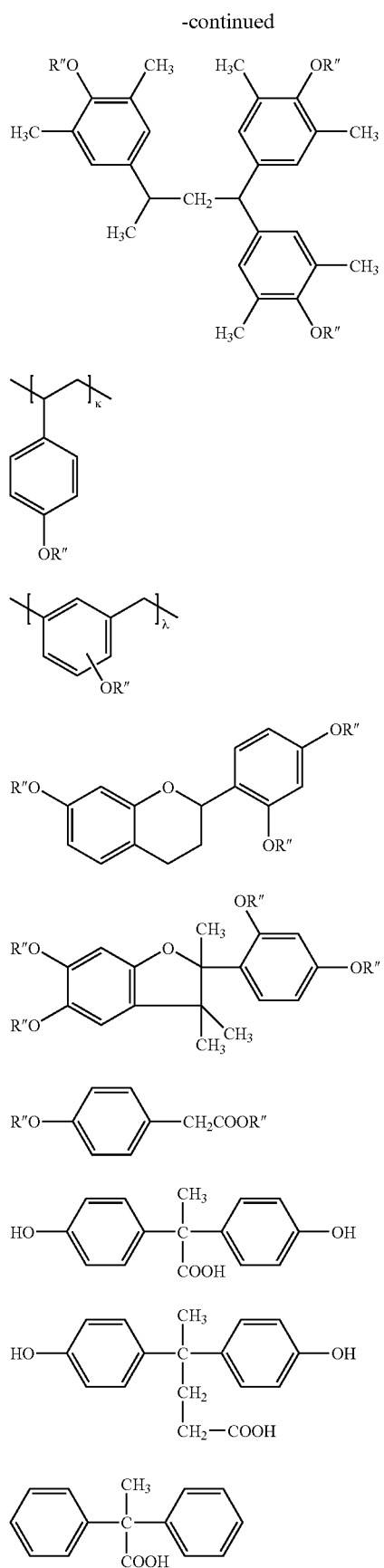
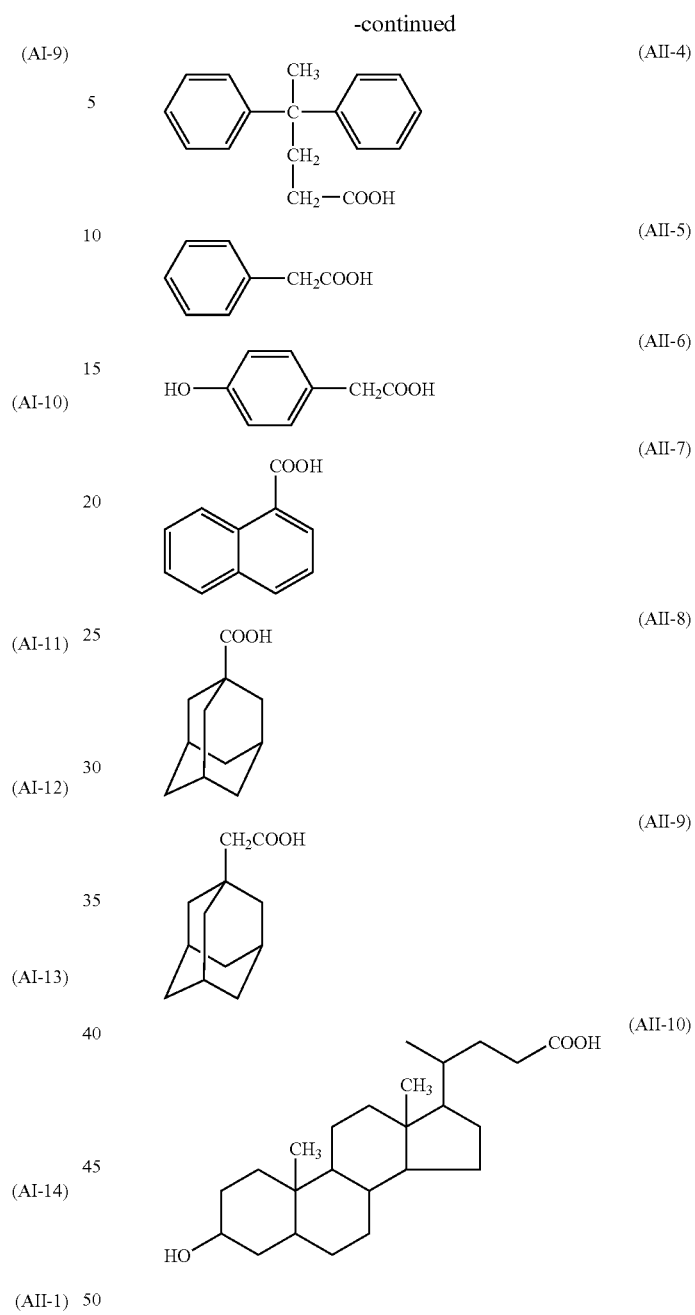

In the formulae, R" represents a hydrogen atom or a —CH$_2$COOH group, and 10 to 100 mole % of R" represents a —CH$_2$COOH group in each compound. κ and λ represents the same as mentioned above.

The amount of the compound having a group represented by ≡C—COOH in a molecule to be added is preferably 0 to 5 parts by mass, more preferably 0.1 to 5 parts, still more preferably 0.1 to 3 parts, still further more preferably 0.1 to 5 parts, and most preferably 0.1 to 2 parts. When 5 or less parts by mass of the compound is added, there is less possibility of the resolution of a resist composition being deteriorated.

Preferred acetylene alcohol derivatives that can be added to the resist composition according to the present invention are represented by the following general formulae (S1) and (S2).

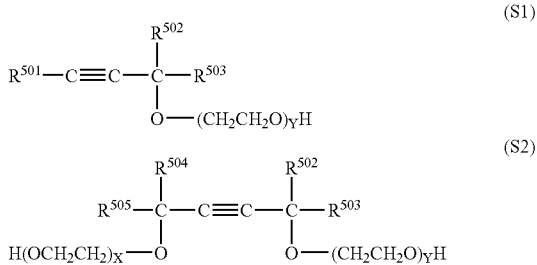

In the formulae, $R^{501}$, $R^{502}$, $R^{503}$, $R^{504}$, and $R^{505}$ are independently a hydrogen atom or a linear, branched or cyclic alkyl group having 1-8 carbon atoms. X and Y represent 0 or positive numbers, which satisfy the following equation: $0 \leq X \leq 30$, $0 \leq Y \leq 30$, and $0 \leq X+Y \leq 40$.

Examples of the acetylene alcohol derivatives may include: Surfynol 61, Surfynol 82, Surfynol 104, Surfynol 104E, Surfynol 104H, Surfynol 104A, Surfynol TG, Surfynol PC, Surfynol 440, Surfynol 465, Surfynol 485 (manufactured by Air Products and Chemicals Inc.), Surfynol E1004 (manufactured by Nisshin Kagaku Kogyo corporation) and the like.

The amount of addition of the above-mentioned acetylene alcohol derivative is preferably 0.01 to 2 mass %, and more preferably 0.02 to 1 mass % to 100 mass % of the resist composition. When the amount is 0.01 mass % or more, the improvement effect of an application property and a preservation stability is achieved sufficiently. When the amount is 2 mass % or less, there is little possibility that the resolution of a resist composition may be lowered.

Furthermore, the present invention provides a patterning process comprising: at least, a step of applying the resist composition mentioned above on a substrate; a step of conducting heat-treatment and then exposing the substrate to a high energy beam; and a step of developing the substrate with a developer. At this time, the high energy beam preferably has a wavelength in the range of 180 to 250 nm.

Furthermore, the step of exposing the substrate to a high energy beam may be conducted by liquid immersion exposure in which the substrate is exposed through liquid. For example, an exposure wavelength in the range of 180 to 250 nm is used, a gap between the substrate to which the resist composition is applied and a projection lens is filled with liquid, and the substrate is exposed through the liquid. Incidentally, examples of the liquid used in the liquid immersion exposure may include water and the like.

In order to form a pattern using the resist composition of the present invention, a well-known lithography techniques can be adopted.

For example, the resist composition is applied on a substrate such as a silicon wafer so that a thickness may be 0.1-2.0 µm by techniques such as spin coating, the substrate is then pre-baked at 60-150 degrees C. for 1-10 minutes, and preferably at 80-140 degrees C. for 1-5 minutes on a hot plate to form a photoresist film.

Subsequently, a mask for forming a target pattern is held above the photoresist film, and irradiated is a high-energy beam such as far ultraviolet rays, excimer lasers, an X-ray, or an electron beam so that an exposure dose may be about 1-200 mJ/cm², and preferably 10-100 mJ/cm².

As for the exposure, other than standard exposure techniques, the liquid immersion lithography may also be used. In the liquid immersion lithography, a gap between a projection lens and a photoresist film is filled with water and the like.

As mentioned above, photoresist films formed with the resist compositions according to the present invention have a good barrier property against water, and prevent photoresist components from leaching to water. And thus, there is no need to use protective films in the liquid immersion lithography. As a result, cost that is required for forming the protective films and the like can be cut.

Furthermore, the photoresist films have high receding contact angles against water, and thus droplets are prevented from remaining on the surfaces of the photoresist films after scanning for the liquid immersion exposure, thereby reducing patterning defects that are caused by droplets remaining on the films' surfaces.

Next, the substrate is subjected to postexposure bake (PEB) on a hot plate, at 60-150 degrees C. for 1-5 minutes, and preferably at 80-140 degrees C. for 1-3 minutes. Then the substrate is developed for 0.1-3 minutes, preferably for 0.5-2 minutes using a developer of an aqueous alkali solution such as 0.1 to 5 mass %, preferably 2 to 3 mass % tetramethyl ammonium hydroxide (TMAH), according to a conventional method, such as a dip method, a puddle method, and a spray method. And thus, a target pattern is formed on the substrate.

Incidentally, the resist composition of the present invention is extremely suitable especially for micropatterning using ultraviolet rays, excimer lasers, an X-ray, or an electron beam at a wavelength of 250 to 180 nm among high-energy beams.

EXAMPLE

Hereinafter, the present invention will be explained in detail with referring to Examples and Comparative Examples. However, the present invention is not restricted to the following Examples.

(Preparation of Polymers)

In order to obtain polymers (polymeric additives) that are added to resist compositions, various monomers were combined, subjected to copolymerization reaction in an solvent of isopropanol, crystallized in hexane, washed with hexane repeatedly, subsequently isolated and dried. And thus polymers having the following compositions were obtained. As for the compositions of thus-obtained polymers, $^1$H-NMR, molecular weight, and distribution were measured with the gel permeation chromatography.

Polymer 1

Molecular weight (Mw)=7,300

Distribution (Mw/Mn)=1.67 polymer 1

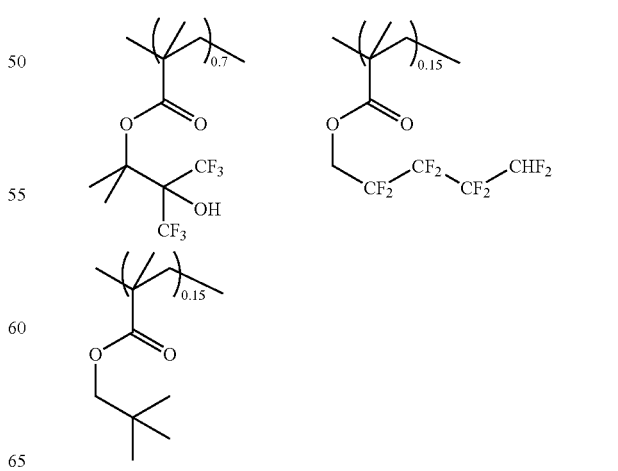

Polymer 2
  Molecular weight (Mw)=7,600
  Distribution (Mw/Mn)=1.62 polymer 2

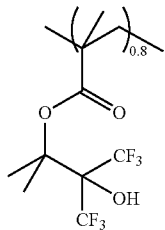
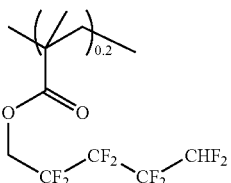

Polymer 3
  Molecular weight (Mw)=9,300
  Distribution (Mw/Mn)=1.93 polymer 3

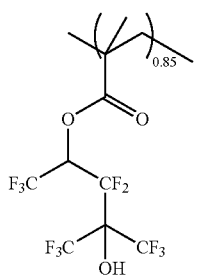
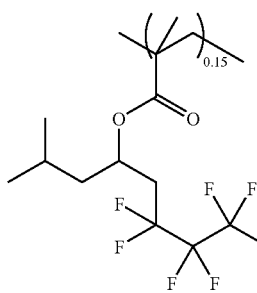

Polymer 4
  Molecular weight (Mw)=8,000
  Distribution (Mw/Mn)=1.80 polymer 4

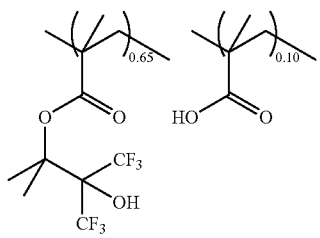
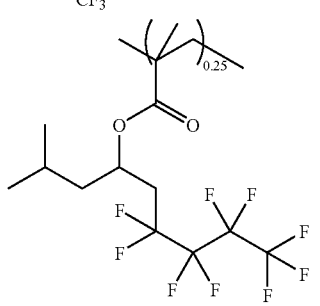

Polymer 5
  Molecular weight (Mw)=8,600
  Distribution (Mw/Mn)=1.75 polymer 5

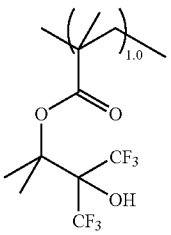

Polymer 6
  Molecular weight (Mw)=8,500
  Distribution (Mw/Mn)=1.64 polymer 6

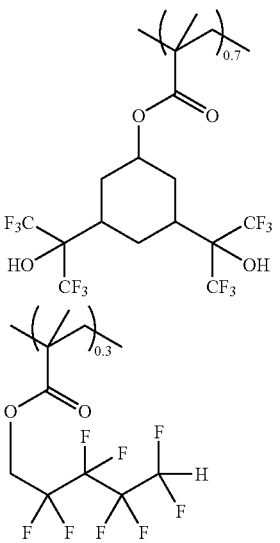

Polymer 7
  Molecular weight (Mw)=7,700
  Distribution (Mw/Mn)=1.74

Polymer 7

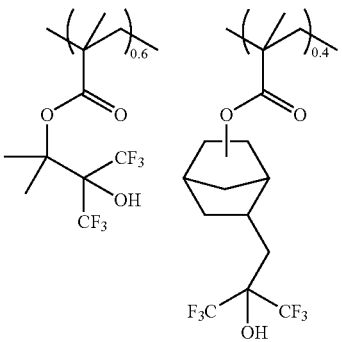

Polymer 8
  Molecular weight (Mw)=7,100
  Distribution (Mw/Mn)=1.82

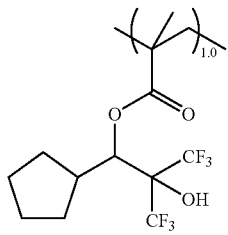

Polymer 9
  Molecular weight (Mw)=7,600
  Distribution (Mw/Mn)=1.79

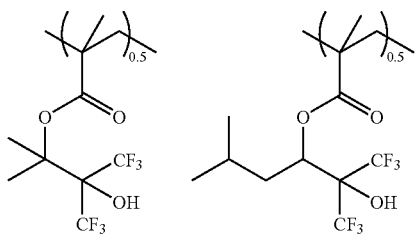

Polymer 10
  Molecular weight (Mw)=8,500
  Distribution (Mw/Mn)=1.72

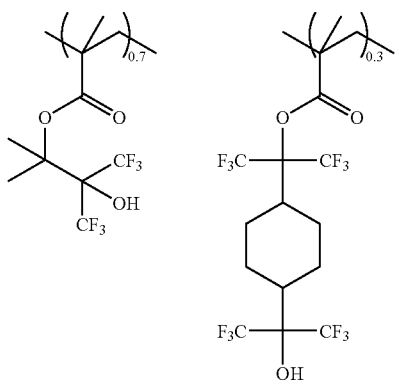

Polymer 11
  Molecular weight (Mw)=7,600
  Distribution (Mw/Mn)=1.79

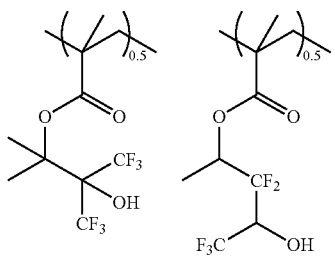

Polymer 12
  Molecular weight (Mw)=7,500
  Distribution (Mw/Mn)=1.82

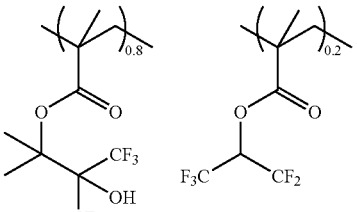

Polymer 13
  Molecular weight (Mw)=7,600
  Distribution (Mw/Mn)=1.87

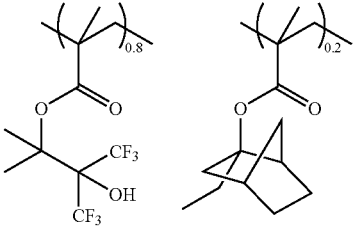

Polymer 14
  Molecular weight (Mw)=7,500
  Distribution (Mw/Mn)=1.82

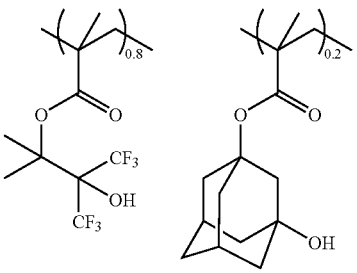

Polymer 15
  Molecular weight (Mw)=7,000
  Distribution (Mw/Mn)=1.85

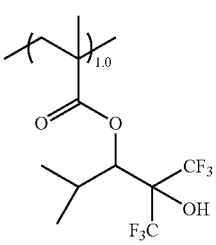

(Preparation of Resist Composition)

Resist compositions (Resist 1 and Resist 2) were prepared by mixing and dissolving base resins, photo acid generators, basic compounds, and organic solvents in compositions shown below, and then filtering thus-obtained solution through a Teflon(trademark) filter with a pore size of 0.2 μm, respectively.

Resist 1

Mixing Composition: Base Resin 1 (100 parts by mass), Photo Acid Generator (5 parts by mass), Basic Compound (1 part by mass), and Organic Solvent (1800 parts by mass).

Base Resin 1 (Refer to the Following Structural Formula)

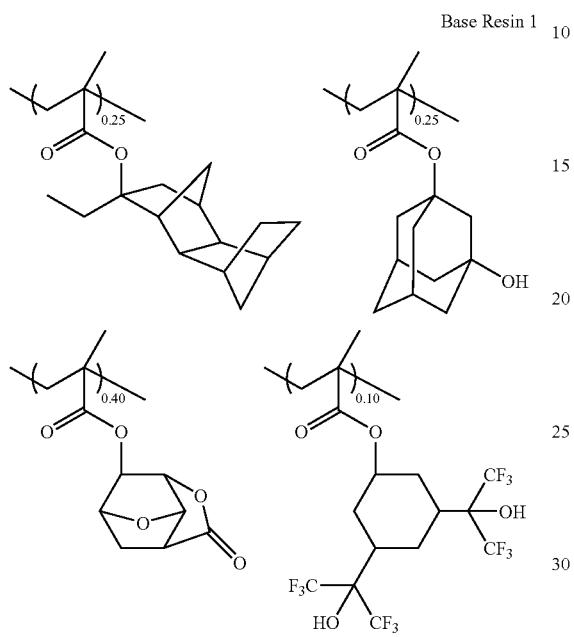

Molecular weight (Mw)=7,600

Distribution (Mw/Mn)=1.76

Photo Acid Generator (PAG): triphenyl sulfonium nonafluoro butane sulfonate

Basic Compound (quencher): 2-(2-methoxy ethoxy methoxy)ethyl morpholine

Organic Solvent: 1-methoxy isopropyl acetate

Resist 2

Mixing Composition: Base Resin 2 (100 parts by mass), Photo Acid Generator (7 parts by mass), Basic Compound (0.8 parts by mass), Organic Solvent 1 (1330 parts by mass) and Organic Solvent 2 (570 parts by mass).

Base Resin 2 (Refer to the Following Structural Formula)

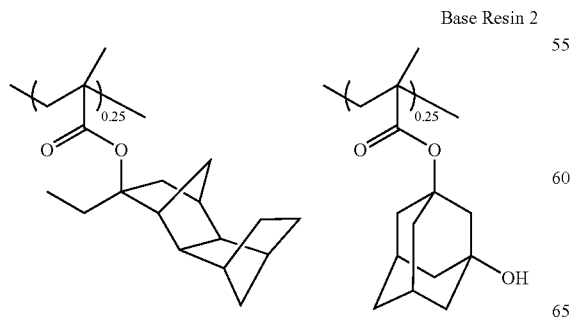

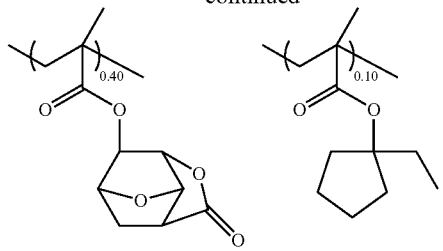

Molecular weight (Mw)=5,700

Distribution (Mw/Mn)=1.69

Photo Acid Generator (PAG): 4-t-butoxy phenyl diphenyl sulfonium 1,1,3,3,3-pentafluoro-2-benzoyloxy propane sulfonate Basic Compound (quencher): 2-cyclohexylcarboxy ethyl morpholine Organic Solvent 1: 1-methoxy isopropyl acetate Organic Solvent 2: cyclohexanone To these resist compositions to be base materials were added polymers prepared above (Polymers 1 to 15) with given ratios to prepare solutions of resist compositions (Examples 1 to 17 and Comparative examples 1 to 3). Combinations of the polymers and the base material compositions, and the blending ratios are shown in the following Table 1. Incidentally, the blending ratios of the polymers are shown with parts by mass mixed to 100 parts by mass of the base resin of the resist.

TABLE 1

| Resist Solutions | Base Material Resist Compositions | Polymers (Additional Amount) |
|---|---|---|
| Example 1 | Resist 1 | polymer 1 (6.3 parts by mass) |
| Example 2 | Resist 1 | polymer 2 (6.3 parts by mass) |
| Example 3 | Resist 1 | polymer 3 (6.3 parts by mass) |
| Example 4 | Resist 1 | polymer 4 (6.3 parts by mass) |
| Example 5 | Resist 2 | polymer 2 (6.3 parts by mass) |
| Example 6 | Resist 2 | polymer 2 (2.0 parts by mass) |
| Example 7 | Resist 2 | polymer 2 (1.0 part by mass) |
| Example 8 | Resist 2 | polymer 5 (6.3 parts by mass) |
| Example 9 | Resist 2 | polymer 7 (6.3 parts by mass) |
| Example 10 | Resist 2 | polymer 8 (6.3 parts by mass) |
| Example 11 | Resist 2 | polymer 9 (6.3 parts by mass) |
| Example 12 | Resist 2 | polymer 10 (6.3 parts by mass) |
| Example 13 | Resist 2 | polymer 11 (6.3 parts by mass) |
| Example 14 | Resist 2 | polymer 12 (6.3 parts by mass) |
| Example 15 | Resist 2 | polymer 13 (6.3 parts by mass) |
| Example 16 | Resist 2 | polymer 14 (6.3 parts by mass) |
| Example 17 | Resist 2 | polymer 15 (6.3 parts by mass) |
| Comparative Example 1 | Resist 1 | no addition |
| Comparative Example 2 | Resist 2 | no addition |

TABLE 1-continued

| Resist Solutions | Base Material Resist Compositions | Polymers (Additional Amount) |
|---|---|---|
| Comparative Example 3 | Resist 2 | polymer 6 (8.0 parts by mass) |

(Measurement of Receding Contact Angle and Sliding Angle)

Each of solutions of the resist compositions prepared above (Examples 1 to 17 and Comparative examples 1 to 3) was spin-coated onto a silicon wafer, was baked at 120 degrees C. for 60 seconds to give a 200 nm thick photoresist film.

The wafers on which photoresist films were formed according to the above method were held horizontally by using Tilting base contact angle meter DropMaster 500 (manufactured by Kyowa Interface Science Co., Ltd.), and 50 μL of ultrapure water was dropped and a water droplet was formed on each photoresist film. Then each wafer was tilted gradually and the angle (the sliding angle) where the water droplet starts to slide, and the receding contact angle were measured. The results are shown in the following Table 2.

TABLE 2

| Resist Solutions | Base Material Resist Compositions | Polymers (Additional Amount) | Sliding Angle (Degrees) | Receding Contact Angle (Degrees) |
|---|---|---|---|---|
| Example 1 | Resist 1 | polymer 1 (6.3 parts by mass) | 18 | 63 |
| Example 2 | Resist 1 | polymer 2 (6.3 parts by mass) | 18 | 66 |
| Example 3 | Resist 1 | polymer 3 (6.3 parts by mass) | 18 | 65 |
| Example 4 | Resist 1 | polymer 4 (6.3 parts by mass) | 18 | 64 |
| Example 5 | Resist 2 | polymer 2 (6.3 parts by mass) | 17 | 67 |
| Example 6 | Resist 2 | polymer 2 (2.0 parts by mass) | 18 | 61 |
| Example 7 | Resist 2 | polymer 2 (1.0 part by mass) | 18 | 57 |
| Example 8 | Resist 2 | polymer 5 (6.3 parts by mass) | 20 | 58 |
| Example 9 | Resist 2 | polymer 7 (6.3 parts by mass) | 19 | 62 |
| Example 10 | Resist 2 | polymer 8 (6.3 parts by mass) | 18 | 64 |
| Example 11 | Resist 2 | polymer 9 (6.3 parts by mass) | 19 | 65 |
| Example 12 | Resist 2 | polymer 10 (6.3 parts by mass) | 19 | 62 |
| Example 13 | Resist 2 | polymer 11 (6.3 parts by mass) | 19 | 62 |
| Example 14 | Resist 2 | polymer 12 (6.3 parts by mass) | 18 | 68 |
| Example 15 | Resist 2 | polymer 13 (6.3 parts by mass) | 18 | 60 |
| Example 16 | Resist 2 | polymer 14 (6.3 parts by mass) | 19 | 58 |
| Example 17 | Resist 2 | polymer 15 (6.3 parts by mass) | 19 | 65 |
| Comparative Example 1 | Resist 1 | no addition | 23 | 55 |
| Comparative Example 2 | Resist 2 | no addition | 18 | 51 |
| Comparative Example 3 | Resist 2 | polymer 6 (8.0 parts by mass) | 25 | 55 |

Having a small sliding angle means that water is apt to flow on a resist film. Having a large receding contact angle means that droplets are less prone to remain on a resist film even when a high-speed scanning is conducted for exposure.

The photoresist films (Examples 1 to 17) formed with resist solutions to which polymers of the present invention are added have larger receding contact angles and smaller sliding angles than the photoresist films (Comparative examples 1 to 3) that do not contain the polymers. From the results, it has been established that addition of the polymers of the present invention increases the receding contact angle of a photoresist film dramatically and does not deteriorate the sliding angle.

(Measurement of Leaching Amount of Resist Component)

Each of solutions of the resist compositions prepared above (Examples 2 and 5, and Comparative examples 1 and 2) was spin-coated onto a silicon wafer, baked at 120 degrees C. for 60 seconds to give a 200 nm thick photoresist film. The whole surface of the photoresist film was irradiated with ArF scanner S305B (manufactured by Nikon Corporation), in open frame, and at energy of 50 mJ/cm$^2$.

Then, on the irradiated photoresist film was placed a complete round Teflon(trademark) ring with an inner diameter of 10 cm. Into the ring was poured carefully 10 mL of pure water, and the resist film had contact with the pure water at room temperature for 60 seconds.

After that, the pure water was recovered, and conducted was a measurement of the concentration of anionic component of the photo acid generator (PAG) in the pure water with LC-MS analyzer manufactured by Agilent Technologies Inc.

Based on the measured anionic concentrations, calculated were the anionic leaching amounts per unit area of the photoresist films for 60 seconds. Results are shown in the following Table 3.

TABLE 3

| Resist Solutions | Base Material Resist Compositions | Polymers (Additional Amount) | Anionic Leaching Amount (mol/cm$^2$ · minute) |
|---|---|---|---|
| Example 2 | Resist 1 | polymer 2 (6.3 parts by mass) | $6.6 \times 10^{-12}$ |
| Example 5 | Resist 2 | polymer 2 (6.3 parts by mass) | $1.6 \times 10^{-11}$ |
| Comparative Example 1 | Resist 1 | no addition | $1.6 \times 10^{-11}$ |
| Comparative Example 2 | Resist 2 | no addition | $2.7 \times 10^{-11}$ |

As is evident from Table 3, effects of reducing leaching of photo acid generator components from photoresist films have been confirmed in the photoresist films (Examples 2 and 5) formed with resist solutions to which polymers of the present invention are added.

(Measurement of Distribution of Polymers)

In order to investigate distribution of the polymer according to the present invention in a resist film, a resin solution consisting of the following materials was prepared.

Base Material Resist Composition: 100 parts by mass of Base Resin 2
Polymer: 6.3 parts by mass of Polymer 2
Organic Solvent: 1800 parts by mass of 1-methoxy isopropyl acetate The resin solution prepared above was spin-coated onto a silicon wafer, baked at 120 degrees C. for 60 seconds to give a 230 nm thick resist film.

Then this applied film was cut at a bevel for 200 μm with SAICAS (Surface And Interfacial Cutting Analysis System manufactured by DAIPLA WINTES Co., Ltd.). Inside of the resist film exposed by the bevel cutting was scanned linearly with TOF-SIMS (time-of-flight mass spectrometer manufactured by ULVACPHI) with an ion beam radius of 10 μm and at an measuring interval of 20 μm; an anionic mass spectrum was measured at every measurement point; from every spectrum, counts of various peaks were read; and thus profiles were formed. The results are shown in FIG. 1.

The horizontal axis of FIG. 1 denotes the measurement points. The point where the silicon substrate is exposed is around the measurement point of 0 μm, and the point of the uppermost layer of the applied film is the measurement point of 200 μm.

The fluorine ions profile shows that the profile has a strong intensity from the uppermost layer of the applied film to the depth of 40 μm, and thus reveals that fluorine exists in the surface layer selectively.

A fluorine-containing compound was only Polymer 2 in the components constituting the applied resin solution. Therefore, it has revealed that the polymer localizes in the surface after the film was formed by spin-coating as with fluoro surfactants.

Based on these findings, it is contemplated that the polymer according to the present invention imparts a good barrier property against water and the like to the resist film.

The present invention is not limited to the above-described embodiments. The above-described embodiments are mere examples, and those having the substantially same structure as that described in the appended claims and providing the similar action and advantages are included in the scope of the present invention.

For example, the case of using the resist composition according to the present invention in the liquid immersion lithography has been mainly explained. However, needless to say, the resist composition according to the present invention may also be used in the standard lithography other than the liquid immersion lithography.

The invention claimed is:

1. A resist composition at least comprising: a base resin; and
a polymer including repeating units represented by the following general formula (1) wherein the total mass of the polymer to be added to 100 parts by mass of the base resin of the resist composition is 0.5 to 10 parts by mass,

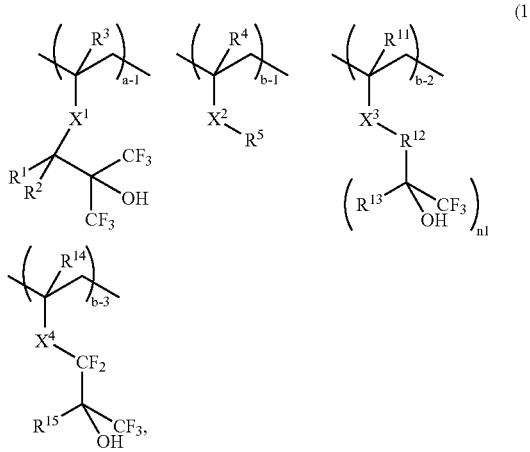

wherein $R^1$ and $R^2$ independently represent a hydrogen atom, or a linear, branched or cyclic alkyl group having 1 to 4 carbon atoms; $R^1$ and $R^2$ may bond together to form a ring, and in the case of $R^1$ and $R^2$ forming a ring, $R^1$ and $R^2$ together represent a divalent organic group having 2 to 4 carbon atoms, provided that $R^1$ and $R^2$ are not both hydrogen atoms;
$R^3$, $R^4$, $R^{11}$, and $R^{14}$ independently represent a hydrogen atom or a methyl group;
$R^5$ represents a linear, branched or cyclic alkyl group having 1 to 5 carbon atoms, in which some or all hydrogen atoms may be optionally substituted with fluorine atoms, and the alkyl group may include an iminosulfonyl group;
$X^1$, $X^2$, $X^3$, and $X^4$ independently represent any one of —C(=O)—, —C(=O)—O—, —C(=O)—O—$R^6$—, —O—, —C(=O)—$R^6$—C(=O)—, and —C(=O)—O—$R^6$—C(=O)—O—; $R^6$ represents a linear, branched or cyclic alkylene group having 1 to 10 carbon atoms;
$R^{12}$ represents an alkylene group or an alkanetriyl group that includes a cyclic structure having 4 to 12 carbon atoms, and the group may be optionally substituted with a fluorine atom; $R^{13}$ represents a hydrogen atom, or a linear or branched alkyl group having 1 to 10 carbon atoms in which the group may optionally be substituted with a fluorine atom; $R^{12}$ and $R^{13}$ may bond together to form a ring having 3 to 12 carbon atoms;
$R^{15}$ represents a hydrogen atom, or a linear or branched alkyl group having 1 to 10 carbon atoms in which the group may optionally be substituted with a fluorine atom;
n1 represents 1 or 2; and
a-1, b-1, b-2, and b-3 satisfy the range of 0<(a-1)<1, 0≦(b-1)<1, 0≦(b-2)<1, 0<(b-3)<1, 0<(a-1)+(b-1)+(b-2)+(b-3)≦1.

2. The resist composition according to claim 1, wherein the polymer does not have an alkyl group having 5 or more carbon atoms.

3. The resist composition according to claim 2, wherein the resist composition is a chemically amplified positive resist composition.

4. The resist composition according to claim 3, wherein the resist composition comprises a base resin including at least a repeating unit having an acid labile group, and a repeating unit having an adhesion group of a hydroxy group and/or a lactone ring.

5. The resist composition according to claim 4, which further contains any one or more of an organic solvent, a basic compound, a dissolution inhibitor and a surfactant.

6. The resist composition according to claim 1, wherein the resist composition is a chemically amplified positive resist composition.

7. The resist composition according to claim 6, wherein the resist composition comprises a base resin including at least a repeating unit having an acid labile group, and a repeating unit having an adhesion group of a hydroxy group and/or a lactone ring.

8. The resist composition according to claim 1, which further contains any one or more of an organic solvent, a basic compound, a dissolution inhibitor and a surfactant.

9. A patterning process comprising: at least, a step of applying the resist composition according to claim 1 on a substrate; a step of conducting heat-treatment and then exposing the substrate to a high energy beam; and a step of developing the substrate with a developer.

10. The patterning process according to claim 9, wherein the high energy beam has a wavelength in the range of 180 to 250 nm.

11. The patterning process according to claim 9, wherein, the step of exposing the substrate to a high energy beam is conducted by liquid immersion exposure in which the substrate is exposed through liquid.

12. The patterning process according to claim 11, wherein, in the liquid immersion exposure, an exposure wavelength in the range of 180 to 250 nm is used, a gap between the substrate to which the resist composition is applied and a projection lens is filled with liquid, and the substrate is exposed through the liquid.

13. The patterning process according to claim 11, wherein, as the liquid, water is used.

14. A resist composition comprising, at least, a polymer including repeating units represented by the following general formula (2)',

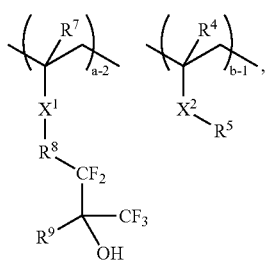

wherein $R^4$ and $R^7$ independently represent a hydrogen atom or a methyl group;
$R^8$ represents a linear, branched or cyclic alkylene group having 1 to 6 carbon atoms, in which one or more hydrogen atoms may optionally be substituted with a fluorine atom;
$R^5$ represents a linear or branched alkyl group having 1 to 10 carbon atoms, in which some or all hydrogen atoms are substituted with fluorine atoms;
$R^9$ represents a linear or branched alkyl group having 1 to 10 carbon atoms in which one or more hydrogen atoms are substituted with a fluorine atom; $R^8$ and $R^9$ may bond together to form a ring, and in the case of $R^8$ and $R^9$ forming a ring, $R^8$ and $R^9$ together represent a tervalent organic group having 2 to 12 carbon atoms;
$X^1$ and $X^2$ independently represent any one of —C(=O)—, —C(=O)—O—, —O—, —C(=O)—$R^6$—C(=O)—, and —C(=O)—O—$R^6$—C(=O)—O—; $R^6$ represents a linear, branched or cyclic alkylene group having 1 to 10 carbon atoms; and
a-2 and b-1 satisfy the range of $0<(a-2)<1$, $0<(b-1)<1$, $0<(a-2)+(b-1)\leq 1$.

15. The resist composition according to claim 14, wherein the polymer does not have an alkyl group having 5 or more carbon atoms.

16. The resist composition according to claim 15, wherein the resist composition is a chemically amplified positive resist composition.

17. The resist composition according to claim 16, wherein the resist composition comprises a base resin including at least a repeating unit having an acid labile group, and a repeating unit having an adhesion group of a hydroxy group and/or a lactone ring.

18. The resist composition according to claim 17, which further contains any one or more of an organic solvent, a basic compound, a dissolution inhibitor and a surfactant.

19. The resist composition according to claim 14, wherein the resist composition is a chemically amplified positive resist composition.

20. The resist composition according to claim 19, wherein the resist composition comprises a base resin including at least a repeating unit having an acid labile group, and a repeating unit having an adhesion group of a hydroxy group and/or a lactone ring.

21. The resist composition according to claim 14, which further contains any one or more of an organic solvent, a basic compound, a dissolution inhibitor and a surfactant.

22. A patterning process comprising: at least, a step of applying the resist composition according to claim 14 on a substrate; a step of conducting heat-treatment and then exposing the substrate to a high energy beam; and a step of developing the substrate with a developer.

23. The patterning process according to claim 22, wherein the high energy beam has a wavelength in the range of 180 to 250 nm.

24. The patterning process according to claim 22, wherein, the step of exposing the substrate to a high energy beam is conducted by liquid immersion exposure in which the substrate is exposed through liquid.

25. The patterning process according to claim 24, wherein, in the liquid immersion exposure, an exposure wavelength in the range of 180 to 250 nm is used, a gap between the substrate to which the resist composition is applied and a projection lens is filled with liquid, and the substrate is exposed through the liquid.

26. The patterning process according to claim 24, wherein, as the liquid, water is used.

27. The resist composition according to claim 14, wherein the polymer further comprises at least one or more repeating units represented by the following general formula (b-2) and (b-3),

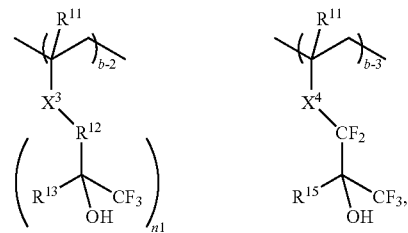

wherein $R^{11}$ and $R^{14}$ independently represent a hydrogen atom or a methyl group;
$X^3$ and $X^4$ independently represent any one of —C(=O)—, —C(=O)—O—, —C(=O)—O—$R^6$—, —O—, —C(=O)—$R^6$—C(=O)—, and —C(=O)—O—$R^6$—C(=O)—O—; $R^6$ represents a linear, branched or cyclic alkylene group having 1 to 10 carbon atoms;
$R^{12}$ represents an alkylene group or an alkanetriyl group that includes a cyclic structure having 4 to 12 carbon atoms, and the group may be optionally substituted with a fluorine atom; $R^{13}$ represents a hydrogen atom, or a linear or branched alkyl group having 1 to 10 carbon atoms in which the group may optionally be substituted with a fluorine atom; $R^{12}$ and $R^{13}$ may bond together to form a ring having 3 to 12 carbon atoms;
$R^{15}$ represents a hydrogen atom, or a linear or branched alkyl group having 1 to 10 carbon atoms in which the group may optionally be substituted with a fluorine atom;
n1 represents 1 or 2; and
b-2 and b-3 satisfy the range of $0$ $(b-2)<1$, $0\leq(b-3)<1$, $0<(a-2)+(b-1)+(b-2)+(b-3)\leq 1$.

* * * * *